(12) United States Patent
Asada

(10) Patent No.: US 10,810,929 B2
(45) Date of Patent: Oct. 20, 2020

(54) METHOD FOR DRIVING LIGHT EMITTING ELEMENT AND LIGHT EMITTING DEVICE

(71) Applicant: Sumitomo Chemical Company, Limited, Tokyo (JP)

(72) Inventor: Kohei Asada, Tsukuba (JP)

(73) Assignee: Sumitomo Chemical Company, Limited, Tokyo (JP)

( * ) Notice: Subject to any disclaimer, the term of this patent is extended or adjusted under 35 U.S.C. 154(b) by 140 days.

(21) Appl. No.: 15/770,806

(22) PCT Filed: Oct. 25, 2016

(86) PCT No.: PCT/JP2016/081540
§ 371 (c)(1),
(2) Date: Apr. 25, 2018

(87) PCT Pub. No.: WO2017/077904
PCT Pub. Date: May 11, 2017

(65) Prior Publication Data
US 2018/0308419 A1    Oct. 25, 2018

(30) Foreign Application Priority Data
Nov. 4, 2015   (JP) .................. 2015-216371

(51) Int. Cl.
*G09G 3/32*   (2016.01)
*H05B 33/08*   (2020.01)
(Continued)

(52) U.S. Cl.
CPC .............. *G09G 3/32* (2013.01); *C08G 73/02* (2013.01); *C08G 73/026* (2013.01);
(Continued)

(58) Field of Classification Search
CPC .. C08G 73/02; C08G 73/026; C08G 73/0273; G09G 2310/0264; G09G 2310/08;
(Continued)

(56) References Cited

U.S. PATENT DOCUMENTS

2002/0128514 A1* 9/2002 Uemura ................. C09K 11/06
564/426
2004/0041751 A1* 3/2004 Takahashi
(Continued)

FOREIGN PATENT DOCUMENTS

JP    H9293588 A    11/1997
JP    200036383 A    2/2000
(Continued)

OTHER PUBLICATIONS

Office Action dated Jul. 11, 2017 in JP Application No. 2017-516975.
(Continued)

*Primary Examiner* — Amy Onyekaba
(74) *Attorney, Agent, or Firm* — Panitch Schwarze Belisario & Nadel LLP

(57) ABSTRACT

A method for driving a light emitting device is provided. The light emitting device includes an anode, a cathode, a light emitting layer disposed between the anode and the cathode, and a hole transporting layer disposed between the anode and the light emitting layer. The hole transporting layer includes a cross-linked body of a crosslinkable material. According to the method, the light emitting device is driven by pulse voltage in which a first voltage not lower than the light emission start voltage of the light emitting device and a second voltage lower than the light emission start voltage of the light emitting device are alternately switched. A light emitting apparatus equipped with the light emitting device
(Continued)

and a driving apparatus which drives the light emitting device by pulse voltage is also provided.

15 Claims, 1 Drawing Sheet

(51) Int. Cl.
    *C08G 73/02*     (2006.01)
    *H01L 51/50*     (2006.01)
    *H01L 33/36*     (2010.01)
    *H01L 51/52*     (2006.01)

(52) U.S. Cl.
    CPC .......... *C08G 73/0273* (2013.01); *H01L 33/36* (2013.01); *H01L 51/50* (2013.01); *H01L 51/5056* (2013.01); *H01L 51/5206* (2013.01); *H01L 51/5221* (2013.01); *H05B 33/08* (2013.01); *G09G 2310/0264* (2013.01); *G09G 2310/08* (2013.01); *Y02B 20/346* (2013.01)

(58) Field of Classification Search
    CPC .......... G09G 3/32; H01L 33/36; H01L 51/50; H01L 51/5056; H01L 51/5206; H01L 51/5221; H05B 33/08; Y02B 20/346
    See application file for complete search history.

(56) References Cited

U.S. PATENT DOCUMENTS

| | | | |
|---|---|---|---|
| 2004/0169622 A1 | 9/2004 | Matsuura et al. | |
| 2006/0192497 A1 | 8/2006 | Hara et al. | |
| 2006/0194075 A1* | 8/2006 | Miyamoto | H01L 51/5048 |
| | | | 428/690 |
| 2007/0096082 A1 | 5/2007 | Gaynor et al. | |
| 2008/0107919 A1* | 5/2008 | Hwang | C07D 209/88 |
| | | | 428/691 |
| 2009/0128013 A1* | 5/2009 | Hwang | H01L 51/0072 |
| | | | 313/504 |
| 2009/0146555 A1* | 6/2009 | Hwang | C07D 487/04 |
| | | | 313/504 |
| 2009/0315453 A1 | 12/2009 | Kobayashi et al. | |
| 2010/0308274 A1* | 12/2010 | Wilson | |
| 2011/0108814 A1* | 4/2011 | Iida et al. | |

FOREIGN PATENT DOCUMENTS

| | | |
|---|---|---|
| JP | 2003272851 A | 9/2003 |
| JP | 2003323988 A | 11/2003 |
| JP | 2006-235492 A | 9/2006 |
| JP | 2007511636 A | 5/2007 |
| JP | 2009252944 A | 10/2009 |
| JP | 2011510509 A | 3/2011 |
| JP | 201219174 A | 1/2012 |
| JP | 201513362 A | 7/2015 |
| WO | 9733193 A2 | 9/1997 |
| WO | 03017730 A1 | 2/2003 |
| WO | 2005049689 A2 | 6/2005 |
| WO | 2008038747 A1 | 4/2008 |
| WO | 2009093025 A1 | 7/2009 |
| WO | 2009/123269 A1 | 10/2009 |

OTHER PUBLICATIONS

Office Action dated Dec. 5, 2017 in JP Application No. 2017-516975.
Int'l Search Report dated 1/24/207 in Int'l Application No. PCT/JP2016/081540.
Extended European Search Report dated Jul. 3, 2019 in EP Application No. 16861966.6.
Office Action dated Jul. 1, 2019 in CN Application No. 201680062514.7.
Office Action dated Nov. 26, 2019 in TW Application No. 105135467.

\* cited by examiner

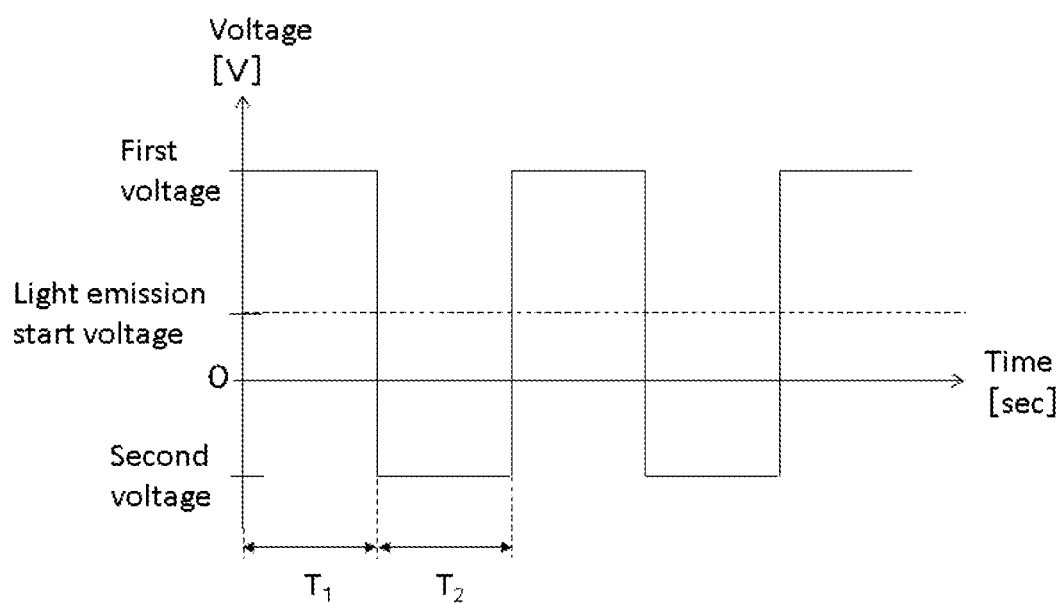

US 10,810,929 B2

METHOD FOR DRIVING LIGHT EMITTING ELEMENT AND LIGHT EMITTING DEVICE

CROSS-REFERENCE TO RELATED APPLICATION

This application is a Section 371 of International Application No. PCT/JP2016/081540, filed Oct. 25, 2016, which was published in the Japanese language on May 11, 2017, under International Publication No. WO 2017/077904 A1, which claims priority to Japanese Patent Application No. 2015-216371, filed on Nov. 4, 2015, the disclosures of which are incorporated herein by reference in their entireties.

TECHNICAL FIELD

The present invention relates to a driving method of a light emitting device and a light emitting apparatus.

BACKGROUND ART

An organic electroluminescent device (hereinafter, referred to also as "light emitting device") can be suitably used for applications of display and illumination, and research and development thereof are actively conducted. This light emitting device comprises organic layers such as a light emitting layer and a charge transporting layer.

It is known that the light emission efficiency of a light emitting device decreases with the lapse of driving time, and light emission luminance thereof lowers with the decrease in the light emission efficiency, it is problematic that the time for a decrease in light emission luminance is short (that is, the luminance life is short).

Patent Document 1 discloses that a driving method of a light emitting device comprising a hole transporting layer composed of a hole transporting material as a low molecular weight compound (specifically, a triphenyldiamine derivative) and a light emitting layer composed of a light emitting material as a low molecular weight compound (specifically, tris(8-quinolinolato)aluminum complex) by pulse voltage in which forward bias voltage (voltage in direction of light emission of light emitting device) and reverse bias voltage (voltage in direction opposite to light emission direction of light emitting device) are alternately switched can more improve the luminance life of the light emitting device as compared with a driving method by direct voltage.

Further, Patent Document 2 discloses that a driving method of a light emitting device comprising an anode buffer layer composed of an electrically conductive material as a polymer compound (specifically, PEDOT/PSS (polyethylenedioxythiophene doped with polythiophene-sulfonic acid)) and a light emitting layer composed of a light emitting material as a polymer compound (specifically, a polyfluorene derivative, a polyphenylene derivative or the like) by pulse voltage in which forward bias voltage and reverse bias voltage are alternately switched can more improve the luminance life of the light emitting device as compared with a driving method by direct voltage.

PRIOR ART DOCUMENT

Patent Document

[Patent Document 1] JP-A No. Hei-9-293588
[Patent Document 2] JP-A No. 2006-235492

SUMMARY OF THE INVENTION

Problem to be Solved by the Invention

However, luminance life obtained by the above-described driving method of a light emitting device was not always sufficient.

Then, the present invention has an object of providing a driving method of a light emitting device which is excellent in luminance life. Further, the present invention has an object of providing a light emitting apparatus equipped with a light emitting device and a driving apparatus for the driving method.

Means for Solving the Problem

The present invention provides the following [1] to [13].
[1] A driving method of a light emitting device, wherein a light emitting device comprising
an anode,
a cathode,
a light emitting layer disposed between the anode and the cathode and
a hole transporting layer disposed between the anode and the light emitting layer and comprising a cross-linked body of a crosslinkable material is
driven by pulse voltage in which a first voltage not lower than the light emission start voltage of the light emitting device and a second voltage lower than the light emission start voltage of the light emitting device are alternately switched.

[2] The driving method of a light emitting device according to [1], wherein the crosslinkable material is a polymer compound comprising a constitutional unit represented by the formula (X) and a constitutional unit having a crosslinkable group:

[chemical formula 1]

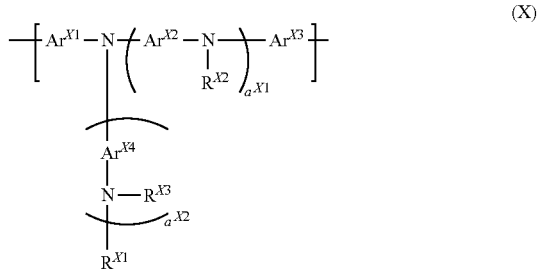

(X)

[wherein,
$a^{X1}$ and $a^{X2}$ each independently represent an integer of 0 or more.
$Ar^{X1}$ and $Ar^{X3}$ each independently represent an arylene group or a divalent heterocyclic group, and these groups each optionally have a substituent.
$Ar^{X2}$ and $Ar^{X4}$ each independently represent an arylene group, a divalent heterocyclic group or a divalent group in which at least one arylene group and at least one divalent heterocyclic group are bonded directly to each other, and these groups each optionally have a substituent. When a plurality of $Ar^{X2}$ and $Ar^{X4}$ are present, they may be the same or different at each occurrence.
$R^{X1}$, $R^{X2}$ and $R^{X3}$ each independently represent a hydrogen atom, an alkyl group, a cycloalkyl group, an aryl group or a monovalent heterocyclic group, and these groups each optionally have a substituent. When a plurality of $R^{X2}$ and $R^{X3}$ are present, they may be the same or different at each occurrence.].

[3] The driving method of a light emitting device according to [2], wherein the constitutional unit having a crosslinkable group is a constitutional unit having at least one crosslinkable group selected from Group A of crosslinkable group:

(Group A of crosslinkable group)

[chemical formula 2]

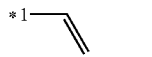
(XL-1)

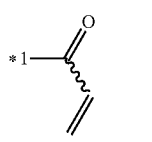
(XL-2)

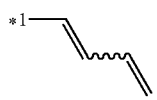
(XL-3)

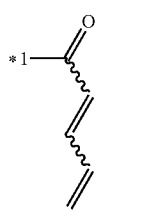
(XL-4)

(XL-5)

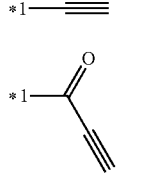
(XL-6)

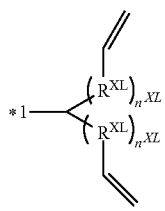
(XL-7)

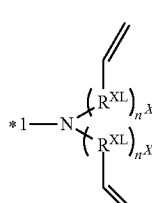
(XL-8)

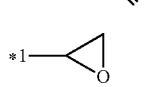
(XL-9)

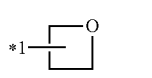
(XL-10)

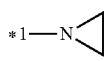
(XL-11)

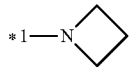
(XL-12)

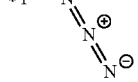
(XL-13)

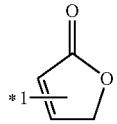
(XL-14)

(XL-15)

(XL-16)

(XL-17)

[wherein, $R^{XL}$ represents a methylene group, an oxygen atom or a sulfur atom, and $n^{XL}$ represents an integer of 0 to 5. When a plurality of $R^{XL}$ are present, they may be the same or different, and when a plurality of $n^{XL}$ are present, they may be the same or different. *1 represents a binding position. These crosslinkable groups each optionally have a substituent.].

[4] The driving method of a light emitting device according to [3], wherein the constitutional unit having a crosslinkable group is a constitutional unit represented by the formula (2) or a constitutional unit represented by (3):

[chemical formula 3]

(2)

[wherein, nA represents an integer of 0 to 5, and n represents 1 or 2.

$Ar^1$ represents an aromatic hydrocarbon group or a heterocyclic group, and these groups each optionally have a substituent.

$L^A$ represents an alkylene group, a cycloalkylene group, an arylene group, a divalent heterocyclic group, a group represented by —NR'—, an oxygen atom or a sulfur atom, and these groups each optionally have a substituent. R' represents a hydrogen atom, an alkyl group, a cycloalkyl group, an aryl group or a monovalent heterocyclic group, and these groups each optionally have a substituent. When a plurality of $L^A$ are present, they may be the same or different.

X represents a crosslinkable group selected from Group A of crosslinkable group. When a plurality of X are present, they may be the same or different.]

[chemical formula 4]

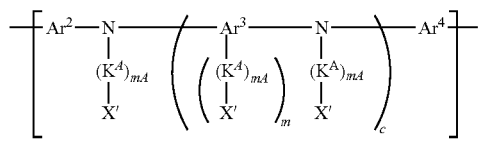

[wherein,
mA represents an integer of 0 to 5, m represents an integer of 1 to 4, and c represents an integer of 0 or 1. When a plurality of mA are present, they may be the same or different.

$Ar^3$ represents an aromatic hydrocarbon group, a heterocyclic group or a group in which at least one aromatic hydrocarbon ring and at least one heterocyclic ring are bonded directly to each other, and these groups each optionally have a substituent.

$Ar^2$ and $Ar^4$ each independently represent an arylene group or a divalent heterocyclic group, and these groups each optionally have a substituent.

Each of $Ar^2$, $Ar^3$ and $Ar^4$ may be bonded directly or via an oxygen atom or a sulfur atom to a group which is different from that group and which is attached to the nitrogen atom to which that group is attached, thereby forming a ring.

$K^A$ represents an alkylene group, a cycloalkylene group, an arylene group, a divalent heterocyclic group, a group represented by —NR'—, an oxygen atom or a sulfur atom, and these groups each optionally have a substituent. R' represents a hydrogen atom, an alkyl group, a cycloalkyl group, an aryl group or a monovalent heterocyclic group, and these groups each optionally have a substituent. When a plurality of $K^A$ are present, they may be the same or different.

X' represents a crosslinkable group selected from Group A of crosslinkable group, a hydrogen atom, an alkyl group, a cycloalkyl group, an aryl group or a monovalent heterocyclic group, and these groups each optionally have a substituent. At least one X' is a crosslinkable group selected from Group A of crosslinkable group.].

[5] The driving method of a light emitting device according to any one of [2] to [4], wherein the polymer compound comprising the constitutional unit represented by the formula (X) and the constitutional unit having a crosslinkable group further comprises a constitutional unit represented by the formula (Y):

[chemical formula 5]

$$\mathrm{-\!\!\!+\!\!Ar^{Y1}\!\!+\!\!\!-} \quad (Y)$$

[wherein, $Ar^{Y1}$ represents an arylene group, a divalent heterocyclic group or a divalent group in which at least one arylene group and at least one divalent heterocyclic group are bonded directly to each other, and these groups each optionally have a substituent.].

[6] The driving method of a light emitting device according to [1], wherein the crosslinkable material is a polymer compound comprising a constitutional unit represented by the formula (3):

[chemical formula 6]

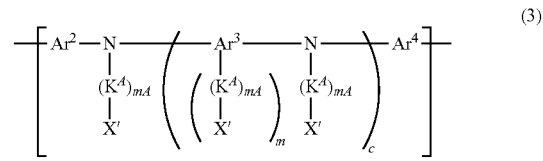

[wherein,
mA represents an integer of 0 to 5, m represents an integer of 1 to 4, and c represents an integer of 0 or 1. When a plurality of mA are present, they may be the same or different.

$Ar^3$ represents an aromatic hydrocarbon group, a heterocyclic group or a group in which at least one aromatic hydrocarbon ring and at least one heterocyclic ring are bonded directly to each other, and these groups each optionally have a substituent.

$Ar^2$ and $Ar^4$ each independently represent an arylene group or a divalent heterocyclic group, and these groups each optionally have a substituent.

Each of $Ar^2$, $Ar^3$ and $Ar^4$ may be bonded directly or via an oxygen atom or a sulfur atom to a group which is different from that group and which is attached to the nitrogen atom to which that group is attached, thereby forming a ring.

$K^A$ represents an alkylene group, a cycloalkylene group, an arylene group, a divalent heterocyclic group, a group represented by —NR'—, an oxygen atom or a sulfur atom, and these groups each optionally have a substituent. R' represents a hydrogen atom, an alkyl group, a cycloalkyl group, an aryl group or a monovalent heterocyclic group, and these groups each optionally have a substituent. When a plurality of $K^A$ are present, they may be the same or different.

X' represents a crosslinkable group selected from Group A of crosslinkable group described above, a hydrogen atom, an alkyl group, a cycloalkyl group, an aryl group or a monovalent heterocyclic group, and these groups each optionally have a substituent. At least one X' is a crosslinkable group selected from Group A of crosslinkable group described above.].

[7] The driving method of a light emitting device according to [6], wherein the polymer compound comprising the constitutional unit represented by the formula (3) further comprises a constitutional unit represented by the above-described formula (Y).

[8] The production method of a light emitting device according to [1], wherein the crosslinkable material is a low molecular weight compound represented by the formula (Z):

[chemical formula 7]

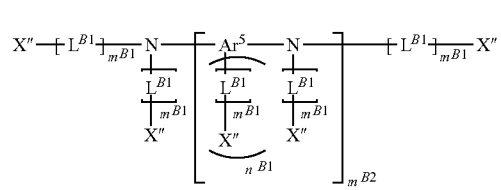

[wherein,
$m^{B1}$ and $m^{B2}$ each independently represent an integer of 0 or more. The plurality of $m^{B1}$ may be the same or different.

$n^{B1}$ represents an integer of 0 or more. When a plurality of $n^{B1}$ are present, they may be the same or different.

$Ar^5$ represents an aromatic hydrocarbon group, a heterocyclic group or a group in which at least one aromatic hydrocarbon ring and at least one heterocyclic ring are bonded directly to each other, and these groups each optionally have a substituent. When a plurality of $Ar^5$ are present, they may be the same or different.

$L^{B1}$ represents an alkylene group, a cycloalkylene group, an arylene group, a divalent heterocyclic group, a group represented by —NR'—, an oxygen atom or a sulfur atom, and these groups each optionally have a substituent. R' represents a hydrogen atom, an alkyl group, a cycloalkyl group, an aryl group or a monovalent heterocyclic group, and these groups each optionally have a substituent. When a plurality of $L^B$ are present, they may be the same or different.

X" represents a crosslinkable group selected from Group A of crosslinkable group described above, a hydrogen atom, an alkyl group, a cycloalkyl group, an aryl group or a monovalent heterocyclic group, and these groups each optionally have a substituent. The plurality of X" may be the same or different. At least one of the plurality of X" is a crosslinkable group selected from Group A of crosslinkable group described above.].

[9] The driving method of a light emitting device according to any one of [1] to [8], wherein the first voltage is forward bias voltage, the second voltage is reverse bias voltage, and polarity of the first voltage and polarity of the second voltage are different from each other.

[10] The driving method of a light emitting device according to [9], wherein the second voltage is −15 V or more and less than 0 V.

[11] The driving method of a light emitting device according to any one of [1] to [10], wherein the pulse voltage has a frequency of 0.1 Hz to 100 Hz.

[12] The driving method of a light emitting device according to any one of [1] to [11], wherein the pulse width: T1 of the first voltage and the pulse width: T2 of the second voltage satisfy the formula (1-1):

$$0.05 \leq T1/(T1+T2) \leq 0.95 \quad (1\text{-}1).$$

[13] A light emitting apparatus equipped with
a light emitting device comprising
an anode,
a cathode,
a light emitting layer disposed between the anode and the cathode and
a hole transporting layer disposed between the anode and the light emitting layer and comprising a cross-linked body of a crosslinkable material, and
a driving apparatus which drives the light emitting device by pulse voltage in which a first voltage not lower than the light emission start voltage of the light emitting device and a second voltage lower than the light emission start voltage of the light emitting device are alternately switched.

Effect of the Invention

The present invention can provide a driving method of a light emitting device which is excellent in luminance life. Further, the present invention can provide a light emitting apparatus equipped with a light emitting device and a driving apparatus for the driving method.

BRIEF EXPLANATION OF DRAWING

FIG. 1 shows the wave shape of pulse voltage in the driving method of a light emitting device of the present invention.

MODES FOR CARRYING OUT THE INVENTION

Suitable embodiments of the present invention will be illustrated in detail below.

Explanation of Common Term

Terms commonly used in the present specification have the following meanings unless otherwise stated.

Me represents a methyl group, Et represents an ethyl group, Bu represents a butyl group, i-Pr represents an isopropyl group, and t-Bu represents a tert-butyl group.

A hydrogen atom may be a heavy hydrogen atom or a light hydrogen atom.

A solid line representing a bond to a central metal in a formula representing a metal complex denotes a covalent bond or a coordinate bond.

"Polymer compound" denotes a polymer having molecular weight distribution and having a polystyrene-equivalent number average molecular weight of $1 \times 10^3$ to $1 \times 10^3$.

"Low molecular weight compound" denotes a compound having no molecular weight distribution and having a molecular weight of $1 \times 10^4$ or less.

"Constitutional unit" denotes a unit structure found once or more in a polymer compound.

"Alkyl group" may be any of linear or branched. The number of carbon atoms of the linear alkyl group is, not including the number of carbon atoms of a substituent, usually 1 to 50, preferably 3 to 30, more preferably 4 to 20. The number of carbon atoms of the branched alkyl groups is, not including the number of carbon atoms of a substituent, usually 3 to 50, preferably 3 to 30, more preferably 4 to 20.

The alkyl group optionally has a substituent, and examples thereof include a methyl group, an ethyl group, a propyl group, an isopropyl group, a butyl group, a 2-butyl group, an isobutyl group, a tert-butyl group, a pentyl group, an isoamyl group, a 2-ethylbutyl group, a hexyl group, a heptyl group, an octyl group, a 2-ethylhexyl group, a 3-propylheptyl group, a decyl group, a 3,7-dimethyloctyl group, a 2-ethyloctyl group, a 2-hexyldecyl group and a dodecyl group, and groups obtained by substituting a hydrogen atom in these groups with a cycloalkyl group, an alkoxy group, a cycloalkoxy group, an aryl group, a fluorine atom or the like, and the alkyl group having a substituent includes, for example, a trifluoromethyl group, a pentafluoroethyl group, a perfluorobutyl group, a perfluorohexyl group, a perfluorooctyl group, a 3-phenylpropyl group, a 3-(4-methylphenyl)propyl group, a 3-(3,5-di-hexylphenyl) propyl group and a 6-ethyloxyhexyl group.

The number of carbon atoms of "Cycloalkyl group" is, not including the number of carbon atoms of a substituent, usually 3 to 50, preferably 3 to 30, more preferably 4 to 20.

The cycloalkyl group optionally has a substituent, and examples thereof include a cyclohexyl group, a cyclohexylmethyl group and a cyclohexylethyl group.

"Aryl group" denotes an atomic group remaining after removing from an aromatic hydrocarbon one hydrogen atom linked directly to a carbon atom constituting the ring. The number of carbon atoms of the aryl group is, not including the number of carbon atoms of a substituent, usually 6 to 60, preferably 6 to 20, more preferably 6 to 10.

The aryl group optionally has a substituent, and examples thereof include a phenyl group, a 1-naphthyl group, a 2-naphthyl group, a 1-anthracenyl group, a 2-anthracenyl group, a 9-anthracenyl group, a 1-pyrenyl group, a 2-pyrenyl group, a 4-pyrenyl group, a 2-fluorenyl group, a 3-fluorenyl group, a 4-fluorenyl group, a 2-phenylphenyl group, a 3-phenylphenyl group, a 4-phenylphenyl group, and groups obtained by substituting a hydrogen atom in these groups with an alkyl group, a cycloalkyl group, an alkoxy group, a cycloalkoxy group, an aryl group, a fluorine atom or the like.

"Alkoxy group" may be any of linear or branched. The number of carbon atoms of the linear alkoxy group is, not including the number of carbon atoms of a substituent, usually 1 to 40, preferably 4 to 10. The number of carbon atoms of the branched alkoxy group is, not including the number of carbon atoms of a substituent, usually 3 to 40, preferably 4 to 10.

The alkoxy group optionally has a substituent, and examples thereof include a methoxy group, an ethoxy group, a propyloxy group, an isopropyloxy group, a butyloxy group, an isobutyloxy group, a tert-butyloxy group, a pentyloxy group, a hexyloxy group, a heptyloxy group, an octyloxy group, a 2-ethylhexyloxy group, a nonyloxy group, a decyloxy group, a 3,7-dimethyloctyloxy group and a lauryloxy group, and groups obtained by substituting a hydrogen atom in these groups with a cycloalkyl group, an alkoxy group, a cycloalkoxy group, an aryl group, a fluorine atom or the like.

The number of carbon atoms of "Cycloalkoxy group" is, not including the number of carbon atoms of a substituent, usually 3 to 40, preferably 4 to 10.

The cycloalkoxy group optionally has a substituent, and examples thereof include a cyclohexyloxy group.

The number of carbon atoms of "Aryloxy group" is, not including the number of carbon atoms of a substituent, usually 6 to 60, preferably 6 to 48.

The aryloxy group optionally has a substituent, and examples thereof include a phenoxy group, a 1-naphthyloxy group, a 2-naphthyloxy group, a 1-anthracenyloxy group, a 9-anthracenyloxy group, a 1-pyrenyloxy group, and groups obtained by substituting a hydrogen atom in these groups with an alkyl group, a cycloalkyl group, an alkoxy group, a cycloalkoxy group, a fluorine atom or the like.

"p-Valent heterocyclic group" (p represents an integer of 1 or more) denotes an atomic group remaining after removing from a heterocyclic compound p hydrogen atoms among hydrogen atoms directly linked to a carbon atom or a hetero atom constituting the ring. Of p-valent heterocyclic groups, "p-valent aromatic heterocyclic groups" as an atomic group remaining after removing from an aromatic heterocyclic compound p hydrogen atoms among hydrogen atoms directly linked to a carbon atom or a hetero atom constituting the ring are preferable.

"Aromatic heterocyclic compound" denotes a compound in which the heterocyclic ring itself shows aromaticity such as oxadiazole, thiadiazole, thiazole, oxazole, thiophene, pyrrole, phosphole, furan, pyridine, pyrazine, pyrimidine, triazine, pyridazine, quinoline, isoquinoline, carbazole and dibenzophosphole, and a compound in which an aromatic ring is condensed to the heterocyclic ring even if the heterocyclic ring itself shows no aromaticity such as phenoxazine, phenothiazine, dibenzoborole, dibenzosilole and benzopyran.

The number of carbon atoms of the monovalent heterocyclic group is, not including the number of carbon atoms of a substituent, usually 2 to 60, preferably 4 to 20.

The monovalent heterocyclic group optionally has a substituent, and examples thereof include a thienyl group, a pyrrolyl group, a furyl group, a pyridyl group, a piperidyl group, a quinolinyl group, an isoquinolinyl group, a pyrimidinyl group, a triazinyl group, and groups obtained by substituting a hydrogen atom in these groups with an alkyl group, a cycloalkyl group, an alkoxy group, a cycloalkoxy group or the like.

"Halogen atom" denotes a fluorine atom, a chlorine atom, a bromine atom or an iodine atom.

"Amino group" optionally has a substituent, and a substituted amino group is preferable. The substituent which an amino group has is preferably an alkyl group, a cycloalkyl group, an aryl group or a monovalent heterocyclic group.

The substituted amino group includes, for example, a dialkylamino group, a dicycloalkylamino group and a diarylamino group.

The amino group includes, for example, a dimethylamino group, a diethylamino group, a diphenylamino group, a bis(4-methylphenyl)amino group, a bis(4-tert-butylphenyl) amino group and a bis(3,5-di-tert-butylphenyl)amino group.

"Alkenyl group" may be any of linear or branched. The number of carbon atoms of the linear alkenyl group, not including the number of carbon atoms of the substituent, is usually 2 to 30, preferably 3 to 20. The number of carbon atoms of the branched alkenyl group, not including the number of carbon atoms of the substituent, is usually 3 to 30, preferably 4 to 20.

The number of carbon atoms of "Cycloalkenyl group", not including the number of carbon atoms of the substituent, is usually 3 to 30, preferably 4 to 20.

The alkenyl group and cycloalkenyl group each optionally have a substituent, and examples thereof include a vinyl group, a 1-propenyl group, a 2-propenyl group, a 2-butenyl group, a 3-butenyl group, a 3-pentenyl group, a 4-pentenyl group, a 1-hexenyl group, a 5-hexenyl group, a 7-octenyl group, and these groups having a substituent.

"Alkynyl group" may be any of linear or branched. The number of carbon atoms of the alkynyl group, not including the number of carbon atoms of the substituent, is usually 2 to 20, preferably 3 to 20. The number of carbon atoms of the branched alkynyl group, not including the number of carbon atoms of the substituent, is usually 4 to 30, preferably 4 to 20.

The number of carbon atoms of "Cycloalkynyl group", not including the number of carbon atoms of the substituent, is usually 4 to 30, preferably 4 to 20.

The alkynyl group and cycloalkynyl group each optionally have a substituent, and examples thereof include an ethynyl group, a 1-propynyl group, a 2-propynyl group, a 2-butynyl group, a 3-butynyl group, a 3-pentynyl group, a 4-pentynyl group, a 1-hexynyl group, a 5-hexynyl group, and these groups having a substituent.

"Arylene group" denotes an atomic group remaining after removing from an aromatic hydrocarbon two hydrogen atoms linked directly to carbon atoms constituting the ring. The number of carbon atoms of the arylene group is, not including the number of carbon atoms of a substituent, usually 6 to 60, preferably 6 to 30, more preferably 6 to 18.

The arylene group optionally has a substituent, and examples thereof include a phenylene group, a naphthalenediyl group, an anthracenediyl group, a phenanthrenediyl group, a dihydrophenanthrenediyl group, a naphthacenediyl group, a fluorenediyl group, a pyrenediyl group, a perylenediyl group, a chrysenediyl group, and these groups having a substituent, preferably, groups represented by the formulae (A-1) to (A-20). The arylene group includes groups obtained by linking a plurality of these groups.
[chemical formula 8]
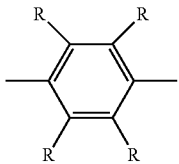
(A-1)
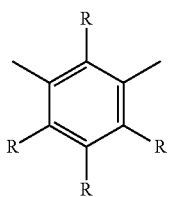
(A-2)
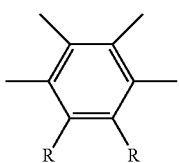
(A-3)
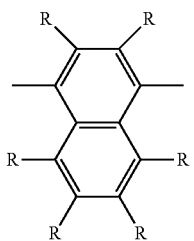
(A-4)
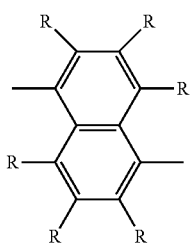
(A-5)
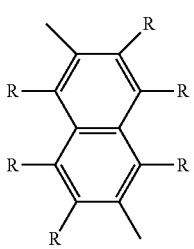
(A-6)
[chemical formula 9]
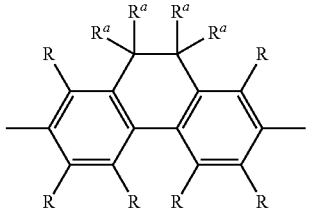
(A-7)
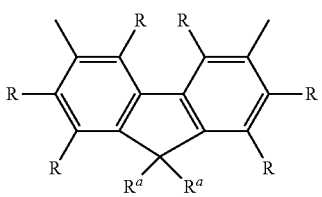
(A-8)
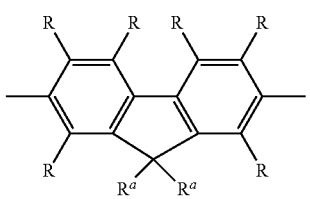
(A-9)
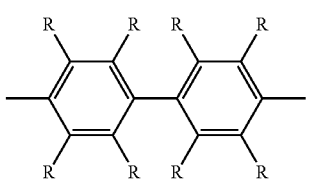
(A-10)
[chemical formula 10]
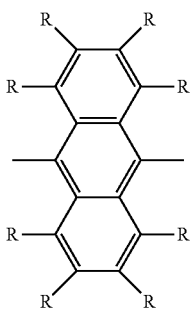
(A-11)
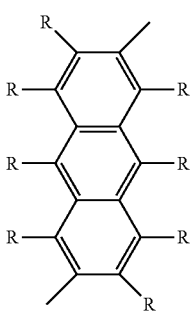
(A-12)

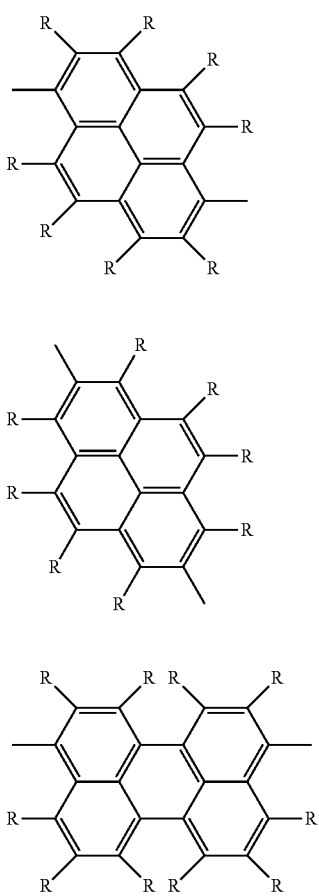

(A-13)

(A-14)

[chemical formula 11]

(A-15)

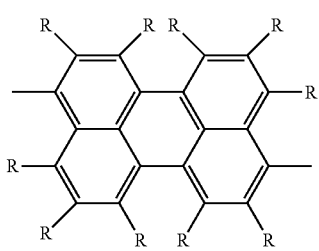

(A-16)

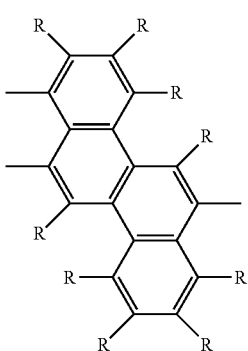

(A-17)

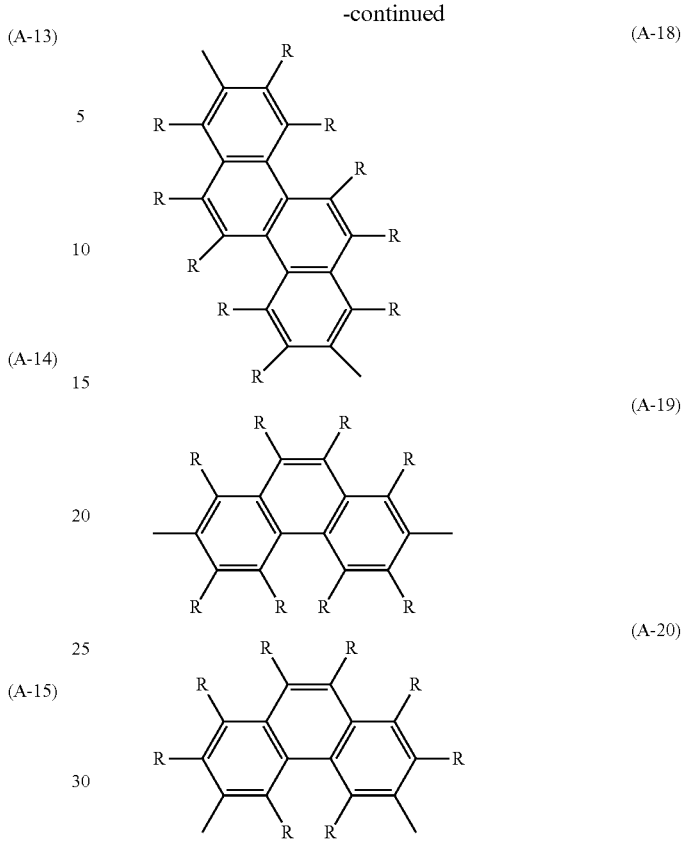

(A-18)

(A-19)

(A-20)

[wherein, R and $R^a$ each independently represent a hydrogen atom, an alkyl group, a cycloalkyl group, an aryl group or a monovalent heterocyclic group. The plurality of R and $R^a$ each may be the same or different, and groups $R^a$ may be combined together to form a ring together with the atoms to which they are attached.]

The number of carbon atoms of the divalent heterocyclic group is, not including the number of carbon atoms of a substituent, usually 2 to 60, preferably 3 to 20, more preferably 4 to 15.

The divalent heterocyclic group optionally has a substituent, and examples thereof include divalent groups obtained by removing from pyridine, diazabenzene, triazine, azanaphthalene, diazanaphthalene, carbazole, dibenzofuran, dibenzothiophene, dibenzosilole, phenoxazine, phenothiazine, acridine, dihydroacridine, furan, thiophene, azole, diazole and triazole two hydrogen atoms among hydrogen atoms linking directly to a carbon atom or a hetero atom constituting the ring, preferably groups represented by the formulae (AA-1) to (AA-34). The divalent heterocyclic group includes groups obtained by linking a plurality of these groups.

[chemical formula 12]

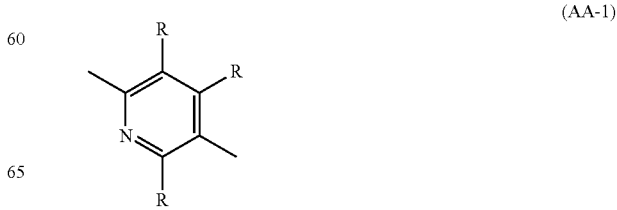

(AA-1)

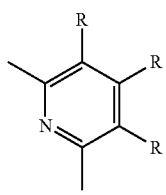(AA-2)
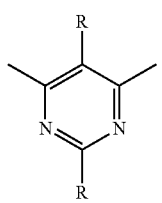(AA-3)
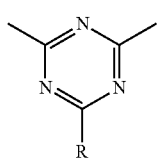(AA-4)
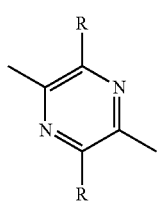(AA-5)
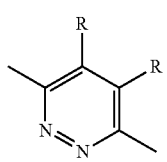(AA-6)
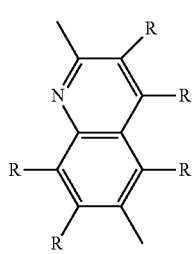(AA-7)
[chemical formula 13]
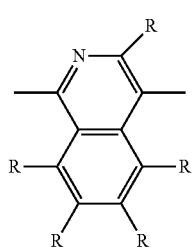(AA-8)
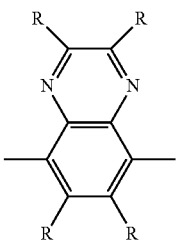(AA-9)
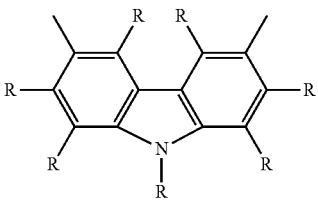(AA-10)
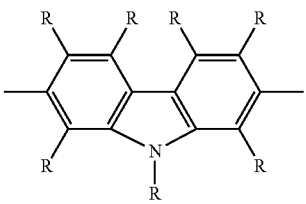(AA-11)
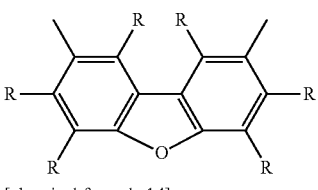(AA-12)
[chemical formula 14]
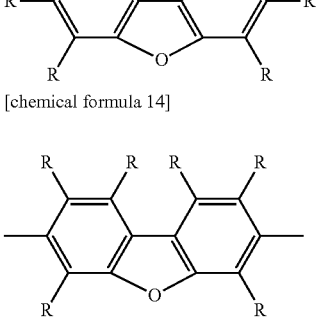(AA-13)
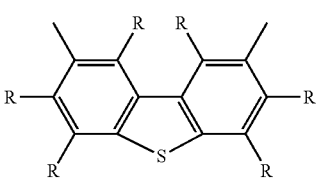(AA-14)
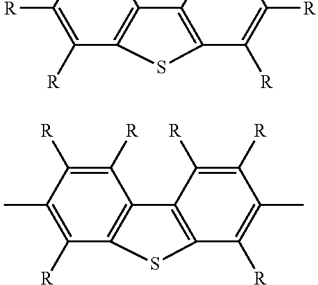(AA-15)
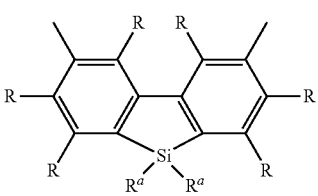(AA-16)

[chemical formula 15]
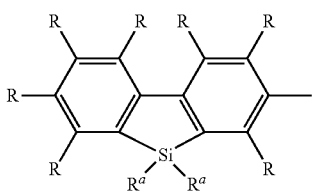
(AA-17)
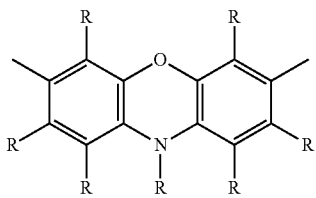
(AA-18)
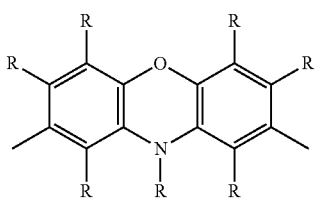
(AA-19)
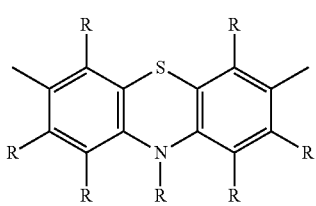
(AA-20)
[chemical formula 16]
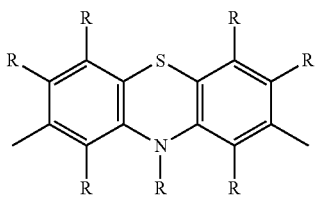
(AA-21)
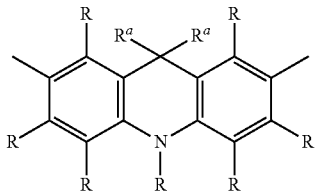
(AA-22)
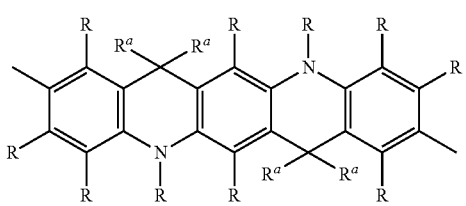
(AA-23)
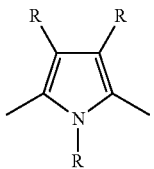
(AA-24)
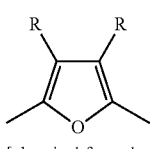
(AA-25)
[chemical formula 17]
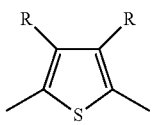
(AA-26)
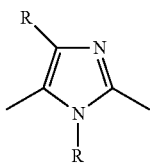
(AA-27)
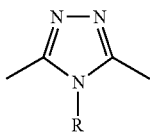
(AA-28)
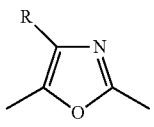
(AA-29)
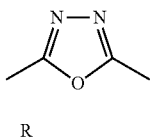
(AA-30)
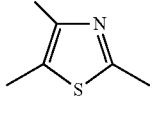
(AA-31)
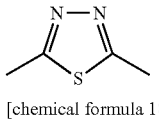
(AA-32)
[chemical formula 18]
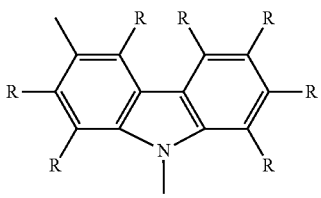
(AA-33)

-continued

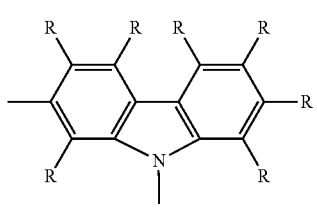
(AA-34)

[wherein, R and R$^a$ represent the same meaning as described above.]

"Crosslinkable group" is a group capable of forming a new bond by being subjected to heating, ultraviolet irradiation, near-ultraviolet irradiation, visible light irradiation, infrared light irradiation, a radical reaction and the like, and crosslinkable groups are preferably crosslinkable groups represented by the formulae (XL-1) to (XL-17) of Group A of crosslinkable group.

"Substituent" represents a halogen atom, a cyano group, an alkyl group, a cycloalkyl group, an aryl group, a monovalent heterocyclic group, an alkoxy group, a cycloalkoxy group, an aryloxy group, an amino group, a substituted amino group, an alkenyl group, a cycloalkenyl group, an alkynyl group or a cycloalkynyl group. The substituent may be a crosslinkable group.

The present invention is a driving method of a light emitting device, in which a light emitting device comprising an anode, a cathode, a light emitting layer disposed between the anode and the cathode and a hole transporting layer disposed between the anode and the light emitting layer and comprising a cross-linked body of a crosslinkable material is driven by pulse voltage in which a first voltage not lower than the light emission start voltage of the light emitting device and a second voltage lower than the light emission start voltage of the light emitting device are alternately switched.

<Driving Method>

The light emitting device has a light emission start voltage of usually 2 V to 4 V. That is, the first voltage not lower than the light emission start voltage of the light emitting device is forward bias voltage.

The second voltage lower than the light emission start voltage of the light emitting device may be forward bias voltage or reverse bias voltage provided that it is lower than the light emission start voltage of the light emitting device, and it is preferable that the second voltage is reverse bias voltage, because the light emitting device driven by the driving method of the present invention is more excellent in luminance life.

It is preferable that the first voltage is forward bias voltage, the second voltage is reverse bias voltage, and polarity of the first voltage and polarity of the second voltage are different, because the light emitting device driven by the driving method of the present invention is more excellent in luminance life.

The second voltage is preferably −15 V or more and less than 0 V, more preferably −10 V to −5 V, because the light emitting device driven by the driving method of the present invention is more excellent in luminance life.

The wave shape of the pulse voltage in which the first voltage and the second voltage are alternately switched is usually square wave.

It is preferable that the frequency of the pulse voltage is 0.1 Hz to 100 Hz, because the light emitting device driven by the driving method of the present invention is more excellent in luminance life.

The pulse width: T1 of the first voltage is usually 0.5 msec to 9500 msec, preferably 5 msec to 9000 msec.

The pulse width: T2 of the second voltage is usually 0.5 msec to 9500 msec, preferably 5 msec to 500 msec.

The pulse width: T1 of the first voltage and the pulse width: T2 of the second voltage preferably satisfy the formula (1-1), more preferably satisfy the formula (1-2), further preferably satisfy the formula (1-3), because the light emitting device driven by the driving method of the present invention is more excellent in luminance life.

$$0.05 \leq T1/(T1+T2) \leq 0.95 \quad (1\text{-}1)$$

$$0.50 \leq T1/(T1+T2) \leq 0.95 \quad (1\text{-}2)$$

$$0.75 \leq T1/(T1+T2) \leq 0.90 \quad (1\text{-}3)$$

<Light Emitting Layer>

The light emitting layer is a layer comprising a light emitting material. The light emitting material contained in the light emitting layer may be contained only singly or two or more kinds of the light emitting materials may be contained.

[Light Emitting Material]

The light emitting materials are classified into fluorescent materials and phosphorescent materials. The light emitting material may have a crosslinkable group.

[Fluorescent Material]

The fluorescent material as a low molecular weight compound includes, for example, naphthalene and derivatives thereof, anthracene and derivatives thereof and perylene and derivatives thereof.

The fluorescent material as a polymer compound includes polymer compounds comprising, for example, a phenylene group, a naphthalenediyl group, a fluorenediyl group, a phenanthrenediyl group, a dihydrophenanthrenediyl group, a group represented by the formula (X) described later, a carbazolediyl group, a phenoxazinediyl group, a phenothiazinediyl group, an anthracenediyl group, a pyrenediyl group or the like.

The fluorescent material as a polymer compound is preferably a polymer compound comprising at least one constitutional unit selected from the group consisting of a constitutional unit represented by the formula (X) and a constitutional unit represented by the formula (Y), more preferably a polymer compound comprising a constitutional unit represented by the formula (X) and a constitutional unit represented by the formula (Y).

<Constitutional Unit Represented by Formula (X)>

[chemical formula 19]

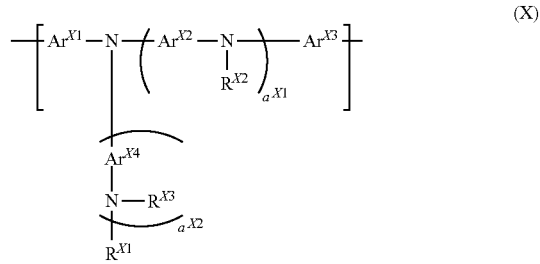
(X)

$a^{X1}$ is preferably an integer of 2 or less, more preferably 1, because the light emission efficiency of the light emitting device is excellent.

$a^{X2}$ is preferably an integer of 2 or less, more preferably 0, because the light emission efficiency of the light emitting device is excellent.

$R^{X1}$, $R^{X2}$ and $R^{X3}$ are preferably an alkyl group, a cycloalkyl group, an aryl group or a monovalent heterocyclic group, more preferably an aryl group, and these groups each optionally have a substituent.

The arylene group represented by $Ar^{X1}$ and $Ar^{X3}$ is more preferably a group represented by the formula (A-1) or the formula (A-9), further preferably a group represented by the formula (A-1), and these groups each optionally have a substituent.

The divalent heterocyclic group represented by $Ar^{X1}$ and $Ar^{X3}$ is more preferably a group represented by the formula (AA-1), the formula (AA-2) or the formula (AA-7) to (AA-26), and these groups each optionally have a substituent.

$Ar^{X1}$ and $Ar^{X3}$ are preferably an arylene group optionally having a substituent.

The arylene group represented by $Ar^{X2}$ and $Ar^{X4}$ is more preferably a group represented by the formula (A-1), the formula (A-6), the formula (A-7), the formula (A-9) to (A-11) or the formula (A-19), and these groups each optionally have a substituent.

The more preferable range of the divalent heterocyclic group represented by $Ar^{X2}$ and $Ar^{X4}$ is the same as the more preferable range of the divalent heterocyclic group represented by $Ar^{X1}$ and $Ar^{X3}$.

The more preferable range and the further preferable range of the arylene group and the divalent heterocyclic group in the divalent group in which at least one arylene group and at least one divalent heterocyclic group are bonded directly to each other represented by $Ar^{X2}$ and $Ar^{X4}$ are the same as the more preferable range and the further preferable range of the arylene group and the divalent heterocyclic group represented by $Ar^{X1}$ and $Ar^{X3}$, respectively.

The divalent group in which at least one arylene group and at least one divalent heterocyclic group are bonded directly to each other represented by $Ar^{X2}$ and $Ar^{X4}$ includes, for example, groups represented by the following formulae, and these groups each optionally have a substituent.

[chemical formula 20]

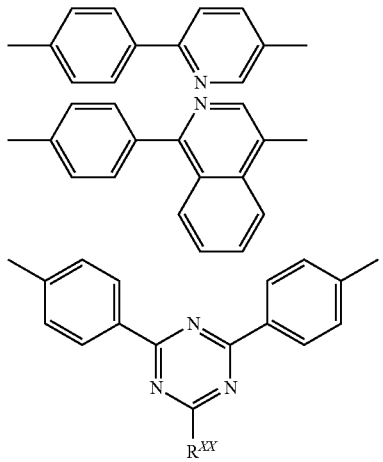

-continued

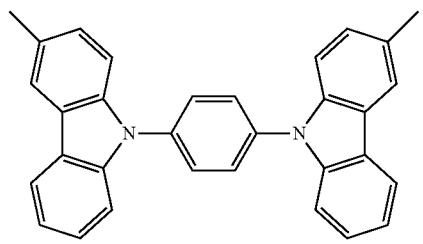

[wherein, $R^{XX}$ represents a hydrogen atom, an alkyl group, a cycloalkyl group, an aryl group or a monovalent heterocyclic group and these groups each optionally have a substituent.]

$R^{XX}$ is preferably an alkyl group, a cycloalkyl group or an aryl group, and these groups each optionally have a substituent.

$Ar^{X2}$ and $Ar^{X4}$ are preferably an arylene group optionally having a substituent.

The substituent which the group represented by $Ar^{X1}$ to $Ar^{X4}$ and $R^{X1}$ to $R^{X3}$ optionally has is preferably an alkyl group, a cycloalkyl group or an aryl group, and these groups each optionally further have a substituent.

The constitutional unit represented by the formula (X) is preferably a constitutional unit represented by the formula (X-1) to (X-7), more preferably a constitutional unit represented by the formula (X-1) to (X-6), further preferably a constitutional unit represented by the formula (X-3) to (X-6).

[chemical formula 21]

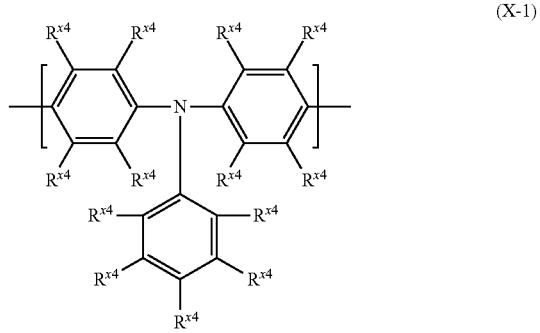
(X-1)

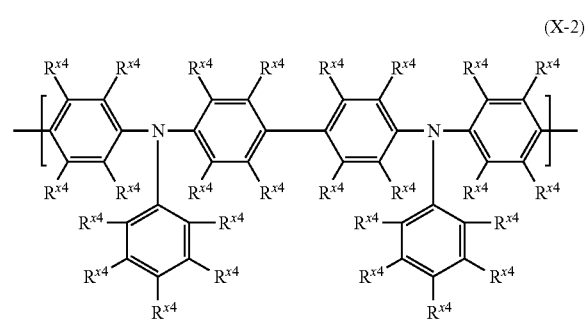
(X-2)

[chemical formula 22]

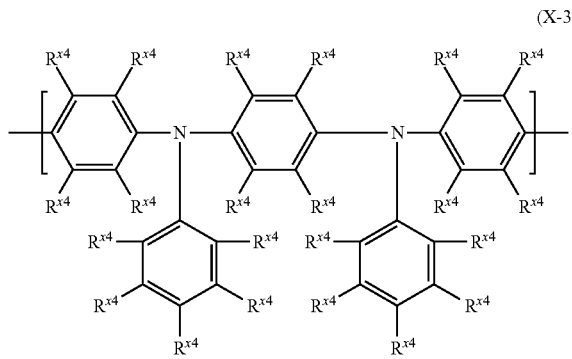
(X-3)

[chemical formula 23]

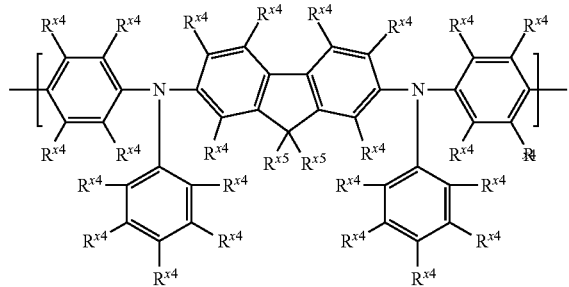
(X-4)

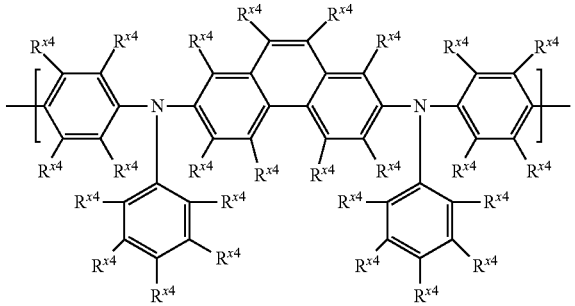
(X-5)

[chemical formula 24]

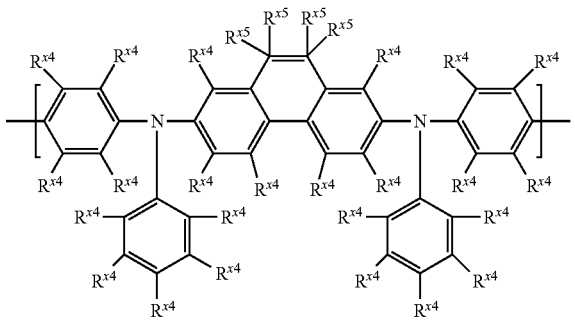
(X-6)

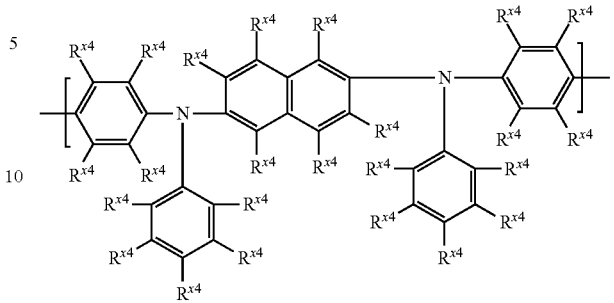
(X-7)

[wherein, $R^{X4}$ and $R^{X5}$ each independently represent a hydrogen atom, an alkyl group, a cycloalkyl group, an alkoxy group, a cycloalkoxy group, an aryl group, an aryloxy group, a halogen atom, a monovalent heterocyclic group or a cyano group, and these groups each optionally have a substituent. The plurality of $R^{X4}$ may be the same or different. The plurality of $R^{X5}$ may be the same or different, and adjacent groups $R^{X5}$ may be combined together to form a ring together with the carbon atoms to which they are attached.]

The amount of the constitutional unit represented by the formula (X) is preferably 0.1 to 50 mol %, more preferably 1 to 40 mol %, further preferably 5 to 30 mol % with respect to the total amount of constitutional units contained in the polymer compound, because the hole transportability of the light emitting device is excellent.

The constitutional unit represented by the formula (X) includes, for example, constitutional units represented by the formulae (X1-1) to (X1-11), preferably constitutional units represented by the formulae (X1-3) to (X1-10).

[chemical formula 25]

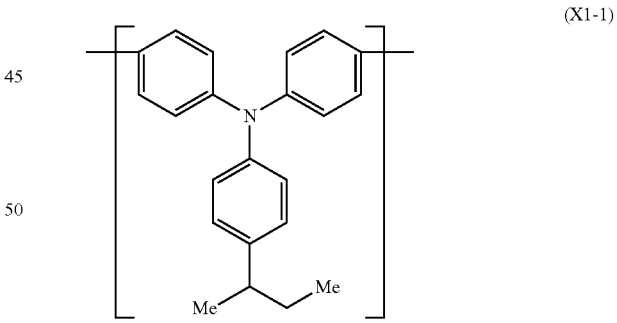
(X1-1)

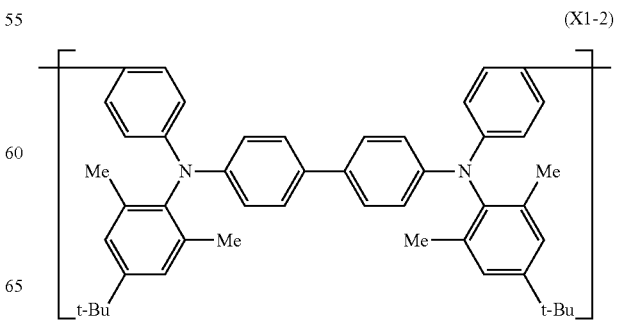
(X1-2)

-continued
(X1-3)
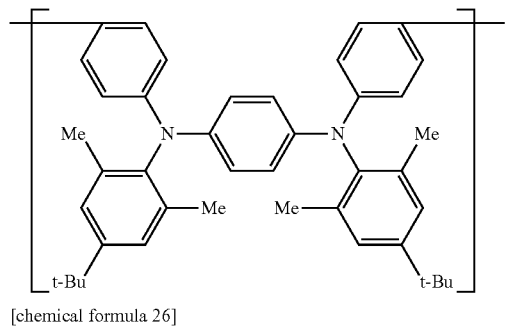
[chemical formula 26]
(X1-4)
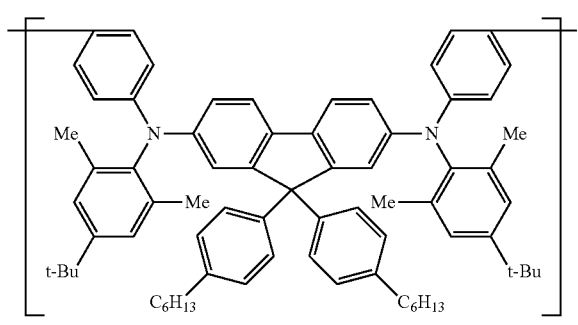
[chemical formula 27]
(X1-5)
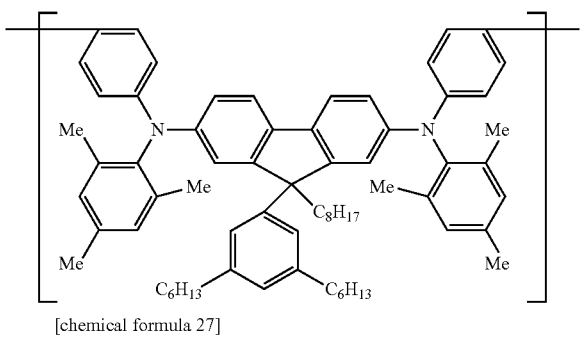
(X1-6)
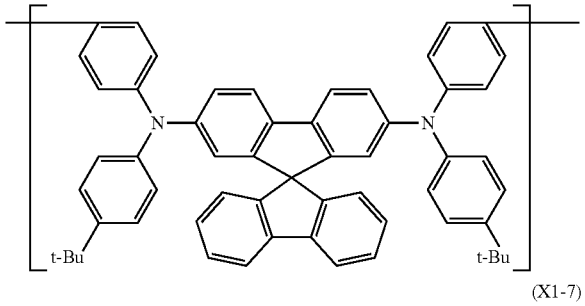
(X1-7)
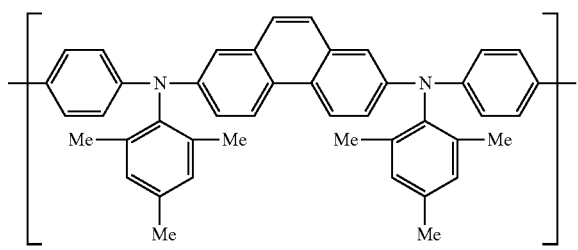
-continued
[chemical formula 28]
(X1-8)
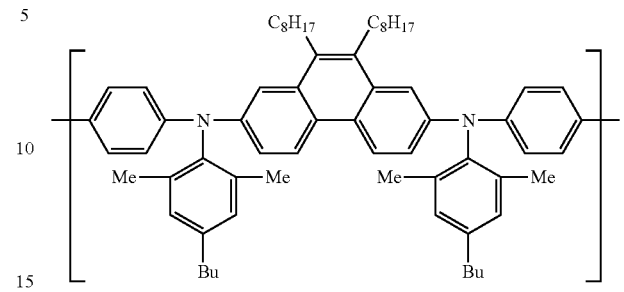
(X1-9)
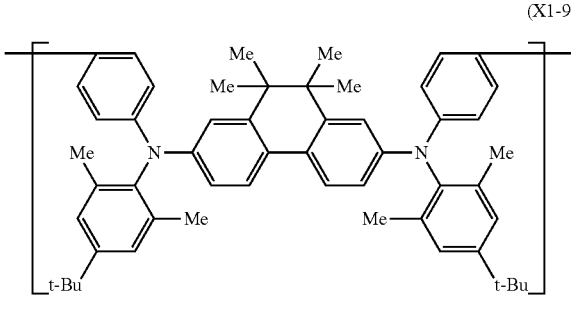
[chemical formula 29]
(X1-10)
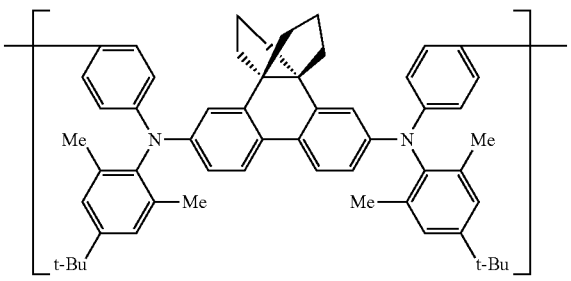
(X1-11)
The constitutional unit represented by the formula (X) may be contained only singly or two or more units thereof may be contained in the polymer compound.

<Constitutional Unit Represented by Formula (Y)>

[chemical formula 30]

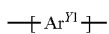
(Y)

The arylene group represented by $Ar^{Y1}$ is more preferably a group represented by the formula (A-1), the formula (A-2), the formula (A-6) to (A-10), the formula (A-19) or the formula (A-20), further preferably a group represented by the formula (A-1), the formula (A-2), the formula (A-7), the formula (A-9) or the formula (A-19), and these groups each optionally have a substituent.

The divalent heterocyclic group represented by $Ar^{Y1}$ is more preferably a group represented by the formula (AA-1) to (AA-4), the formula (AA-10) to (AA-15), the formula (AA-18) to (AA-21), the formula (AA-33) or the formula (AA-34), further preferably a group represented by the formula (AA-4), the formula (AA-10), the formula (AA-12), the formula (AA-14) or the formula (AA-33), and these groups each optionally have a substituent.

The more preferable range and the further preferable range of the arylene group and the divalent heterocyclic group in the divalent group in which at least one arylene group and at least one divalent heterocyclic group are bonded directly to each other represented by $Ar^{Y1}$ are the same as the more preferable range and the further preferable range of the arylene group and the divalent heterocyclic group represented by $Ar^{Y1}$ described above, respectively.

The divalent group in which at least one arylene group and at least one divalent heterocyclic group are bonded directly to each other represented by $Ar^{Y1}$ includes the same groups as the divalent group in which at least one arylene group and at least one divalent heterocyclic group are bonded directly to each other represented by $Ar^{X2}$ and $Ar^{X4}$ in the formula (X).

The substituent which the group represented by $Ar^{Y1}$ optionally has is preferably an alkyl group, a cycloalkyl group or an aryl group, and these groups each optionally further have a substituent.

The constitutional unit represented by the formula (Y) includes, for example, constitutional units represented by the formulae (Y-1) to (Y-10), and from the standpoint of the luminance life of the light emitting device preferable are constitutional units represented by the formulae (Y-1) to (Y-3), from the standpoint of the electron transportability of the light emitting device preferable are constitutional units represented by the formulae (Y-4) to (Y-7), and from the standpoint of the light emission efficiency and the hole transportability of the light emitting device preferable are constitutional units represented by the formulae (Y-8) to (Y-10).

[chemical formula 31]

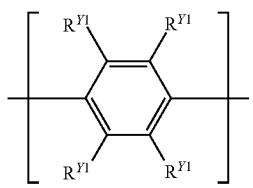
(Y-1)

[wherein, $R^{Y1}$ represents a hydrogen atom, an alkyl group, a cycloalkyl group, an alkoxy group, a cycloalkoxy group, an aryl group or a monovalent heterocyclic group, and these groups each optionally have a substituent. The plurality of $R^{Y1}$ may be the same or different, and adjacent $R^{Y1}$s may be combined together to form a ring together with the carbon atoms to which they are attached.]

$R^{Y1}$ is preferably a hydrogen atom, an alkyl group, a cycloalkyl group or an aryl group, and these groups each optionally have a substituent.

It is preferable that the constitional unit represented by the formula (Y-1) is a constitutional unit represented by the formula (Y-1').

[chemical formula 32]

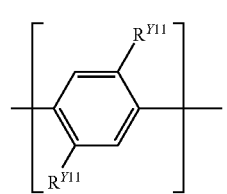
(Y-1')

[wherein, $R^{Y11}$ represents an alkyl group, a cycloalkyl group, an alkoxy group, a cycloalkoxy group, an aryl group or a monovalent heterocyclic group, and these groups each optionally have a substituent. The plurality of $R^{Y11}$ may be the same or different.]

$R^{Y11}$ is preferably an alkyl group, a cycloalkyl group or an aryl group, more preferably an alkyl group or a cycloalkyl group, and these groups each optionally have a substituent.

[chemical formula 33]

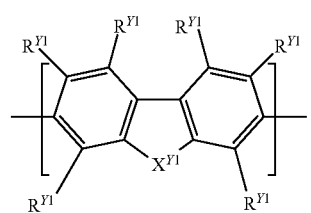
(Y-2)

[wherein,
$R^{Y1}$ represents the same meaning as described above.
$X^{Y1}$ represents a group represented by $-C(R^{Y2})_2-$, $-C(R^{X2})=C(R^{Y2})-$ or $-C(R^{Y2})_2-C(R^{Y2})_2-$. $R^{Y2}$ represents a hydrogen atom, an alkyl group, a cycloalkyl group, an alkoxy group, a cycloalkoxy group, an aryl group or a monovalent heterocyclic group and these groups each optionally have a substituent. The plurality of $R^{Y2}$ may be the same or different, and these $R^{Y2}$s may be combined together to form a ring together with the carbon atoms to which they are attached.]

$R^{Y2}$ is preferably an alkyl group, a cycloalkyl group, an aryl group or a monovalent heterocyclic group, more preferably an alkyl group a cycloalkyl group or an aryl group, and these groups each optionally have a substituent.

Regarding the combination of two $R^{Y2}$s in the group represented by $-C(R^{Y2})_2-$ in $X^{Y1}$, it is preferable that the both are an alkyl group or a cycloalkyl group, the both are an aryl group, the both are a monovalent heterocyclic group, or one is an alkyl group or a cycloalkyl group and the other is an aryl group or a monovalent heterocyclic group, it is more preferable that one is an alkyl group or cycloalkyl group and the other is an aryl group, and these groups each optionally have a substituent. The two groups $R^{Y2}$ may be combined together to form a ring together with the atoms to which they are attached, and when the groups $R^{Y2}$ form a ring, the group represented by —C($R^{Y2}$)$_2$— is preferably a group represented by the formula (Y-A1) to (Y-A5), more preferably a group represented by the formula (Y-A4), and these groups each optionally have a substituent.

[chemical formula 34]

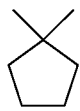
(Y-A1)

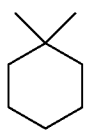
(Y-A2)

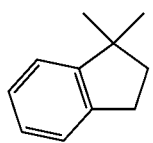
(Y-A3)

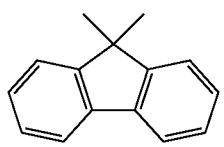
(Y-A4)

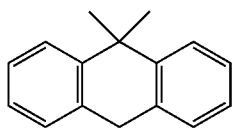
(Y-A5)

Regarding the combination of two $R^{Y2}$s in the group represented by —C($R^{Y2}$)=C($R^{Y2}$)— in $X^{Y1}$, it is preferable that the both are an alkyl group or cycloalkyl group, or one is an alkyl group or a cycloalkyl group and the other is an aryl group, and these groups each optionally have a substituent.

Four $R^{Y2}$s in the group represented by —C($R^{Y2}$)$_2$—C($R^{Y2}$)$_2$— in $X^{Y1}$ are preferably an alkyl group or a cycloalkyl group each optionally having a substituent. The plurality of $R^{Y2}$ may be combined together to form a ring together with the atoms to which they are attached, and when the groups $R^{Y2}$ form a ring, the group represented by —C($R^{Y2}$)$_2$—C($R^{Y2}$)$_2$— is preferably a group represented by the formula (Y-B1) to (Y-B5), more preferably a group represented by the formula (Y-B3), and these groups each optionally have a substituent.

[chemical formula 35]

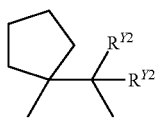
(Y-B1)

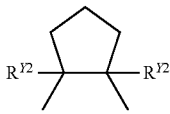
(Y-B2)

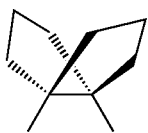
(Y-B3)

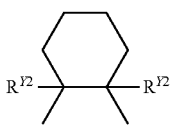
(Y-B4)

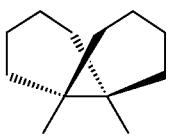
(Y-B5)

[wherein, $R^{Y2}$ represents the same meaning as described above.]

It is preferable that the constitutional unit represented by the formula (Y-2) is a constitutional unit represented by the formula (Y-2').

[chemical formula 36]

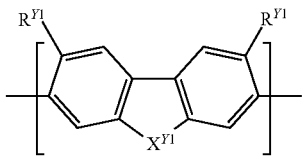
(Y-2')

[wherein, $R^{Y1}$ and $X^{Y1}$ represent the same meaning as described above.]

[chemical formula 37]

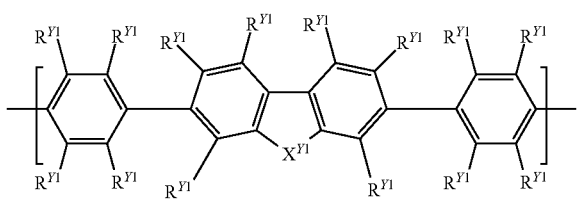
(Y-3)

[wherein, $R^{Y1}$ and $X^{Y1}$ represent the same meaning as described above.]

It is preferable that the constitutional unit represented by the formula (Y-3) is a constitutional unit represented by the formula (Y-3').

[chemical formula 38]

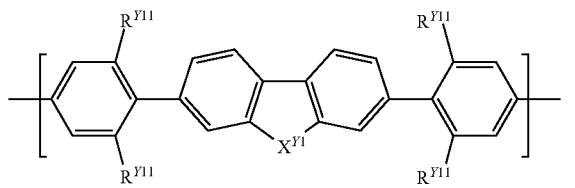

(Y-3')

[wherein, $R^{Y11}$ and $X^{Y1}$ represent the same meaning as described above.]

[chemical formula 39]

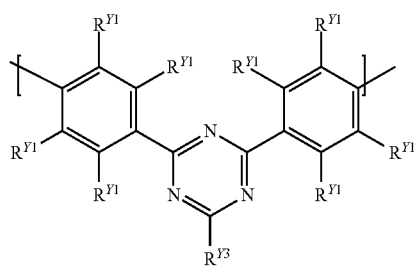

(Y-4)

[chemical formula 40]

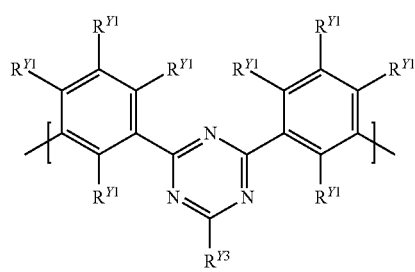

(Y-5)

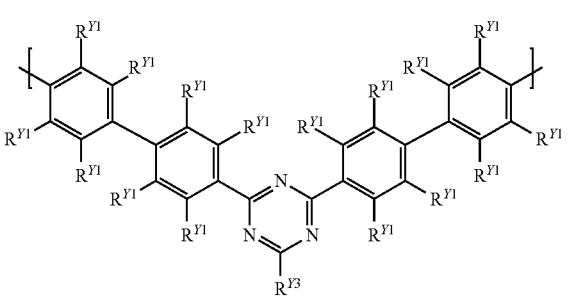

(Y-6)

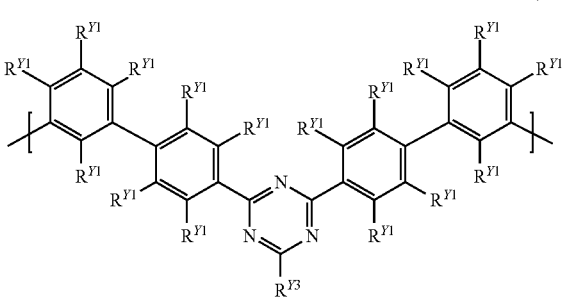

(Y-7)

[wherein, $R^{Y1}$ represents the same meaning as described above.

$R^{Y3}$ represents a hydrogen atom, an alkyl group, a cycloalkyl group, an alkoxy group, a cycloalkoxy group, an aryl group or a monovalent heterocyclic group and these groups each optionally have a substituent.]

$R^{Y3}$ is preferably an alkyl group, a cycloalkyl group, an alkoxy group, a cycloalkoxy group, an aryl group or a monovalent heterocyclic group, more preferably an aryl group, and these groups each optionally have a substituent.

It is preferable that the constitutional unit represented by the formula (Y-4) is a constitutional unit represented by the formula (Y-4'), and it is preferable that the constitutional unit represented by the formula (Y-6) is a constitutional unit represented by the formula (Y-6').

[chemical formula 41]

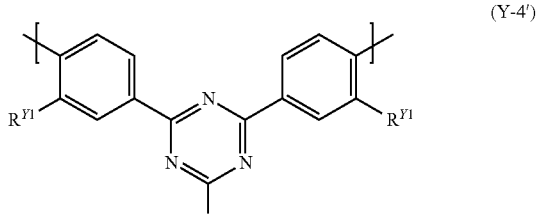

(Y-4')

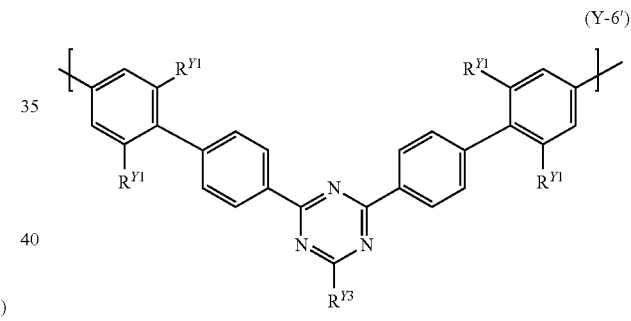

(Y-6')

[wherein, $R^{Y1}$ and $R^{Y3}$ represent the same meaning as described above.]

[chemical formula 42]

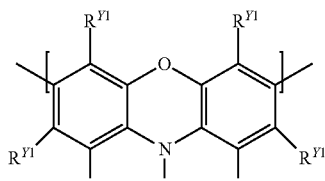

(Y-8)

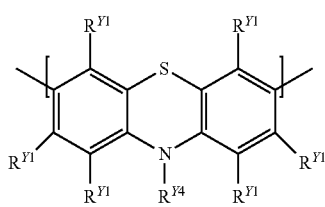

(Y-9)

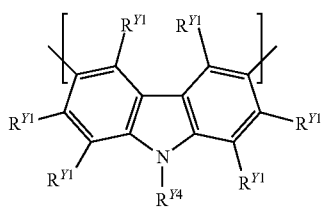
(Y-10)

[wherein, $R^{Y1}$ represents the same meaning as described above.

$R^{Y4}$ represents a hydrogen atom, an alkyl group, a cycloalkyl group, an alkoxy group, a cycloalkoxy group, an aryl group or a monovalent heterocyclic group, and these groups each optionally have a substituent.]

$R^{Y4}$ is preferably an alkyl group, a cycloalkyl group, an alkoxy group, a cycloalkoxy group, an aryl group or a monovalent heterocyclic group, more preferably an aryl group, and these groups each optionally have a substituent.

The constitutional unit represented by the formula (Y) includes, for example, a constitutional unit composed of an arylene group represented by the formula (Y-101) to (Y-121), a constitutional unit composed of a divalent heterocyclic group represented by the formula (Y-201) to (Y-206), and a constitutional unit composed of a divalent group in which at least one arylene group and at least one divalent heterocyclic group are bonded directly to each other represented by the formula (Y-301) to (Y-304).

[chemical formula 43]

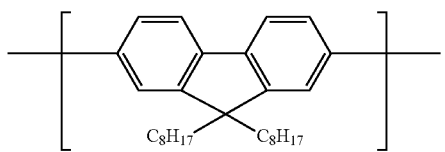
(Y-101)

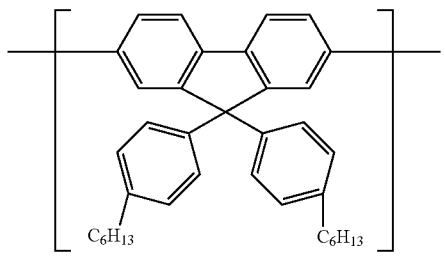
(Y-102)

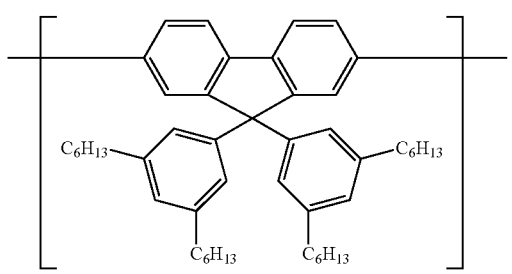
(Y-103)

[chemical formula 44]

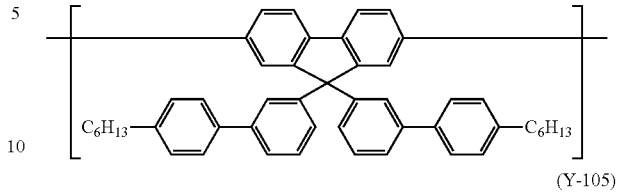
(Y-104)

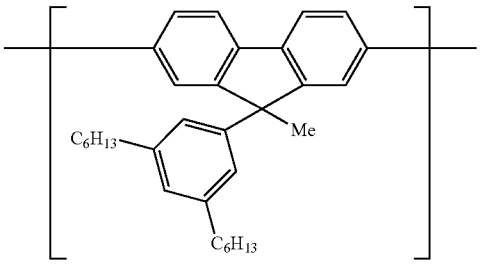
(Y-105)

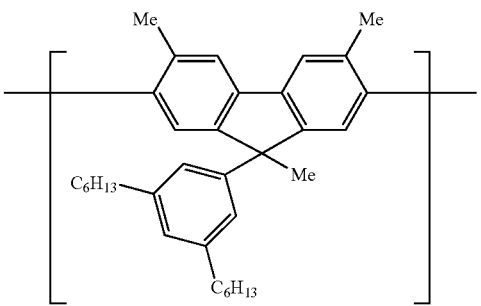
(Y-106)

[chemical formula 45]

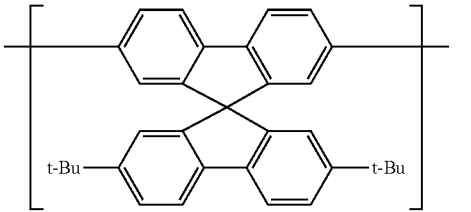
(Y-107)

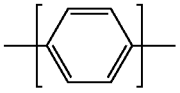
(Y-108)

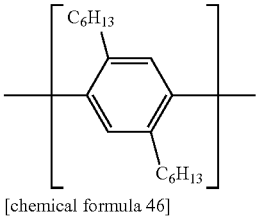
(Y-109)

[chemical formula 46]

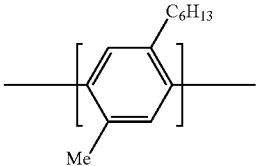
(Y-110)

(Y-111)
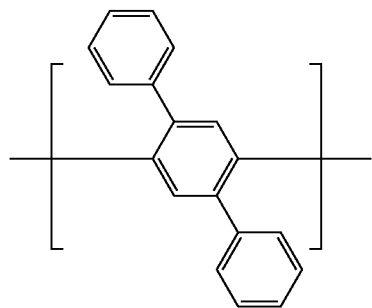
(Y-112)
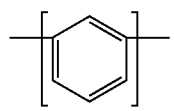
(Y-113)
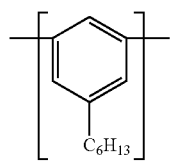
(Y-114)
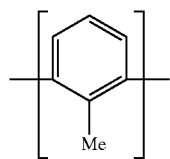
[chemical formula 47]
(Y-115)
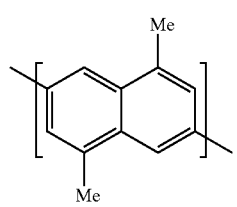
(Y-116)
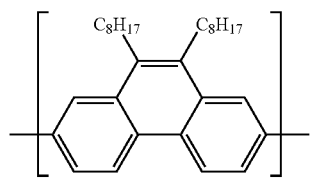
(Y-117)
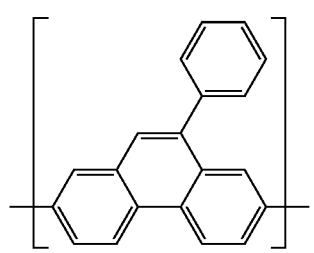
(Y-118)
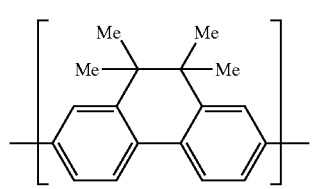
[chemical formula 48]
(Y-119)
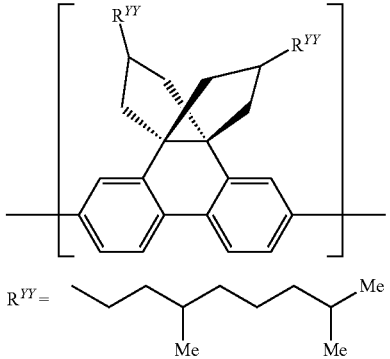
$R^{YY}=$ 
(Y-120)
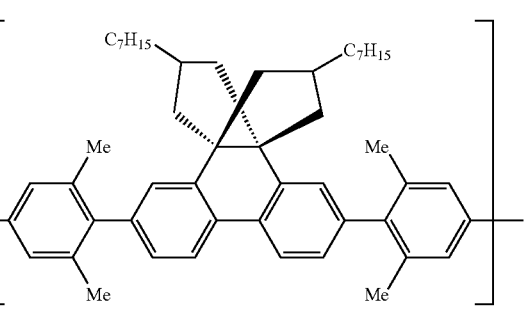
(Y-121)
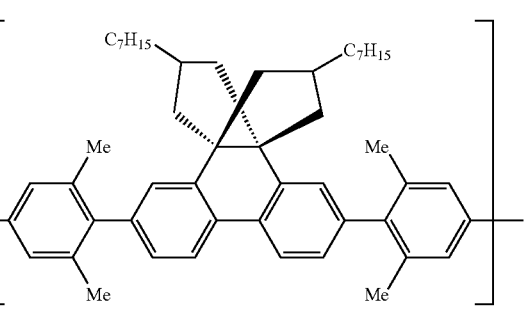
[chemical formula 49]
(Y-201)
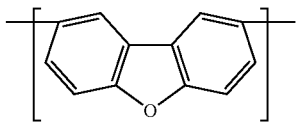
(Y-202)
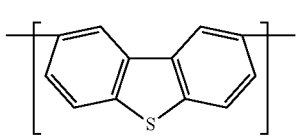

(Y-203)
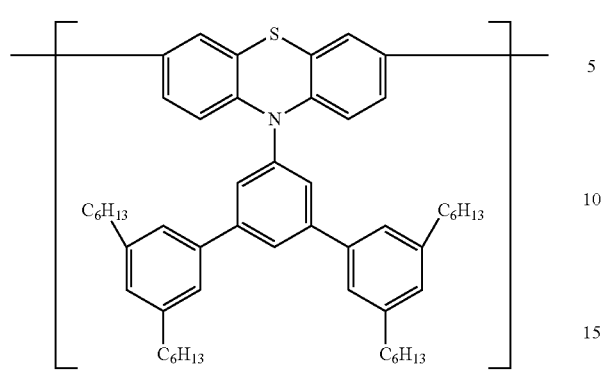
(Y-301)
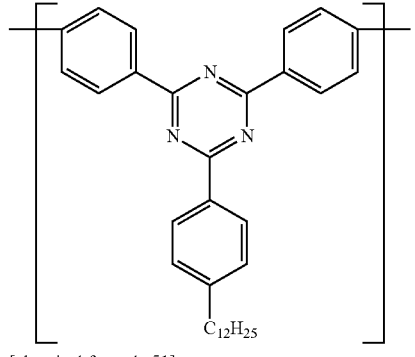
[chemical formula 51]
(Y-204)
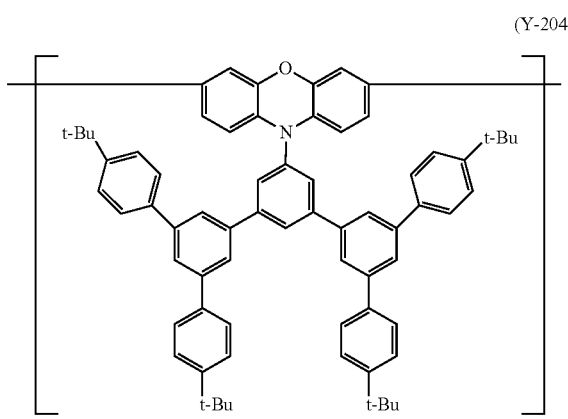
[chemical formula 50]
(Y-205)
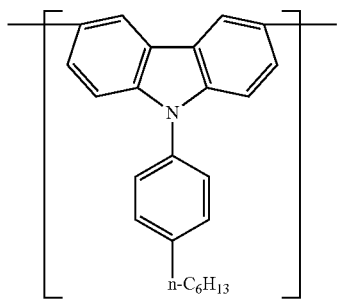
(Y-302)
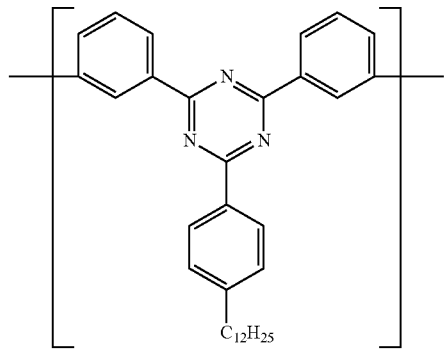
(Y-303)
(Y-206)
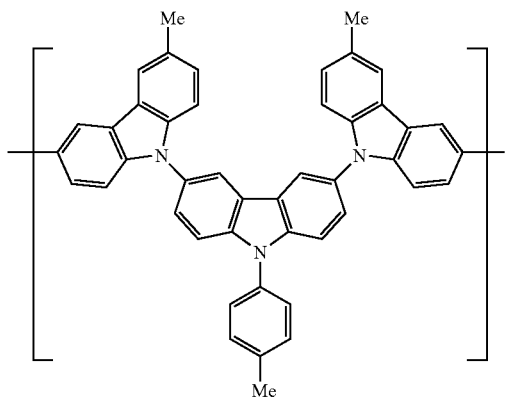
(Y-304)
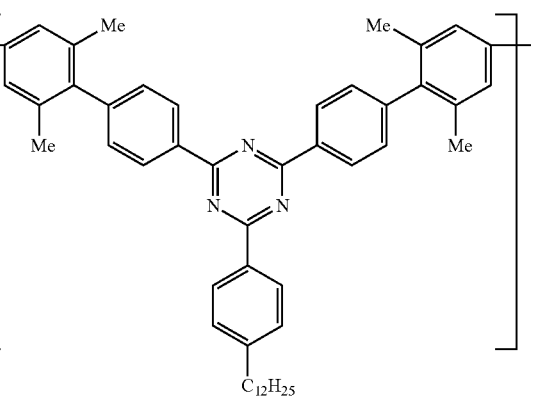
The amount of the constitutional unit represented by the formula (Y) in which $Ar^{Y1}$ is an arylene group is preferably 0.5 to 90 mol %, more preferably 30 to 80 mol % with respect to the total amount of constitutional units contained in the polymer compound, because the luminance life of the light emitting device is excellent.

The amount of the constitutional unit represented by the formula (Y) in which $Ar^{Y1}$ is a divalent heterocyclic group or a divalent group in which at least one arylene group and at least one divalent heterocyclic group are bonded directly to each other is preferably 0.5 to 50 mol %, more preferably 3 to 30 mol % with respect to the total amount of constitutional units contained in the polymer compound, because the light emission efficiency, the hole transportability or the electron transportability of the light emitting device is excellent.

The constitutional unit represented by the formula (Y) may be contained only singly or two or more units thereof may be contained in the polymer compound.

The polymer compound as the fluorescent material includes, for example, polymer compounds (P-101) to (P-107) shown in Table 1. In this table, the other constitutional unit denotes a constitutional unit other than a constitutional unit represented by the formula (Y) and a constitutional unit represented by the formula (X).

TABLE 1

| Polymer compound | Constitutional unit and molar ratio thereof | | | | |
|---|---|---|---|---|---|
| | formula (Y) | | | formula (X) | |
| | formula (Y-1) to (Y-3) p | formula (Y-4) to (Y-7) q | formula (Y-8) to (Y-10) r | formula (X-1) to (X-7) s | other t |
| (P-101) | 0.1 to 99.9 | 0.1 to 99.9 | 0 | 0 | 0 to 30 |
| (P-102) | 0.1 to 99.9 | 0 | 0.1 to 99.9 | 0 | 0 to 30 |
| (P-103) | 0.1 to 99.9 | 0 | 0 | 0.1 to 99.9 | 0 to 30 |
| (P-104) | 0.1 to 99.8 | 0.1 to 99.8 | 0.1 to 99.8 | 0 | 0 to 30 |
| (P-105) | 0.1 to 99.8 | 0.1 to 99.8 | 0 | 0.1 to 99.8 | 0 to 30 |
| (P-106) | 0.1 to 99.8 | 0 | 0.1 to 99.8 | 0.1 to 99.8 | 0 to 30 |
| (P-107) | 0.1 to 99.7 | 0.1 to 99.7 | 0.1 to 99.7 | 0.1 to 99.7 | 0 to 30 |

[in the Table, p, q, r, s and t represent the molar ratio of each constitutional unit. p+q+r+s+t=100 and 100≥p+q+r+s≥70.]

The examples and the preferable ranges of constitutional units represented by the formula (Y) and the formula (X) in polymer compounds (P-101) to (P-107) are the same as described above.

The polymer compound as the fluorescent material is preferably a polymer compound comprising at least one constitutional unit selected from the group consisting of a constitutional unit represented by the formula (Y-8), a constitutional unit represented by the formula (Y-9) and a constitutional unit represented by the formula (Y-10), more preferably a polymer compound comprising at least one constitutional unit selected from the group consisting of a constitutional unit represented by the formula (Y-8) and a constitutional unit represented by the formula (Y-9), further preferably a polymer compound comprising a constitutional unit represented by the formula (Y-8).

The polymer compound as the fluorescent material is preferably a polymer compound comprising at least one constitutional unit selected from the group consisting of a constitutional unit represented by the formula (Y-1), a constitutional unit represented by the formula (Y-2), a constitutional unit represented by the formula (Y-3) and a constitutional unit represented by the formula (X), more preferably a polymer compound comprising at least one constitutional unit selected from the group consisting of a constitutional unit represented by the formula (Y-1), a constitutional unit represented by the formula (Y-2) and a constitutional unit represented by the formula (X), further preferably a polymer compound comprising at least one constitutional unit selected from the group consisting of a constitutional unit represented by the formula (Y-2) and a constitutional unit represented by the formula (X), particularly preferably a polymer compound comprising a constitutional unit represented by the formula (Y-2) and a constitutional unit represented by the formula (X), as the constitutional unit other than a constitutional unit represented by the formula (Y-8), a constitutional unit represented by the formula (Y-9) and a constitutional unit represented by the formula (Y-10).

[Phosphorescent Material]

The phosphorescent material includes triplet light emitting complexes having iridium, platinum or europium as the central metal.

As the triplet light emitting complex, iridium complexes such as metal complexes represented by the formulae Ir-1 to Ir-5 are preferable.

[chemical formula 52]

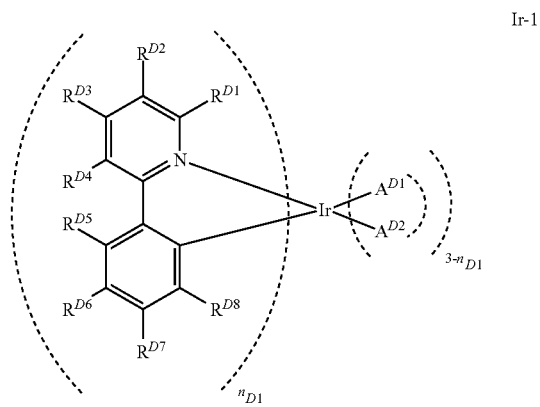

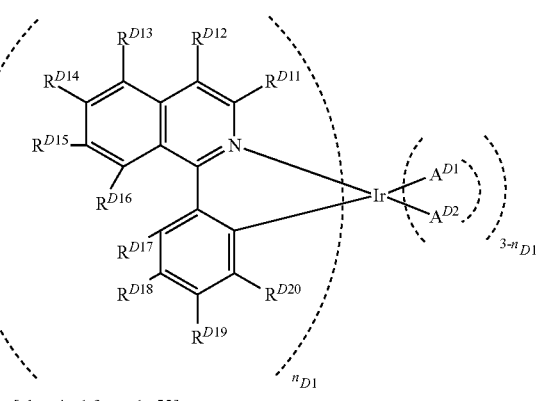

[chemical formula 53]

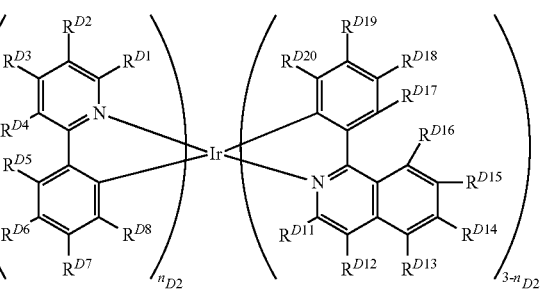

-continued

[chemical formula 54]

Ir-4

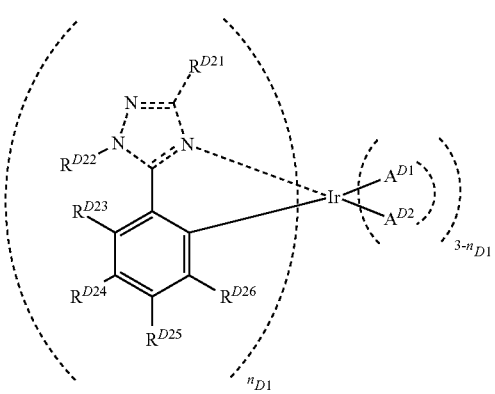

[chemical formula 55]

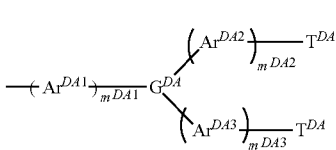
(D-A)

[wherein, $m^{DA1}$, $m^{DA2}$ and $m^{DA3}$ each independently represent an integer of 0 or more.

$G^{DA}$ represents a nitrogen atom, an aromatic hydrocarbon group or a heterocyclic group, and these groups each optionally have a substituent.

$Ar^{DA1}$, $Ar^{DA2}$ and $Ar^{DA3}$ each independently represent an arylene group or a divalent heterocyclic group, and these groups each optionally have a substituent. When a plurality of $Ar^{DA1}$, $Ar^{DA2}$ and $Ar^{DA3}$ are present, they may be the same or different at each occurrence.

$T^{DA}$ represents an aryl group or a monovalent heterocyclic group, and these groups each optionally have a substituent. The plurality of $T^{DA}$ may be the same or different.]

$m^{DA1}$, $m^{DA2}$ and $m^{DA3}$ are usually an integer of 10 or less, preferably an integer of 5 or less, more preferably 0 or 1. It is preferable that $m^{DA1}$ $m^{DA2}$ and $m^{DA3}$ are the same integer.

$G^{DA}$ is preferably a group represented by the formula (GDA-11) to (GDA-15), and these groups each optionally have a substituent.

Ir-5

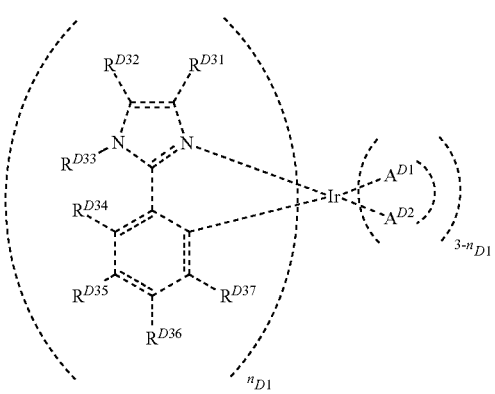

[wherein, $R^{D1}$ to $R^{D3}$, $R^{D11}$ to $R^{D20}$, $R^{D21}$ to $R^{D26}$ and $R^{D31}$ to $R^{D37}$ each independently represent a hydrogen atom, an alkyl group, a cycloalkyl group, an alkoxy group, a cycloalkoxy group, an aryl group, an aryloxy group, a monovalent heterocyclic group or a halogen atom, and these groups each optionally have a substituent. When a plurality of $R^{D1}$ to $R^{D8}$, $R^{D11}$ to $R^{D20}$, $R^{D1}$ to $R^{D26}$ and $R^{D31}$ to $R^{D37}$ are present, they may be the same or different at each occurrence.

$-A^{D1}-A^{D2}-$ represents an anionic bidentate ligand, and $A^{D1}$ and $A^{D2}$ each independently represent a carbon atom, an oxygen atom or a nitrogen atom linking to an iridium atom, and these atoms each may be an atom consisting a ring. When a plurality of $-A^{D1}-A^{D2}-$ are present, they may be the same or different.

$n_{D1}$ represents 1, 2 or 3, and $n_{D2}$ represents 1 or 2.]

In the metal complex represented by the formula Ir-1, at least one of $R^{D1}$ to $R^{D8}$ is preferably a group represented by the formula (D-A).

In the metal complex represented by the formula Ir-2, at least one of $R^{D11}$ to $R^{D20}$ is preferably a group represented by the formula (D-A).

In the metal complex represented by the formula Ir-3, at least one of $R^{D1}$ to $R^{D8}$ and $R^{D11}$ to $R^{D20}$ is preferably a group represented by the formula (D-A).

In the metal complex represented by the formula Ir-4, at least one of $R^{D21}$ to $R^{D26}$ is preferably a group represented by the formula (D-A).

In the metal complex represented by the formula Ir-5, at least one of $R^{D31}$ to $R^{D37}$ is preferably a group represented by the formula (D-A).

[chemical formula 56]

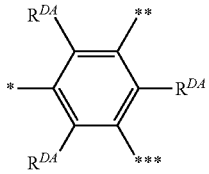
(GDA-11)

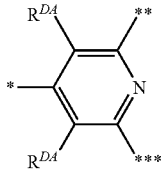
(GDA-12)

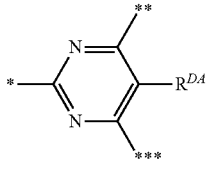
(GDA-13)

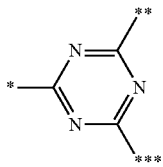
(GDA-14)

-continued

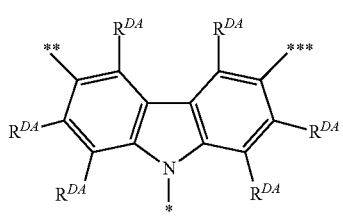
(GDA-15)

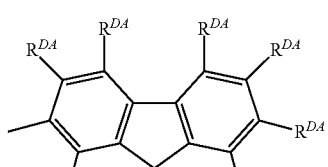
(TDA-2)

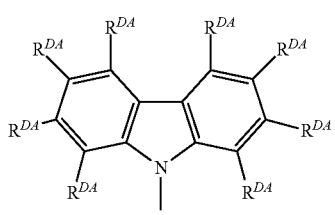
(TDA-3)

[wherein,

*,  and * each represent a linkage to $Ar^{DA1}$, $Ar^{DA2}$ and $Ar^{DA3}$.

$R^{DA}$ represents a hydrogen atom, an alkyl group, a cycloalkyl group, an alkoxy group, a cycloalkoxy group, an aryl group or a monovalent heterocyclic group, and these groups each optionally further have a substituent. When a plurality of $R^{DA}$ are present, they may be the same or different.]

$R^{DA}$ is preferably a hydrogen atom, an alkyl group, a cycloalkyl group, an alkoxy group or a cycloalkoxy group, more preferably a hydrogen atom, an alkyl group or cycloalkyl group, and these groups each optionally have a substituent.

$Ar^{DA1}$, $Ar^{DA2}$ and $Ar^{DA3}$ are each preferably groups represented by the formulae (ArDA-1) to (ArDA-3).

[chemical formula 57]

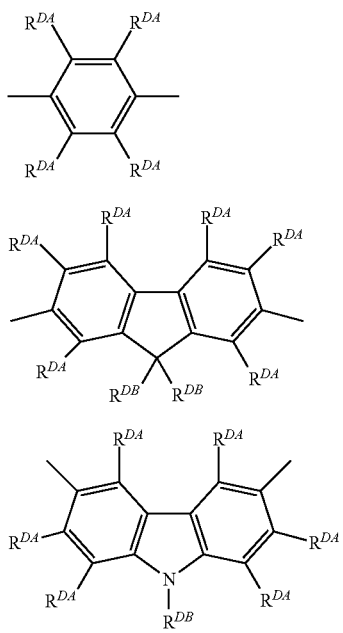

(ArDA-1)

(ArDA-2)

(ArDA-3)

[chemical formula 58]

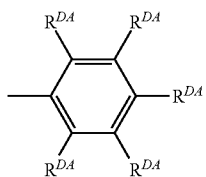
(TDA-1)

[wherein, $R^{DA}$ and $R^{DB}$ represent the same meaning described above.]

The group represented by the formula (D-A) is preferably a group represented by the formula (D-A1) to (D-A3).

[chemical formula 59]

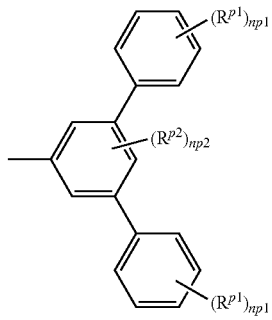
(D-A1)

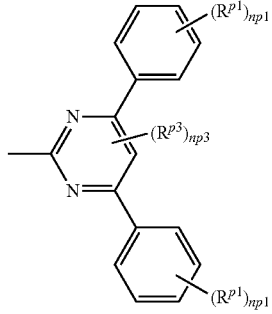
(D-A2)

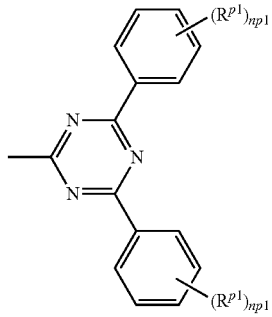
(D-A3)

[wherein, $R^{p1}$, $R^{p2}$ and $R^{p3}$ each independently represent an alkyl group, a cycloalkyl group, an alkoxy group, a cycloalkoxy group or a halogen atom. When a plurality of $R^{p1}$ and $R^{p2}$ are present, they may be the same or different at each occurrence.

np1 represents an integer of 0 to 5, np2 represents an integer of 0 to 3, and np3 represents 0 or 1. The plurality of np1 may be the same or different.]

np1 is preferably an integer of 0 to 3, more preferably an integer of 1 to 3, further preferably 1. np2 is preferably 0 or 1, more preferably 0. np3 is preferably 0.

$R^{p1}$, $R^{p2}$ and $R^{p3}$ are each preferably an alkyl group or a cycloalkyl group.

The anionic bidentate ligand represented by $-A^{D1}-A^{D2}-$ includes, for example, ligands represented by the following formulae.

[chemical formula 60]

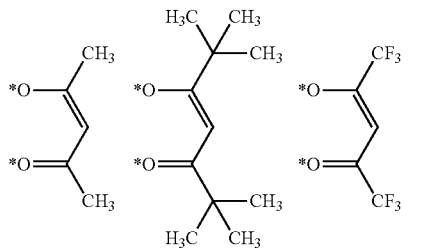
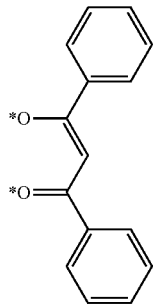
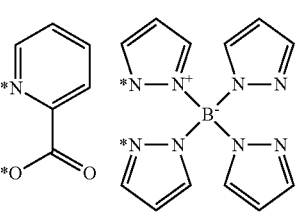

[wherein, * represents a position linking to Ir.]

The metal complex represented by the formula Ir-1 is preferably a metal complex represented by the formula Ir-11 to Ir-13. The metal complex represented by the formula Ir-2 is preferably a metal complex represented by the formula Ir-21. The metal complex represented by the formula Ir-3 is preferably a metal complex represented by the formula Ir-31 to Ir-33. The metal complex represented by the formula Ir-4 is preferably a metal complex represented by the formula Ir-41 to Ir-43. The metal complex represented by the formula Ir-5 is preferably a metal complex represented by the formula Ir-51 to Ir-53.

[chemical formula 61]

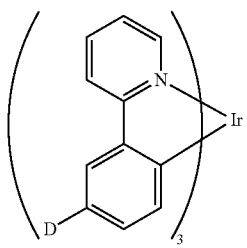

Ir-11

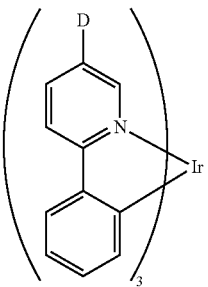

Ir-12

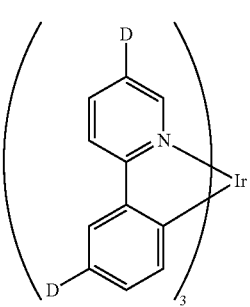

Ir-13

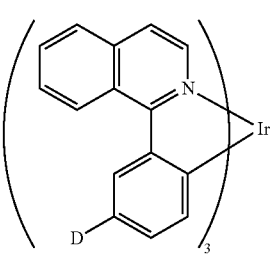

Ir-21

[chemical formula 62]

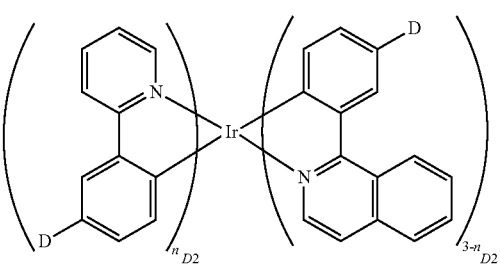

Ir-31

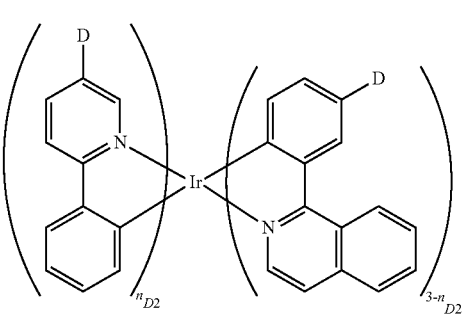

Ir-32

[chemical formula 63]

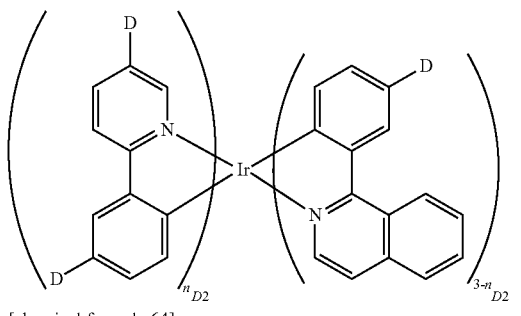

Ir-33

[chemical formula 64]

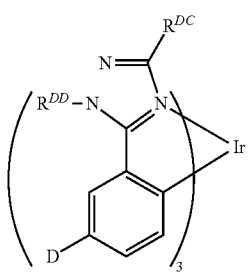

Ir-41

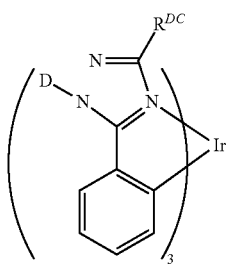

Ir-42

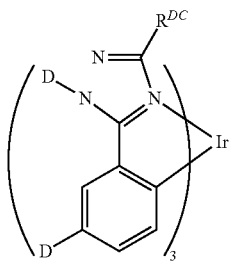

Ir-43

[chemical formula 65]

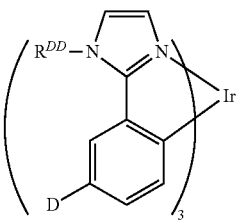

Ir-51

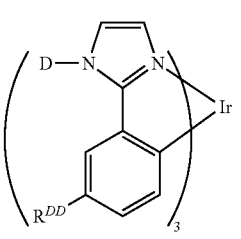

Ir-52

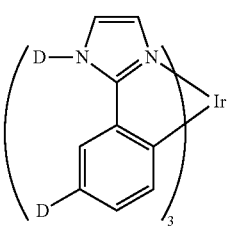

Ir-53

[wherein, $n_{D2}$ represents 1 or 2.

D represents a group represented by the formula (D-A). The plurality of D are the same or different.

$R^{DC}$ represents a hydrogen atom, an alkyl group, a cycloalkyl group, an aryl group or a monovalent heterocyclic group, and these groups each optionally have a substituent. The plurality of $R^{DC}$ are the same or different.

$R^{DD}$ represents an alkyl group, a cycloalkyl group, an aryl group or a monovalent heterocyclic group, and these groups each optionally have a substituent. The plurality of $R^{DD}$ are the same or different.]

The triplet light emitting complex includes, for example, metal complexes listed below.

[chemical formula 66]

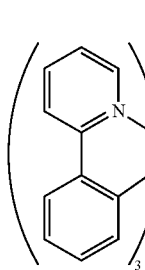 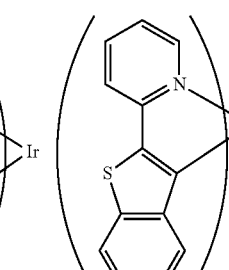 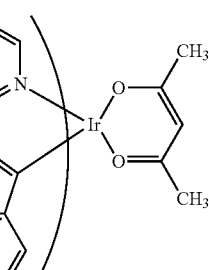

Ir(ppy)₃   Btp₂Ir(acac)   FIrpic

-continued
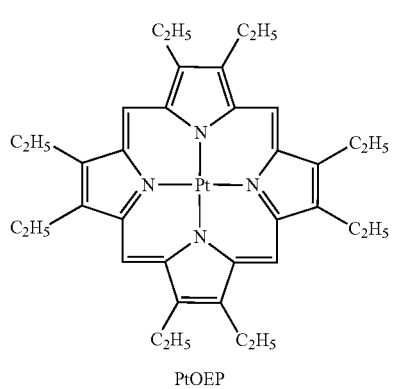
PtOEP
[chemical formula 67]
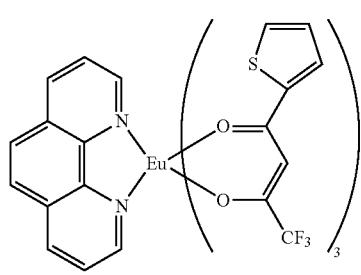
Eu(TTA)₃phen
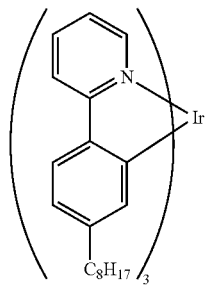
COM-1
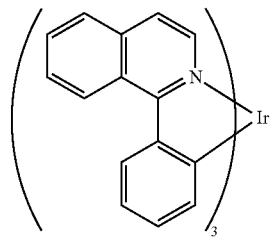
COM-2
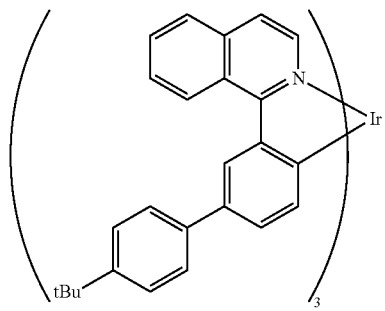
COM-3

-continued
[chemical formula 68]
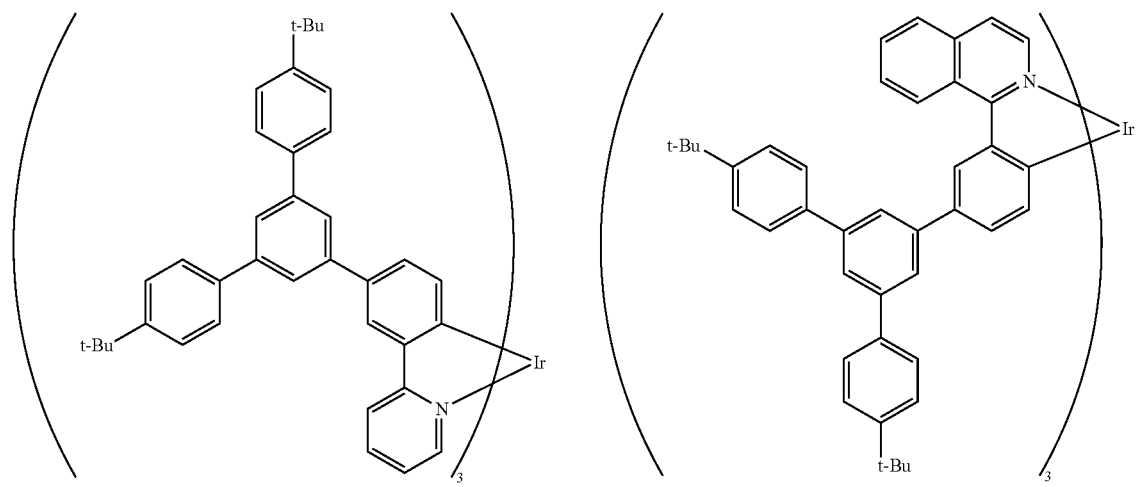
COM-4
COM-5
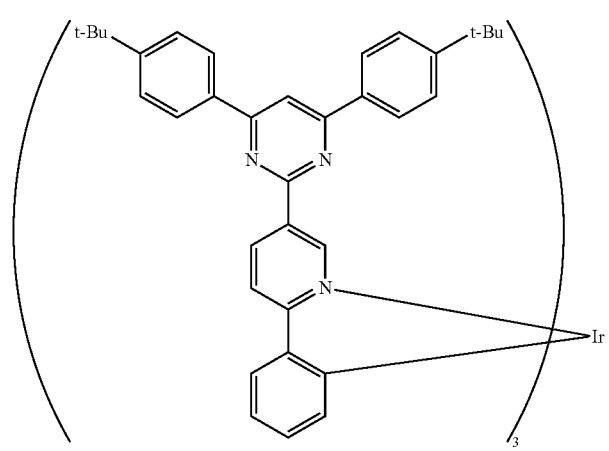
COM-6
[chemical formula 69]
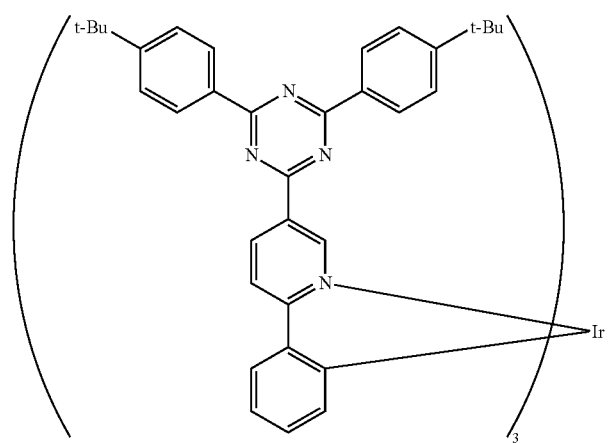
COM-7

-continued
COM-8
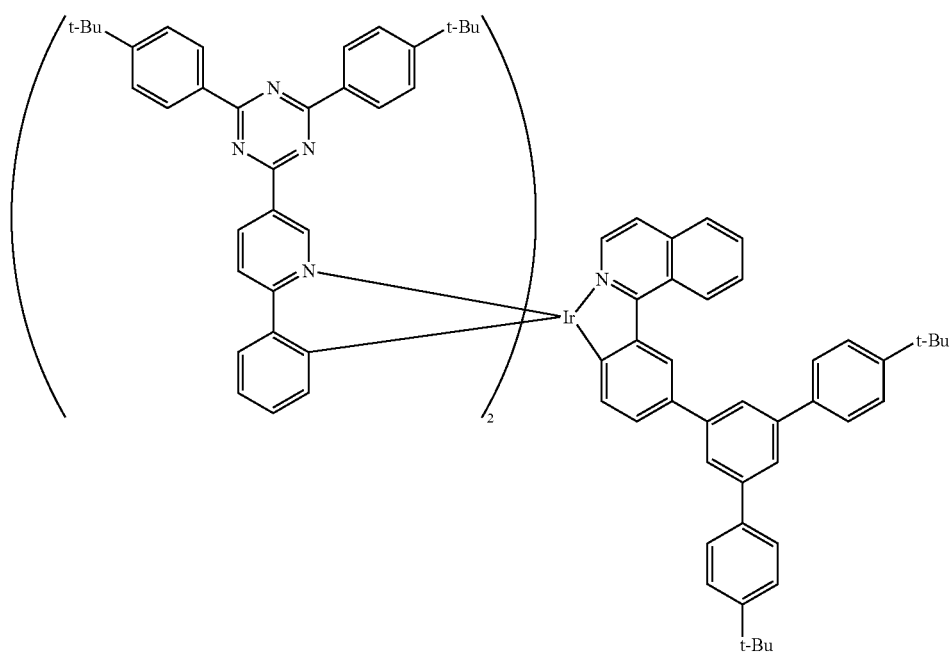
[chemical formula 70]
COM-9    COM-10
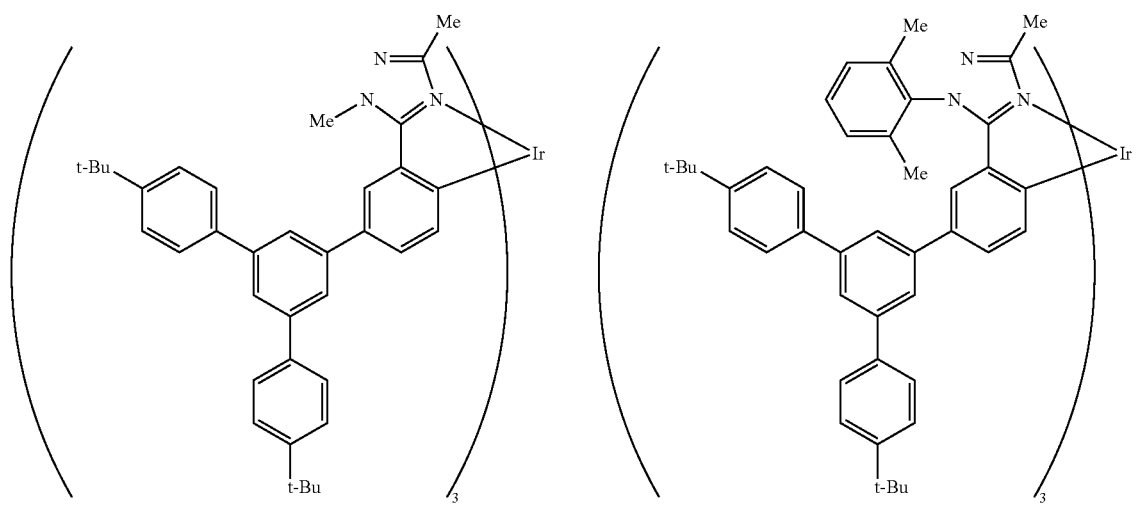
COM-11    COM-12
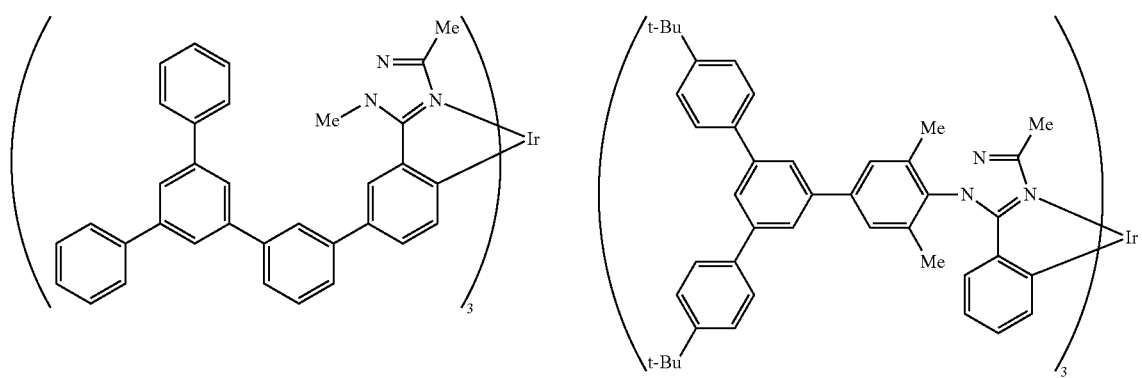

-continued
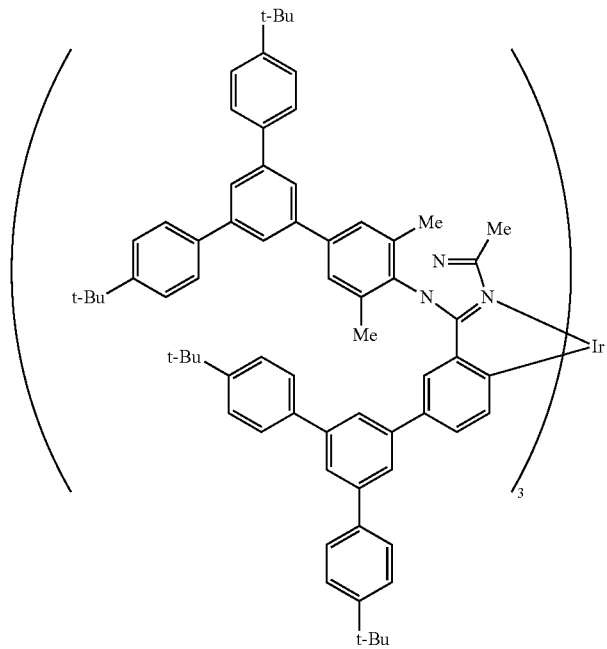
COM-13
[chemical formula 71]
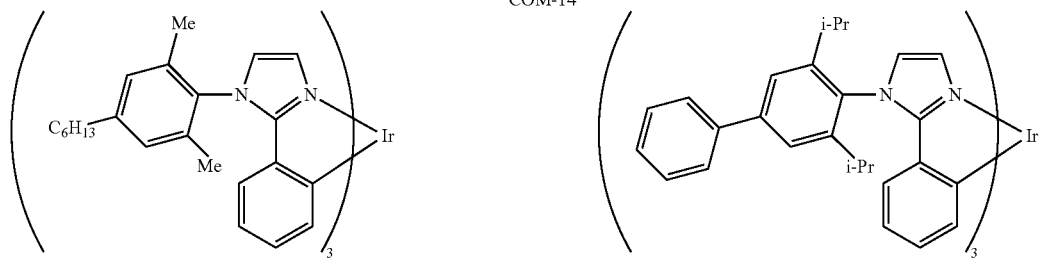
COM-14 COM-15
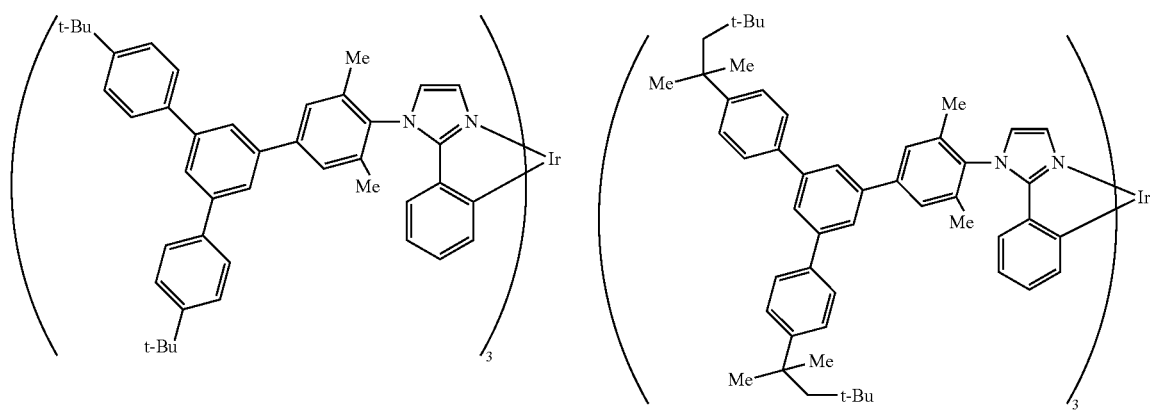
COM-16 COM-17

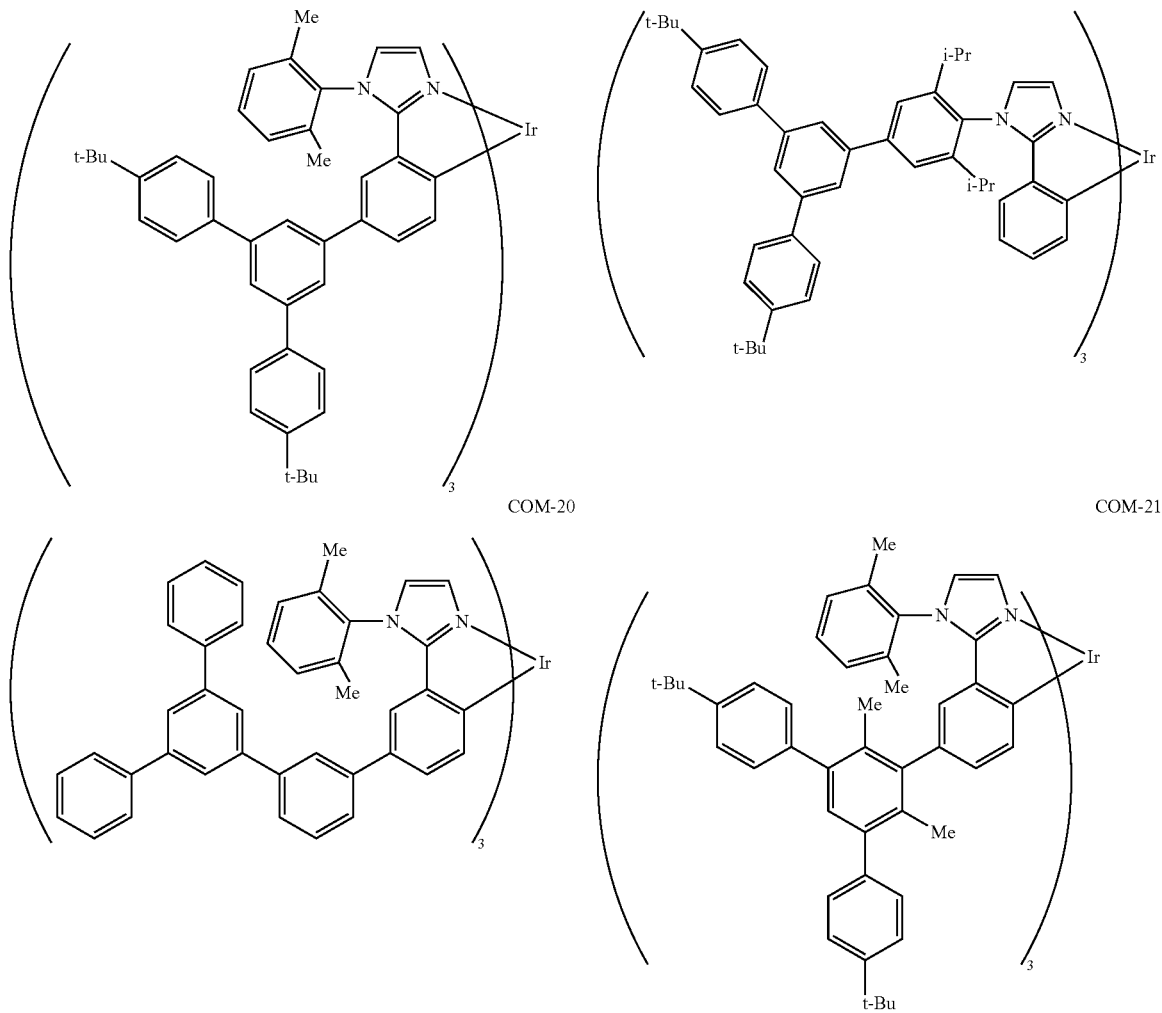

When the phosphorescent material is used together with a host material having at least one function selected from the group consisting of hole transportability, hole injectability, electron transportability and electron injectability, the light emission efficiency of a light emitting device becomes excellent. That is, when the light emitting layer comprises a phosphorescent material, it is preferable that the light emitting layer comprises a phosphorescent material and a host material.

When the light emitting layer comprises a host material, the host material may be contained singly or two or more kinds of the host materials may be contained.

When the light emitting layer comprises a phosphorescent material and a host material, the content of the phosphorescent material is usually 0.05 to 80 parts by weight, preferably 0.1 to 50 parts by weight, more preferably 0.5 to 40 parts by weight when the total content of the phosphorescent material and the host material is 100 parts by weight.

It is preferable that the lowest excited triplet state ($T_1$) of a host material is at energy level equivalent to or higher than $T_1$ of a phosphorescent material, because the light emitting device is excellent in light emission efficiency.

The host materials are classified into low molecular weight compounds (hereinafter, referred to also as "low molecular weight host") and polymer compounds (hereinafter, referred to also as "polymer host"), and any of the low molecular weight host and the polymer host may be permissible, the polymer host being preferred.

The low molecular weight host includes, for example, a compound having a carbazole structure, a compound having a triarylamine structure, a compound having a phenanthroline structure, a compound having a triaryltriazine structure, a compound having an azole structure, a compound having a benzothiophene structure, a compound having a benzofuran structure, a compound having a fluorene structure, a compound having a spirofluorene structure, and the like.

Specific examples of the low molecular weight host include compounds represented by the following formulae.

[chemical formula 72]

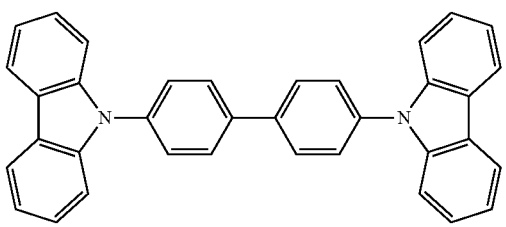

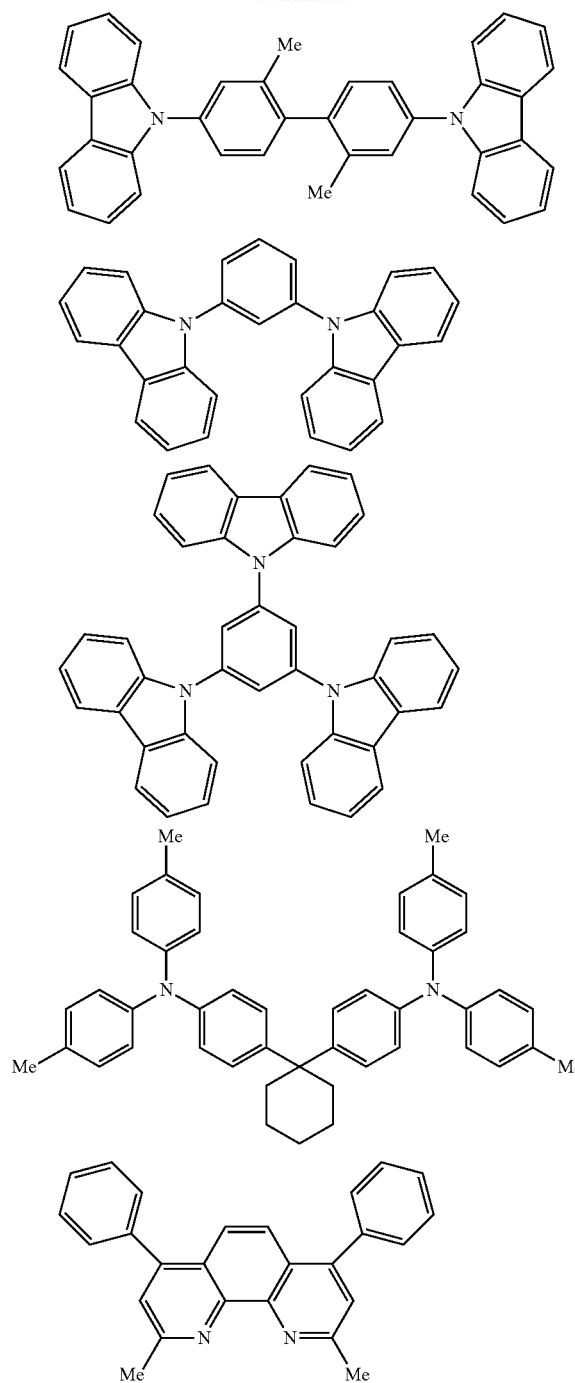
[chemical formula 73]
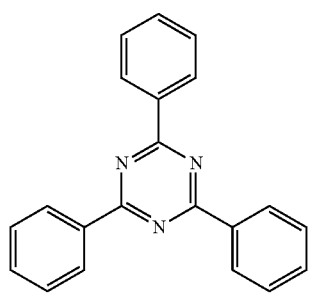
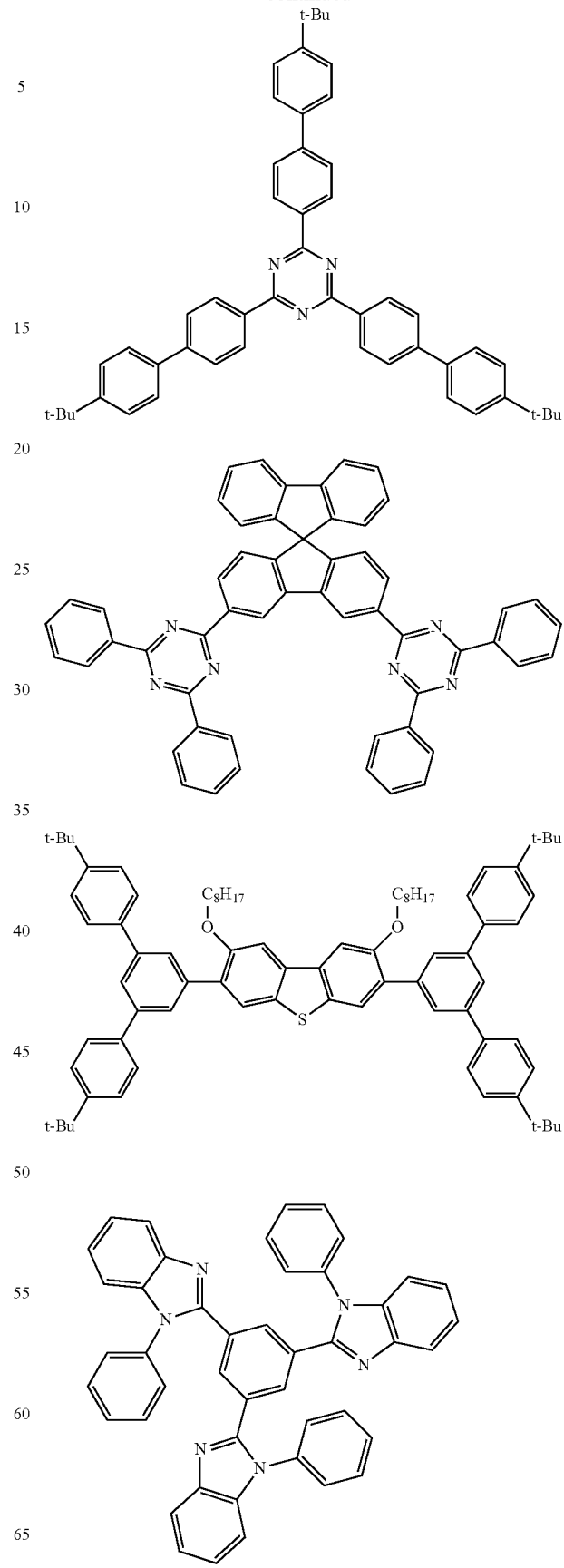

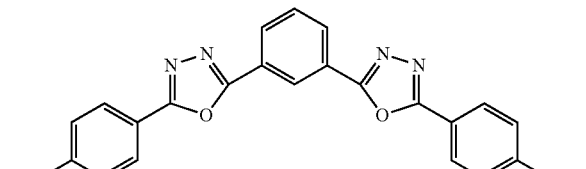

[chemical formula 74]

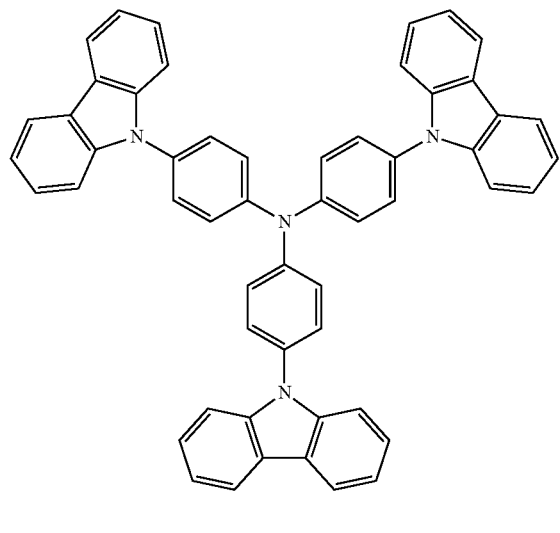

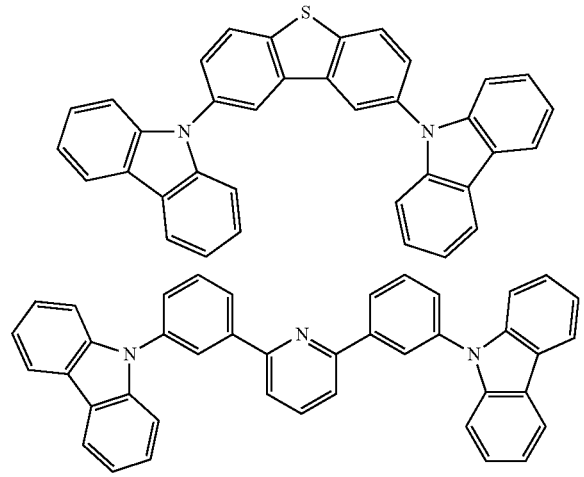

[chemical formula 75]

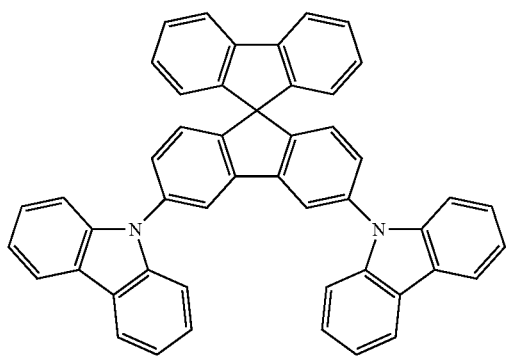

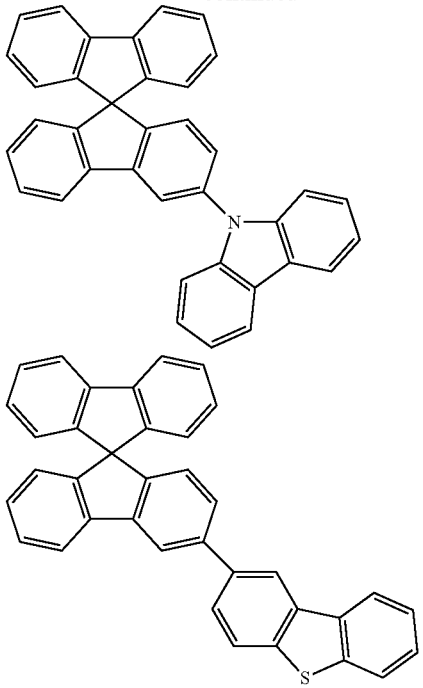

As the polymer host, preferable are polymer compounds comprising at least one constitutional unit selected from the group consisting of a constitutional unit represented by the formula (X) and a constitutional unit represented by the formula (Y) described above.

Of them, the polymer host is preferably a polymer compound comprising at least one constitutional unit selected from the group consisting of a constitutional unit represented by the formula (Y-4), a constitutional unit represented by the formula (Y-5), a constitutional unit represented by the formula (Y-6) and a constitutional unit represented by the formula (Y-7), more preferably a polymer compound comprising at least one constitutional unit selected from the group consisting of a constitutional unit represented by the formula (Y-4) and a constitutional unit represented by the formula (Y-6), further preferably a polymer compound comprising a constitutional unit represented by the formula (Y-4).

Further, the polymer host is preferably a polymer compound comprising at least one constitutional unit selected from the group consisting of a constitutional unit represented by the formula (Y-1), a constitutional unit represented by the formula (Y-2), a constitutional unit represented by the formula (Y-3) and a constitutional unit represented by the formula (X), more preferably a polymer compound comprising at least one constitutional unit selected from the group consisting of a constitutional unit represented by the formula (Y-1), a constitutional unit represented by the formula (Y-2) and a constitutional unit represented by the formula (X), as the constitutional unit other than a constitutional unit represented by the formula (Y-4), a constitutional unit represented by the formula (Y-5), a constitutional unit represented by the formula (Y-6) and a constitutional unit represented by the formula (Y-7).

<Production Methods of Polymer Compound as Fluorescent Material and Polymer Host>

The polymer compound as a fluorescent material and the polymer host can be produced by using a known polymerization method described in Chem. Rev., vol. 109, pp. 897-1091 (2009) and the like, exemplified are methods of causing polymerization by a coupling reaction using a transition metal catalyst such as the Suzuki reaction, the Yamamoto reaction, the Buchwald reaction, the Stille reaction, the Negishi reaction and the Kumada reaction.

In the above-described polymerization method, the method of charging monomers includes, for example, a method in which the total amount of monomers is charged in a lump into the reaction system, a method in which monomers are partially charged and reacted, then, the remaining monomers are charged in a lump, continuously or in divided doses, and a method in which monomers are charged continuously or in divided doses.

The transition metal catalyst includes a palladium catalyst, a nicked catalyst and the like.

For the post treatment of the polymerization reaction, known methods, for example, a method of removing water-soluble impurities by liquid-separation, a method in which the reaction solution after the polymerization reaction is added to a lower alcohol such as methanol to cause deposition of a precipitate which is then filtrated before drying, and other methods, are used each singly or combined. When the purity of the polymer host is low, the polymer host can be purified by usual methods such as, for example, recrystallization, reprecipitation, continuous extraction with a Soxhlet extractor and column chromatography.

[Composition of Light Emitting Layer]

The light emitting layer may be a layer comprising a composition comprising the above-described light emitting material and at least one material selected from the group consisting of the above-described host material, the hole transporting material, the hole injection material, the electron transporting material, the electron injection material and the antioxidant (hereinafter, referred to also as "composition of light emitting layer").

[Hole Transporting Material]

The hole transporting material is classified into low molecular weight compounds and polymer compounds, and polymer compounds are preferable. The hole transporting material optionally has a crosslinkable group.

The polymer compound includes, for example, polyvinylcarbazole and derivatives thereof; polyarylene having an aromatic amine structure in the side chain or main chain and derivatives thereof. The polymer compound may also be a compound in which an electron accepting portion is linked. The electron accepting portion includes, for example, fullerene, tetrafluorotetracyanoquinodimethane, tetracyanoethylene, trinitrofluorenone and the like, preferably fullerene.

In the composition of the light emitting layer, the compounding amount of the hole transporting material is usually 1 to 400 parts by weight, preferably 5 to 150 parts by weight when the content of the light emitting material is 100 parts by weight.

The hole transporting material may be used singly, or two or more hole transporting materials may be used in combination.

[Electron Transporting Material]

The electron transporting material is classified into low molecular weight compounds and polymer compounds. The electron transporting material optionally has a crosslinkable group.

The low molecular weight compound includes, for example, a metal complex having 8-hydroxyquinoline as a ligand, oxadiazole, anthraquinodimethane, benzoquinone, naphthoquinone, anthraquinone, tetracyanoanthraquinodimethane, fluorenone, diphenyldicyanoethylene, diphenoquinone and derivatives thereof.

The polymer compound includes, for example, polyphenylene, polyfluorene and derivatives thereof. These polymer compounds may be doped with a metal.

In the composition of the light emitting layer, the compounding amount of the electron transporting material is usually 1 to 400 parts by weight, preferably 5 to 150 parts by weight when the content of the light emitting material is 100 parts by weight.

The electron transporting material may be used singly, or two or more electron transporting materials may be used in combination.

[Hole Injection Material and Electron Injection Material]

The hole injection material and the electron injection material are each classified into low molecular weight compounds and polymer compounds. The hole injection material and the electron injection material each optionally have a crosslinkable group.

The low molecular weight compound includes, for example, metal phthalocyanines such as copper phthalocyanine; carbon; oxides of metals such as molybdenum and tungsten; metal fluorides such as lithium fluoride, sodium fluoride, cesium fluoride and potassium fluoride.

The polymer compound includes, for example, polyaniline, polythiophene, polypyrrole, polyphenylenevinylene, polythienylenevinylene, polyquinoline and polyquinoxaline, and derivatives thereof; electrically conductive polymers such as a polymer comprising an aromatic amine structure in the main chain or side chain.

In the composition of the light emitting layer, the compounding amounts of the hole injection material and the electron injection material are each usually 1 to 400 parts by weight, preferably 5 to 150 parts by weight when the content of the light emitting material is 100 parts by weight.

The hole injection material and the electron injection material may each be used singly, or two or more of them may be used in combination.

[Ion Dope]

When the hole injection material or the electron injection material comprises an electrically conductive polymer, the electric conductivity of the electrically conductive polymer is preferably $1 \times 10^{-5}$ S/cm to $1 \times 10^{3}$ S/cm. For adjusting the electric conductivity of the electrically conductive polymer within such a range, the electrically conductive polymer can be doped with a suitable amount of ions.

The kind of the ion to be doped is an anion for a hole injection material and a cation for an electron injection material. The anion includes, for example, a polystyrenesulfonate ion, an alkylbenzenesulfonate ion and a camphorsulfonate ion. The cation includes, for example, a lithium ion, a sodium ion, a potassium ion and a tetrabutylammonium ion.

The ion to be doped may be used singly, or two or more ions to be doped may be used.

[Antioxidant]

The antioxidant may advantageously be one which is soluble in the same solvent as for a light emitting material and does not disturb light emission and charge transportation, and the examples thereof include phenol-based antioxidants and phosphorus-based antioxidants.

In the composition of the light emitting layer, the compounding amount of the antioxidant is usually 0.001 to 10 parts by weight when the content of the light emitting material is 100 parts by weight.

The antioxidant may be used singly, or two or more antioxidants may be used in combination.

[Ink of Light Emitting Layer]

The composition of the light emitting layer comprising a light emitting material and a solvent (hereinafter, referred to also as "ink of light emitting layer".) can be suitably used in application methods such as a spin coat method, a casting method, a micro gravure coat method, a gravure coat method, a bar coat method, a roll coat method, a wire bar coat method, a dip coat method, a spray coat method, a screen printing method, a flexo printing method, an offset printing method, an inkjet printing method, a capillary coat method and a nozzle coat method.

The viscosity of the ink of the light emitting layer may be adjusted depending on the kind of the application method, and when a solution goes through a discharge apparatus such as in an inkjet printing method, the viscosity is preferably in the range of 1 to 20 mPa·s at 25° C. because curved aviation and clogging in discharging are unlikely.

As the solvent contained in the ink of the light emitting layer, those capable of dissolving or uniformly dispersing solid components in the ink are preferable. The solvent includes, for example, chlorine-based solvents such as 1,2-dichloroethane, 1,1,2-trichloroethane, chlorobenzene and o-dichlorobenzene; ether solvents such as THF, dioxane, anisole and 4-methylanisole; aromatic hydrocarbon solvents such as toluene, xylene, mesitylene, ethylbenzene, n-hexylbenzene and cyclohexylbenzene; aliphatic hydrocarbon solvents such as cyclohexane, methylcyclohexane, n-pentane, n-hexane, n-heptane, n-octane, n-nonane, n-decane, n-dodecane and bicyclohexyl; ketone solvents such as acetone, methylethylketone, cyclohexanone and acetophenone; ester solvents such as ethyl acetate, butyl acetate, ethylcellosolve acetate, methyl benzoate and phenyl acetate; poly-hydric alcohol solvents such as ethylene glycol, glycerin and 1,2-hexanediol and derivatives thereof; alcohol solvents such as isopropylalcohol and cyclohexanol; sulfoxide solvents such as dimethyl sulfoxide; and amide solvents such as N-methyl-2-pyrrolidone and N,N-dimethylformamide. These solvents may be used singly, or two or more of them may be used in combination.

In the ink of the light emitting layer, the compounding amount of the solvent is usually 1000 to 100000 parts by weight, preferably 2000 to 20000 parts by weight when the content of the light emitting material is 100 parts by weight.

<Hole Transporting Layer>

The hole transporting layer comprises a cross-linked body of a crosslinkable material. The cross-linked body of a crosslinkable material is a cross-linked body in which a crosslinkable material is cross-linked intramolecularly or intermolecularly, or in both modes. The cross-linked body of a crosslinkable material contained in a hole transporting layer may be a cross-linked body in which a crosslinkable material and another compound are crosslinked intermolecularly.

The cross-linked body of a crosslinkable material contained in a hole transporting layer may be a cross-linked body of a polymer compound (hereinafter, referred to also as "polymer compound of hole transporting layer") or a cross-linked body of a low molecular weight compound (hereinafter, referred to also as "low molecular weight compound of hole transporting layer"), and it is preferably a cross-linked body of a polymer compound, because production of the light emitting device is easy.

The layer comprising a cross-linked body of a polymer compound of a hole transporting layer is a layer obtained by crosslinking a layer comprising a polymer compound of a hole transporting layer by an external stimulus such as heating and light irradiation. The layer comprising a cross-linked body of a polymer compound of a hole transporting layer can be suitably used for lamination of a light emitting device described later because the layer is substantially insolubilized in a solvent.

The layer comprising a cross-linked body of a low molecular weight compound of a hole transporting layer is a layer obtained by crosslinking a layer comprising a low molecular weight compound of a hole transporting layer by an external stimulus such as heating and light irradiation. The layer comprising a cross-linked body of a low molecular weight compound of a hole transporting layer can be suitably used for lamination of a light emitting device described later because the layer is substantially insolubilized in a solvent.

[Polymer Compound of Hole Transporting Layer]

The polymer compound of a hole transporting layer is preferably a polymer compound comprising a constitutional unit represented by the formula (X) and a constitutional unit having a crosslinkable group (hereinafter, referred to also as "first polymer compound of hole transporting layer") or a polymer compound comprising a constitutional unit represented by the formula (3) (hereinafter, referred to also as "second polymer compound of hole transporting layer"), because the light emitting device is excellent in luminance life.

[Constitutional Unit Represented by the Formula (X)]

The definition and the examples of the constitutional unit represented by the formula (X) contained in the first polymer compound of a hole transporting layer are the same as the definition and the examples of the constitutional unit represented by the formula (X) which may be contained in a polymer compound as the fluorescent material.

The constitutional unit represented by the formula (X) is preferably 20 to 90 mol %, more preferably 25 to 70 mol %, further preferably 30 to 50 mol % with respect to the total amount of constitutional units contained in the polymer compound, because the light emitting device is excellent in luminance life.

The constitutional unit represented by the formula (X) may be contained only singly or two or more kinds of the constitutional units represented by the formula (X) may be contained in the first polymer compound of a hole transporting layer.

[Constitutional Unit Having Crosslinkable Group]

The constitutional unit having a crosslinkable group contained in the first polymer compound of a hole transporting layer is preferably a constitutional unit having at least one crosslinkable group selected from Group A of crosslinkable group, more preferably a constitutional unit having a crosslinkable group represented by the formula (XL-1), (XL-3), (XL-5), (XL-7), (XL-16) or (XL-17), further preferably a constitutional unit having a crosslinkable group represented by the formula (XL-1) or the formula (XL-17), because the first polymer compound of a hole transporting layer is excellent in crosslinkability.

The constitutional unit having a crosslinkable group is preferably a constitutional unit represented by the formula (2) or a constitutional unit represented by the formula (3) described later, and may also be a constitutional unit represented by the any one of following formulae.

[chemical formula 76]

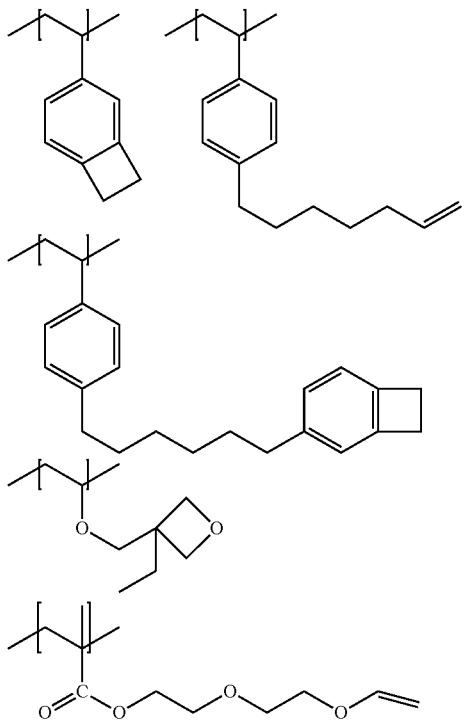

The constitutional unit having at least one crosslinkable group selected from Group A of crosslinkable group is preferably a constitutional unit represented by the formula (2) or a constitutional unit represented by the formula (3).
[Constitutional Unit Represented by the Formula (2)]

[chemical formula 77]

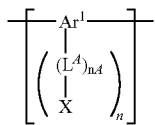

(2)

nA is preferably 0 or 1, more preferably 0, because the light emitting device is excellent in luminance life.

n is preferably 2, because the light emitting device is excellent in luminance life.

$Ar^1$ is preferably an aromatic hydrocarbon group optionally having a substituent, because the light emitting device is excellent in luminance life.

The number of carbon atoms of the aromatic hydrocarbon group represented by $Ar^1$ is usually 6 to 60, preferably 6 to 30, more preferably 6 to 18, not including the number of carbon atoms of the substituent.

The arylene group portion obtained by removing n substituents of the aromatic hydrocarbon group represented by $Ar^1$ is preferably a group represented by the formula (A-1) to the formula (A-20), more preferably a group represented by the formula (A-1), the formula (A-2), the formula (A-6) to the formula (A-10), the formula (A-19) or the formula (A-20), further preferably a group represented by the formula (A-1), the formula (A-2), the formula (A-7), the formula (A-9) or the formula (A-19), and these groups each optionally have a substituent.

The number of carbon atoms of the heterocyclic group represented by $Ar^1$ is usually 2 to 60, preferably 3 to 30, more preferably 4 to 18, not including the number of carbon atoms of the substituent.

The divalent heterocyclic group portion obtained by removing n substituents of the heterocyclic group represented by $Ar^1$ is preferably a group represented by the formula (AA-1) to the formula (AA-34).

The aromatic hydrocarbon group and the heterocyclic group represented by $Ar^1$ optionally have a substituent, and the substituent includes an alkyl group, a cycloalkyl group, an alkoxy group, a cycloalkoxy group, an aryl group, an aryloxy group, a halogen atom, a monovalent heterocyclic group and a cyano group.

The alkylene group represented by $L^A$ is usually 1 to 20, preferably 1 to 15, more preferably 1 to 10, not including the number of carbon atoms of the substituent. The number of carbon atoms of the cycloalkylene group represented by $L^A$ is usually 3 to 20, not including the number of carbon atoms of the substituent.

The alkylene group and the cycloalkylene group optionally have a substituent, and examples thereof include, for example, a methylene group, an ethylene group, a propylene group, a butylene group, a hexylene group, a cyclohexylene group and an octylene group.

The alkylene group and the cycloalkylene group represented by $L^A$ optionally have a substituent. The substituent which the alkylene group and the cycloalkylene group optionally have includes, for example, an alkyl group, a cycloalkyl group, an alkoxy group, a cycloalkoxy group, a halogen atom and a cyano group.

The arylene group represented by $L^A$ optionally has a substituent. The arylene group includes o-phenylene, m-phenylene and p-phenylene. The substituent which the arylene group optionally has includes, for example, an alkyl group, a cycloalkyl group, an alkoxy group, a cycloalkoxy group, an aryl group, an aryloxy group, a monovalent heterocyclic group, a halogen atom, a cyano group and a crosslinkable group selected from Group A of crosslinkable group.

$L^A$ is preferably a phenylene group or an alkylene group, and these groups each optionally have a substituent, because production of the first polymer compound of a hole transporting layer is easy.

The crosslinkable group represented by X is preferably a crosslinkable group represented by the formula (XL-1), (XL-3), (XL-5), (XL-7), (XL-16) or (XL-17), more preferably a crosslinkable group represented the formula (XL-1) or the formula (XL-17), because the first polymer compound of a hole transporting layer is excellent in crosslinkability.

The amount of the constitutional unit represented by the formula (2) is preferably 0.5 to 50 mol %, more preferably 3 to 30 mol %, further preferably 3 to 20 mol % with respect to the total amount of constitutional units contained in the polymer compound, because the first polymer compound of a hole transporting layer is excellent in stability and crosslinkability.

The constitutional unit represented by the formula (2) may be contained only singly or two or more kinds of the constitutional units represented by the formula (2) may be contained in the first polymer compound of a hole transporting layer.

[Constitutional Unit Represented by the Formula (3)]

[chemical formula 78]

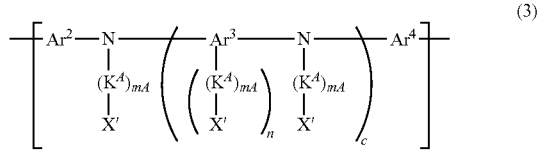

(3)

mA is preferably 0 or 1, more preferably 0, because the light emitting device is excellent in luminance life.

m is preferably 2, because the light emitting device is excellent in luminance life.

c is preferably 0, because production of the first polymer compound of a hole transporting layer is easy and the light emitting device is excellent in luminance life.

$Ar^3$ is preferably an aromatic hydrocarbon group optionally having a substituent, because the light emitting device is excellent in luminance life.

The definition and the examples of the arylene group portion obtained by removing m substituent of the aromatic hydrocarbon group represented by $Ar^3$ are the same as the definition and the examples of the arylene group represented by $Ar^{X2}$ in the formula (X) described above.

The definition and the examples of the divalent heterocyclic group portion obtained by removing m substituent of the heterocyclic group represented by $Ar^3$ are the same as the definition and the examples of the divalent heterocyclic group portion represented by $Ar^{X2}$ in the formula (X) described above.

The definition and the examples of the divalent group obtained by removing m substituents of the group in which at least one aromatic hydrocarbon ring and at least one heterocyclic ring are bonded directly to each other represented by $Ar^3$ are the same as the definition and the examples of the the divalent group in which at least one arylene group and at least one divalent heterocyclic group are bonded directly to each other represented by $Ar^{X2}$ in the formula (X) described above.

$Ar^2$ and $Ar^4$ are each preferably an arylene group optionally having a substituent, because the light emitting device is excellent in luminance life.

The definition and the examples of the arylene group represented by $Ar^2$ and $Ar^4$ are the same as the definition and the examples of the the arylene group represented by $Ar^{X1}$ and $Ar^{X3}$ in the formula (X) described above.

The definition and the examples of the divalent heterocyclic group represented by $Ar^2$ and $Ar^4$ are the same as the definition and the examples of the divalent heterocyclic group represented by $Ar^{X1}$ and $Ar^{X3}$ in the formula (X) described above.

The groups represented by $Ar^2$, $Ar^3$ and $Ar^4$ optionally have a substituent, and the substituent includes an alkyl group, a cycloalkyl group, an alkoxy group, a cycloalkoxy group, an aryl group, an aryloxy group, a halogen atom, a monovalent heterocyclic group and a cyano group.

The definition and the examples of the alkylene group, the cycloalkylene group, the arylene group and the divalent heterocyclic group represented by $K^A$ are the same as the definition and the examples of the alkylene group, the cycloalkylene group, the arylene group and the divalent heterocyclic group represented by $L^A$, respectively.

$K^A$ is preferably a phenylene group or a methylene group, because production of the first polymer compound of a hole transporting layer is easy.

The crosslinkable group represented by X' is preferably a crosslinkable group represented by the formula (XL-1), (XL-3), (XL-5), (XL-7), (XL-16) or (XL-17), more preferably a crosslinkable group represented by the formula (XL-1) or the formula (XL-17), because the first polymer compound of the hole transporting layer is excellent in crosslinkability.

The amount of the constitutional unit represented by the formula (3) is preferably 0.5 to 50 mol %, more preferably 3 to 30 mol %, further preferably 3 to 20 mol % with respect to the total amount of constitutional units contained in the polymer compound, because the first polymer compound of a hole transporting layer is excellent in stability and the first polymer compound of a hole transporting layer is excellent in crosslinkability.

The constitutional unit represented by the formula (3) may be contained only singly or two or more kinds of the constitutional units represented by the formula (3) may be contained in the first polymer compound of a hole transporting layer.

Preferable Embodiment of Constitutional Unit Represented by the Formula (2) or (3)

The constitutional unit represented by the formula (2) includes, for example, constitutional units represented by the formula (2-1) to the formula (2-30), and the constitutional unit represented by the formula (3) includes, for example, constitutional units represented by the formula (3-1) to the formula (3-9). Of them, preferable is a constitutional unit represented by the formula (2-1) to the formula (2-30), more preferable is a constitutional unit represented by the formula (2-1) to the formula (2-15), the formula (2-19), the formula (2-20), the formula (2-23), the formula (2-25) or the formula (2-30), further preferable is a constitutional unit represented by the formula (2-1) to the formula (2-9) or the formula (2-30), because the first polymer compound of the hole transporting layer is excellent in crosslinkability.

[chemical formula 79]

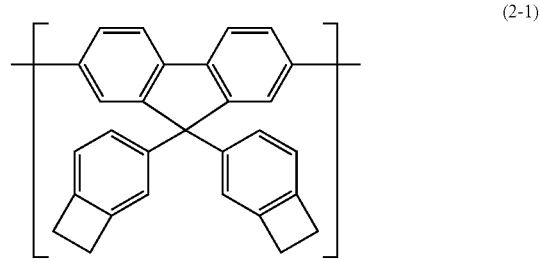

(2-1)

(2-2)
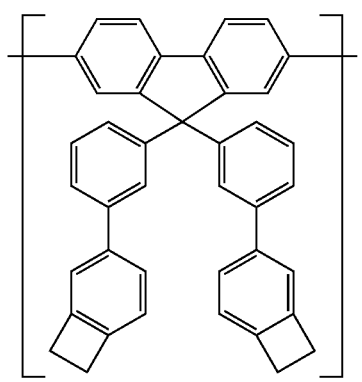
(2-3)
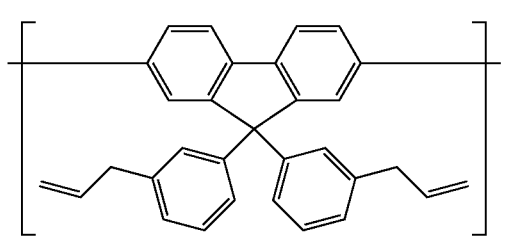
(2-4)
(2-5)
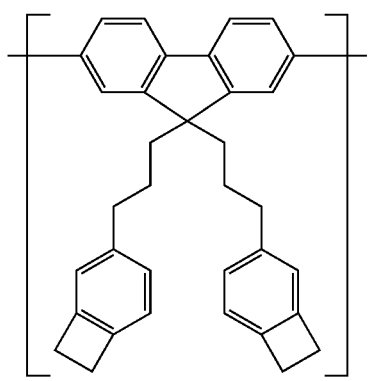
(2-6)
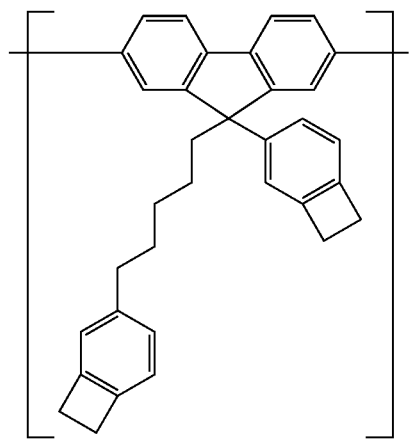
(2-7)
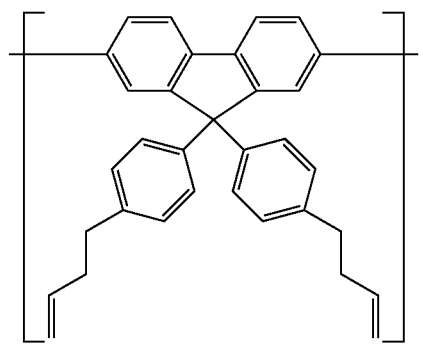
(2-8)
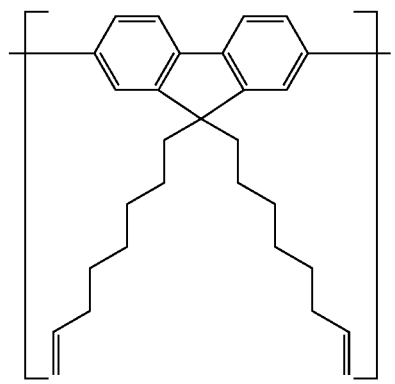
(2-9)
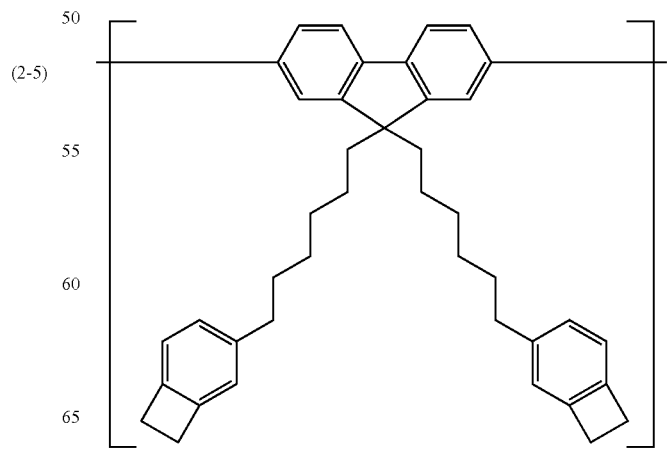

(2-10)
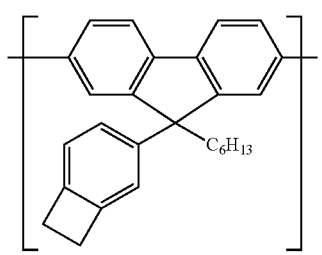
(2-11)
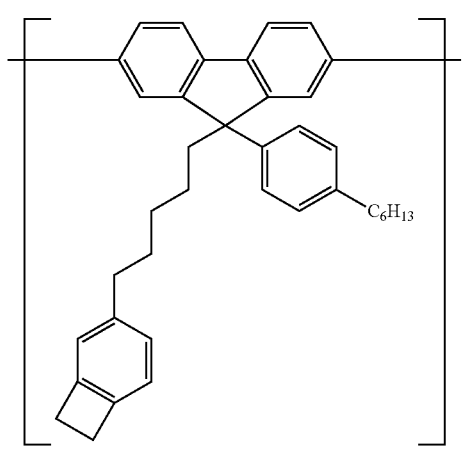
(2-12)
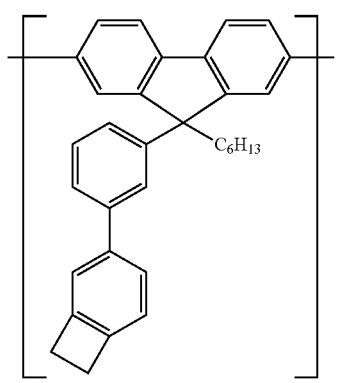
(2-13)
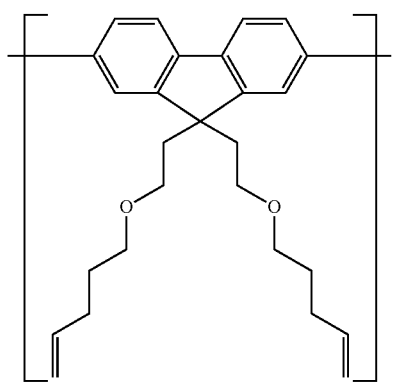
(2-14)
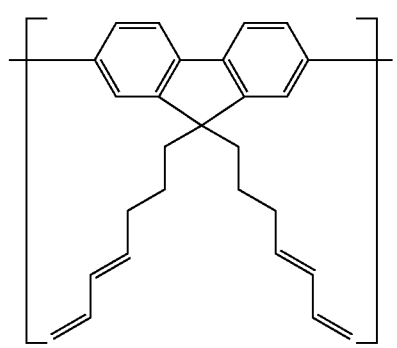
(2-15)
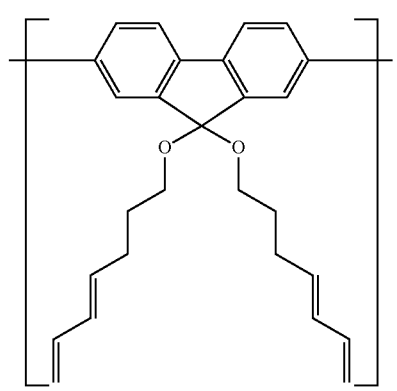
[chemical formula 80]
(2-16)
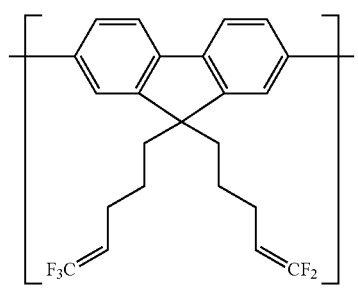
(2-17)
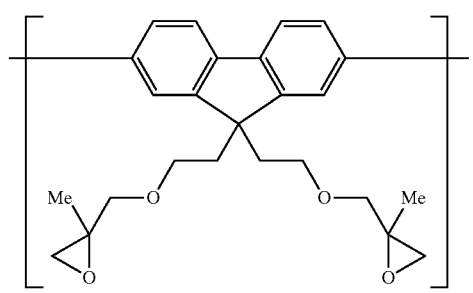

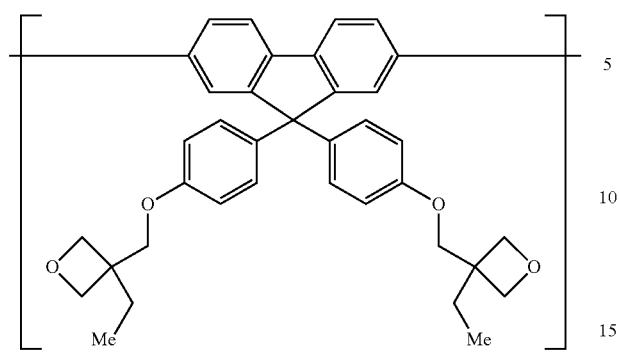
(2-18)
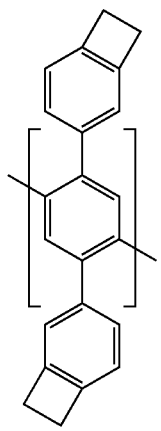
(2-19)
(2-20)
(2-21)
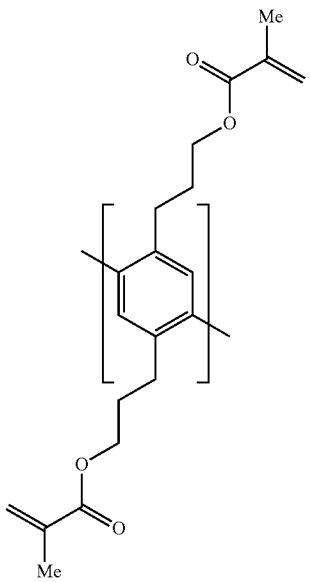
(2-22)
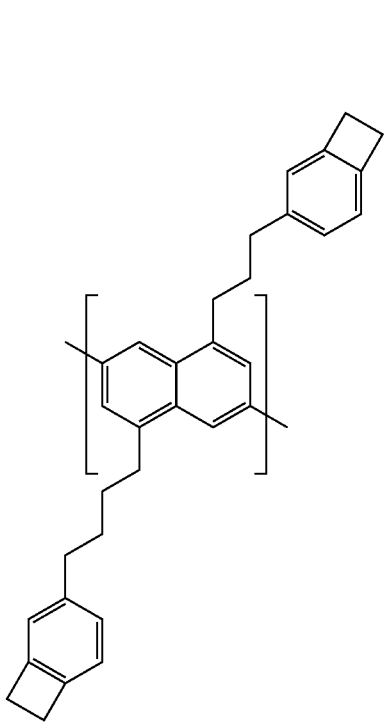
(2-23)

(2-24)
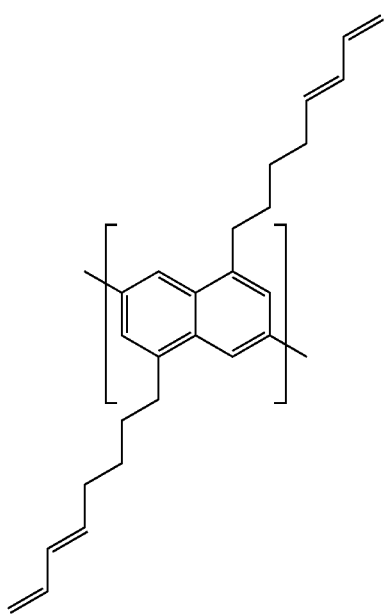
(2-25)
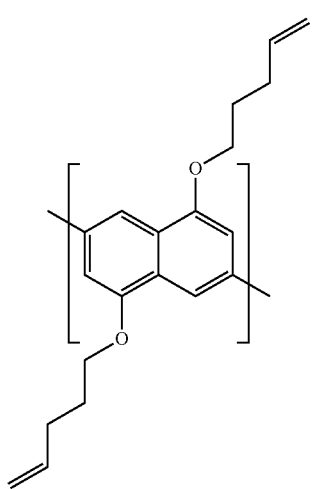
(2-26)
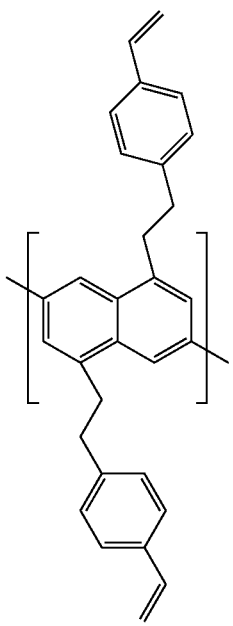
(2-27)
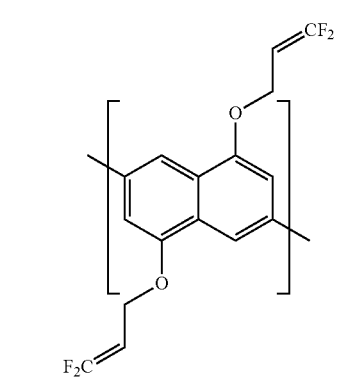
(2-28)
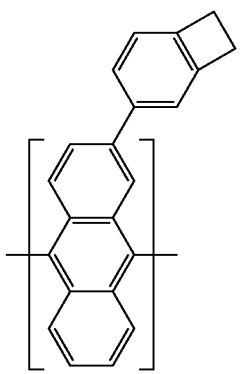
(2-29)
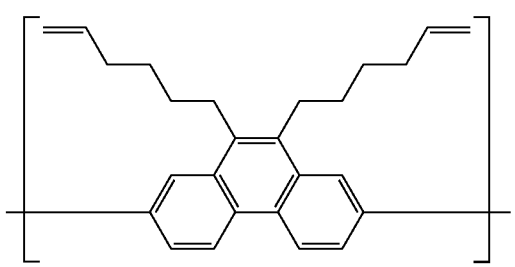

-continued
(2-30)
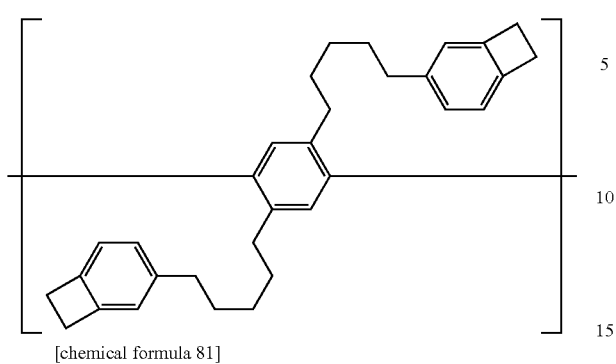
[chemical formula 81]
(3-1)
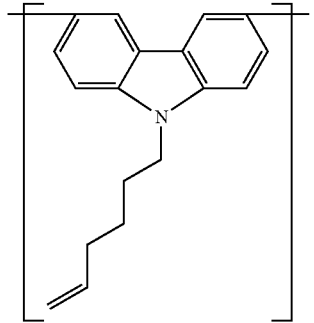
(3-2)
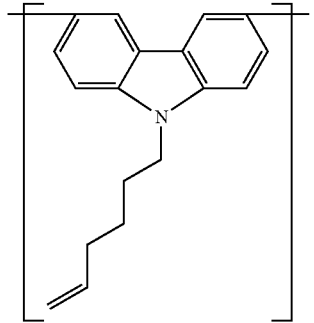
(3-3)
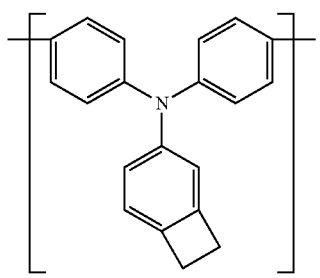
(3-4)
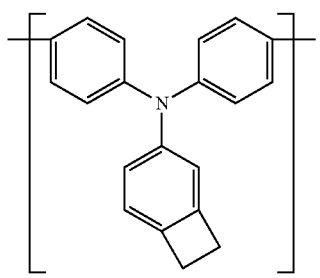
-continued
(3-5)
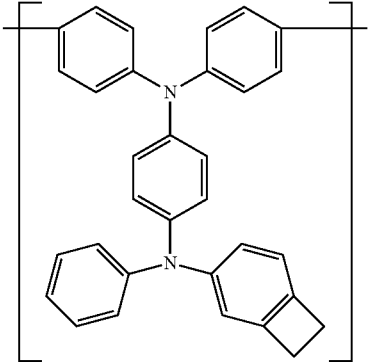
(3-6)
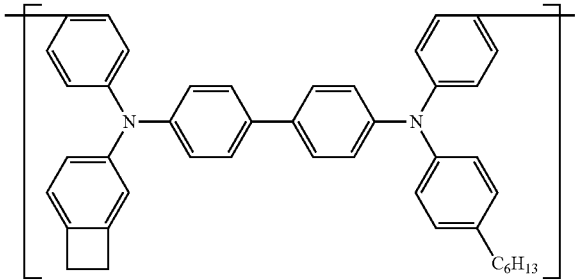
(3-7)
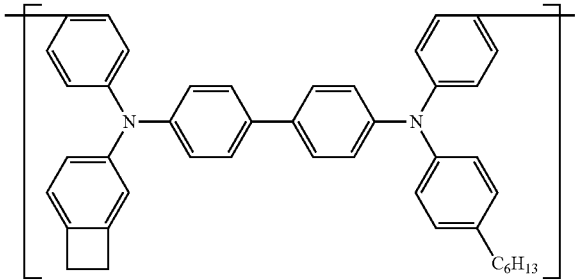
(3-8)
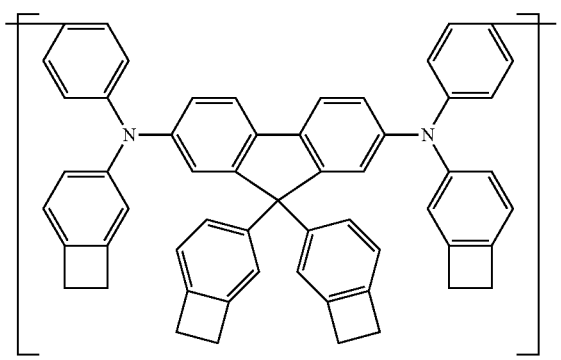

-continued (3-9)

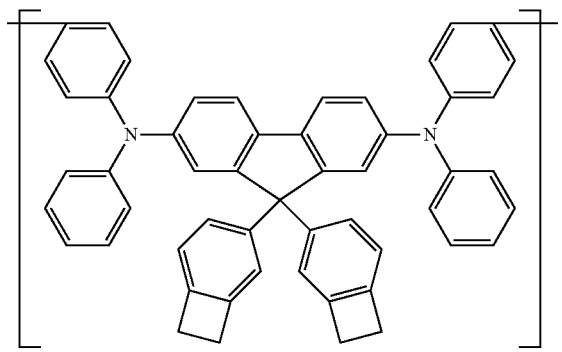

[Constitutional Unit Represented by the Formula (Y)]

It is preferable that the first polymer compound of a hole transporting layer further comprises a constitutional unit represented by the formula (Y), because the light emitting device is excellent in luminance life.

The definition and the examples of the constitutional unit represented by the formula (Y) which may be contained in the first polymer compound of a hole transporting layer are the same as the definition and the examples of the constitutional unit represented by the formula (Y) which may be contained in a polymer compound as the fluorescent material.

The amount of the constitutional unit represented by the formula (Y) in which $Ar^{Y1}$ is an arylene group is preferably 0.5 to 80 mol %, more preferably 30 to 60 mol % with respect to the total amount of constitutional units contained in the polymer compound, because the light emitting device is excellent in luminance life.

The amount of the constitutional unit represented by the formula (Y) in which $Ar^{Y1}$ is a divalent heterocyclic group or a divalent group in which at least one arylene group and at least one divalent heterocyclic group are bonded directly to each other is preferably 0.5 to 40 mol %, more preferably 3 to 30 mol % with respect to the total amount of constitutional units contained in the polymer compound, because the light emitting device is excellent in charge transportability.

The constitutional unit represented by the formula (Y) may be contained only singly or two or more kinds of the constitutional units represented by the formula (Y) may be contained in the first polymer compound of a hole transporting layer.

The first polymer compound of a hole transporting layer includes, for example, polymer compounds (P-201) to (P-206) shown in Table 2. In this table, "other constitutional unit" denotes a constitutional unit other than constitutional units represented by the formula (X), the formula (2), the formula (3) and the formula (Y).

TABLE 2

| Polymer compound | Constitutional unit and molar ratio thereof | | | | |
|---|---|---|---|---|---|
| | formula (X) p' | formula (2) q' | formula (3) r' | formula (Y) s' | other t' |
| (P-201) | 0.1 to 99.9 | 0.1 to 99.9 | 0 | 0 | 0 to 30 |
| (P-202) | 0.1 to 99.9 | 0 | 0.1 to 99.9 | 0 | 0 to 30 |
| (P-203) | 0.1 to 99.8 | 0.1 to 99.8 | 0.1 to 99.8 | 0 | 0 to 30 |
| (P-204) | 0.1 to 99.8 | 0.1 to 99.8 | 0 | 0.1 to 99.8 | 0 to 30 |

TABLE 2-continued

| Polymer compound | Constitutional unit and molar ratio thereof | | | | |
|---|---|---|---|---|---|
| | formula (X) p' | formula (2) q' | formula (3) r' | formula (Y) s' | other t' |
| (P-205) | 0.1 to 99.8 | 0 | 0.1 to 99.8 | 0.1 to 99.8 | 0 to 30 |
| (P-206) | 0.1 to 99.7 | 0.1 to 99.7 | 0.1 to 99.7 | 0.1 to 99.7 | 0 to 30 |

[in the table, p', q', r', s' and t' represent the molar ratio of each constitutional unit. p'+q'+r'+s'+t'=100, and 70≤p'+q'+r'+s'≤100.]

The examples and the preferable ranges of constitutional units represented by the formula (X), the formula (2), the formula (3) and the formula (Y) in polymer compounds (P-201) to (P-206) are the same as described above.

[Constitutional Unit Represented by the Formula (3)]

The definition and the examples of the constitutional unit represented by the formula (3) contained in the second polymer compound of a hole transporting layer are the same as the definition and the examples of the constitutional unit represented by the formula (3) which may be contained in the first polymer compound of a hole transporting layer.

The amount of the constitutional unit represented by the formula (3) is preferably 0.5 to 50 mol %, more preferably 3 to 30 mol %, further preferably 3 to 20 mol % with respect to the total amount of constitutional units contained in the polymer compound, because the second polymer compound of a hole transporting layer is excellent in stability and the the second polymer compound of a hole transporting layer is excellent in crosslinkability.

The constitutional unit represented by the formula (3) may be contained only singly or two or more kinds of the constitutional units represented by the formula (3) may be contained in the second polymer compound of a hole transporting layer.

[Constitutional Unit Represented by the Formula (2)]

The second polymer compound of a hole transporting layer may further comprise a constitutional unit represented by the formula (2).

The definition and the examples of the constitutional unit represented by the formula (2) which may be contained in the second polymer compound of a hole transporting layer are the same as the definition and the examples of the constitutional unit represented by the formula (2) which may be contained in the first polymer compound of a hole transporting layer.

The amount of the constitutional unit represented by the formula (2) is preferably 0.5 to 50 mol %, more preferably 3 to 30 mol %, further preferably 3 to 20 mol % with respect to the total amount of constitutional units contained in the polymer compound, because the second polymer compound of a hole transporting layer is excellent in stability and crosslinkability.

The constitutional unit represented by the formula (2) may be contained only singly or two or more kinds of the constitutional units represented by the formula (2) may be contained in the second polymer compound of a hole transporting layer.

[Constitutional Unit Represented by the Formula (Y)]

It is preferable that the second polymer compound of a hole transporting layer further comprises a constitutional unit represented by the formula (Y), because the light emitting device is excellent in luminance life.

The definition and the examples of the constitutional unit represented by the formula (Y) which may be contained in the second polymer compound of a hole transporting layer are the same as the definition and the examples of the constitutional unit represented by the formula (Y) which may be contained in a polymer compound as the fluorescent material.

The amount of the constitutional unit represented by the formula (Y) in which $Ar^{Y1}$ is an arylene group is preferably 0.5 to 80 mol %, more preferably 30 to 60 mol % with respect to the total amount of constitutional units contained in the polymer compound, because the light emitting device is excellent in luminance life.

The amount of the constitutional unit represented by the formula (Y) in which $Ar^{Y1}$ is a divalent heterocyclic group or a divalent group in which at least one arylene group and at least one divalent heterocyclic group are bonded directly to each other is preferably 0.5 to 40 mol %, more preferably 3 to 30 mol % with respect to the total amount of constitutional units contained in the polymer compound, because the light emitting device is excellent in charge transportability.

The constitutional unit represented by the formula (Y) may be contained only singly or two or more kinds of the constitutional units represented by the formula (Y) may be contained in the second polymer compound of a hole transporting layer.

The second polymer compound of a hole transporting layer includes, for example, polymer compounds (P-301) to (P-303) shown in Table 2. In this table, "other constitutional unit" denotes a constitutional unit other than constitutional units represented by the formula (3), the formula (2) and the formula (Y).

TABLE 3

| Polymer compound | Constitutional unit and molar ratio thereof | | | |
| --- | --- | --- | --- | --- |
| | formula (3) p" | formula (2) q" | formula (Y) r" | other s" |
| (P-301) | 0.1 to 99.9 | 0.1 to 99.9 | 0 | 0 to 30 |
| (P-302) | 0.1 to 99.9 | 0 | 0.1 to 99.9 | 0 to 30 |
| (P-303) | 0.1 to 99.8 | 0.1 to 99.8 | 0.1 to 99.8 | 0 to 30 |

[in the table, p", q", r" and s" represent the molar ratio of each constitutional unit. p"+q"+r"+s"=100, and 70≤p"+q"+r"≤100.]

The examples and the preferable ranges of constitutional units represented by the formula (3), the formula (2) and the formula (Y) in polymer compounds (P-301) to (P-303) are the same as described above.

[Production Method of First and Second Polymer Compound of Hole Transporting Layer]

The first and second polymer compounds of a hole transporting layer can be produced by the same method as for the production method of a polymer host and a polymer compound as the fluorescent material described above.

[Low Molecular Weight Compound of Hole Transporting Layer]

The low molecular weight compound of a hole transporting layer is preferably a low molecular weight compound having at least one crosslinkable group selected from Group A of crosslinkable group, more preferably a low molecular weight compound having a crosslinkable group represented by the formula (XL-1), (XL-3), (XL-5), (XL-7), (XL-16) or (XL-17), further preferably a low molecular weight compound having a crosslinkable group represented by the formula (XL-1) or the formula (XL-17), because the low molecular weight compound of a hole transporting layer is excellent in crosslinkability.

The low molecular weight compound having at least one crosslinkable group selected from Group A of crosslinkable group is preferably a low molecular weight compound represented by the formula (Z).

[chemical formula 82]

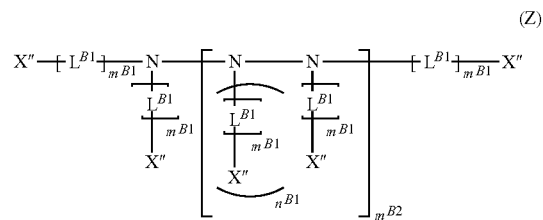

(Z)

$m^{B1}$ is usually an integer of 0 to 10, and it is preferably an integer of 0 to 5, more preferably an integer of 0 to 2, further preferably 0 or 1, particularly preferably 0, because synthesis of the low molecular weight compound of a hole transporting layer is easy.

$m^{B2}$ is usually an integer of 0 to 10, and it is preferably an integer of 1 to 5, more preferably an integer of 1 to 3, further preferably 1 or 2, particularly preferably 1, because synthesis of the low molecular weight compound of a hole transporting layer is easy and the light emitting device is excellent in luminance life.

$n^{B1}$ is usually an integer of 0 to 5, and it is preferably an integer of 0 to 4, more preferably an integer of 0 to 2, further preferably 0, because synthesis of the low molecular weight compound of a hole transporting layer is easy.

The definition and the examples of the arylene group portion obtained by removing $n^{B1}$ substituents of the aromatic hydrocarbon group represented by $Ar^5$ are the same as the definition and the examples of the arylene group represented by $Ar^{X2}$ in the formula (X) described above.

The definition and the examples of the divalent heterocyclic group portion obtained by removing $n^{B1}$ substituents of the heterocyclic group represented by $Ar^5$ are the same as the definition and the examples of the divalent heterocyclic group portion represented by $Ar^{X2}$ in the formula (X) described above.

The definition and the examples of the divalent group obtained by removing $n^{B1}$ substituents of the group represented by $Ar^5$ in which at least one aromatic hydrocarbon ring and at least one heterocyclic ring are bonded directly to each other are the same as the definition and the examples of the divalent group in which at least one arylene group and at least one divalent heterocyclic group are bonded directly to each other represented by $Ar^{X2}$ in the formula (X) described above.

$Ar^5$ is preferably an aromatic hydrocarbon group, because the light emitting device is excellent in luminance life.

The definition and the examples of the alkylene group, the cycloalkylene group, the arylene group and the divalent heterocyclic group represented by $L^{B1}$ are the same as the definition and the examples of the alkylene group, the cycloalkylene group, the arylene group and the divalent heterocyclic group represented by $L^A$ described above, respectively.

$L^{B1}$ is preferably an alkylene group, an arylene group or an oxygen atom, more preferably an alkylene group or an arylene group, further preferably a phenylene group, a fluorenediyl group or an alkylene group, particularly preferably a phenylene group or an alkylene group, and these groups each optionally have a substituent, because synthesis of the low molecular weight compound of a hole transporting layer is easy.

The crosslinkable group represented by X″ is preferably a crosslinkable group represented by the formula (XL-1), (XL-3), (XL-5), (XL-7), (XL-16) or (XL-17), more preferably a crosslinkable group represented by the formula (XL-1) or the formula (XL-17), because the low molecular weight compound of a hole transporting layer is excellent in crosslinkability.

The low molecular weight compound of a hole transporting layer includes, for example, low molecular weight compounds represented by the formulae (Z-1) to (Z-16), preferably a low molecular weight compound represented by the formulae (Z-1) to (Z-10), more preferably a low molecular weight compound represented by the formulae (Z-5) to (Z-9).

[chemical formula 83]

[chemical formula 84]

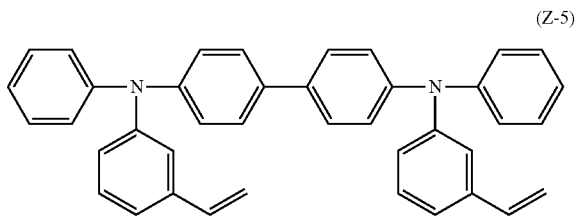

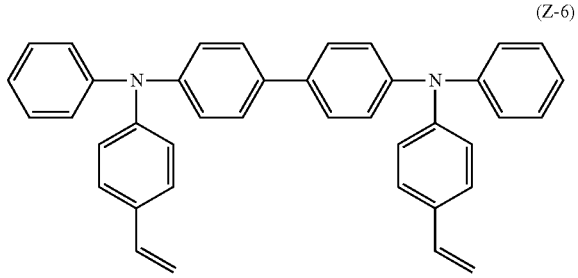

[chemical formula 85]

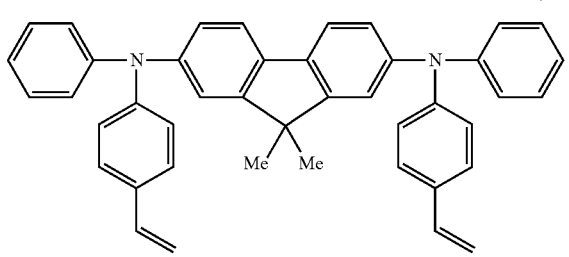

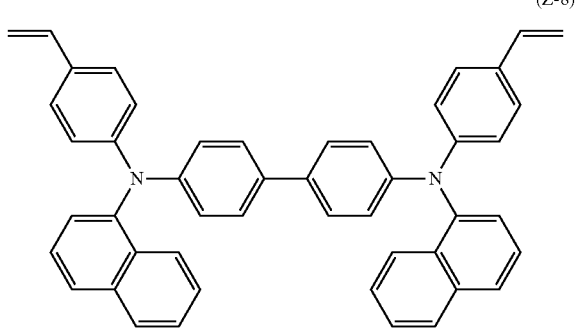

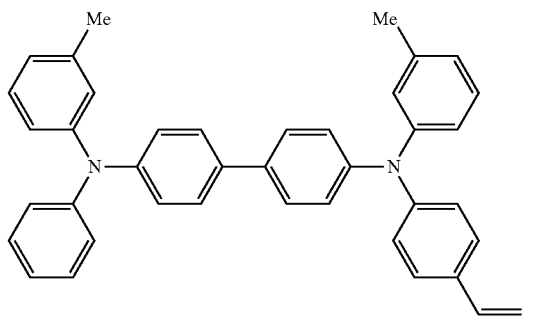

(Z-10)

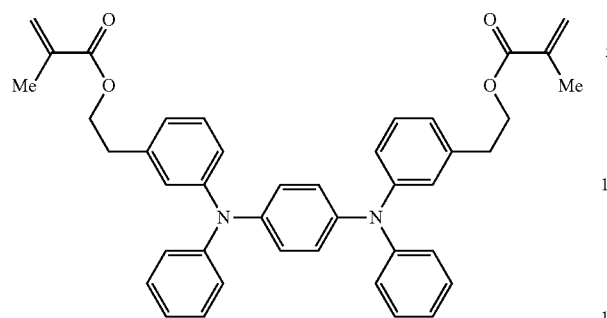

[chemical formula 86]

(Z-11)

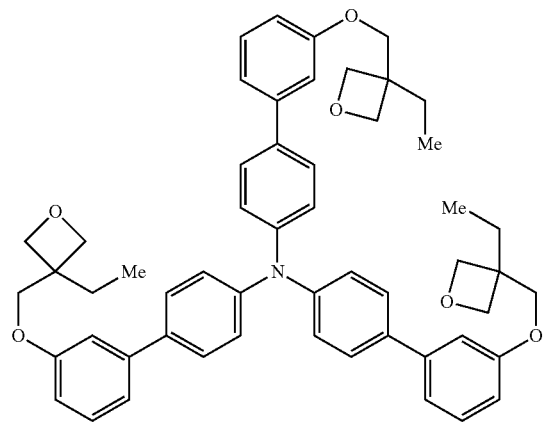

(Z-12)

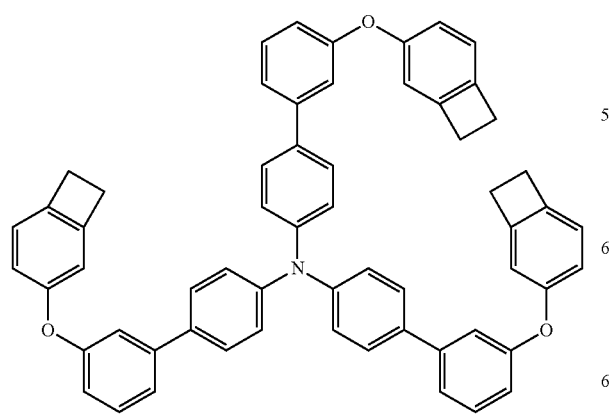

(Z-13)

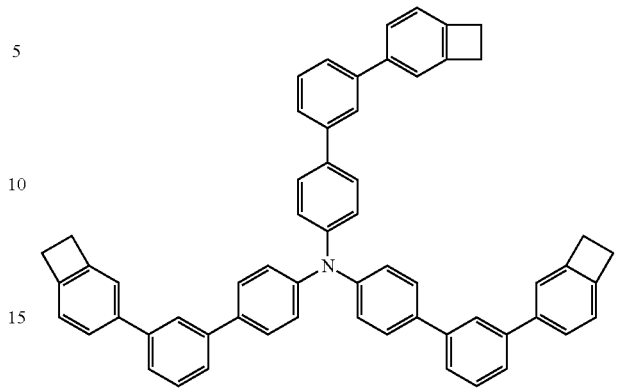

[chemical formula 87]

(Z-14)

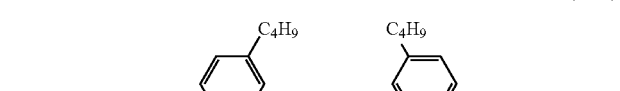

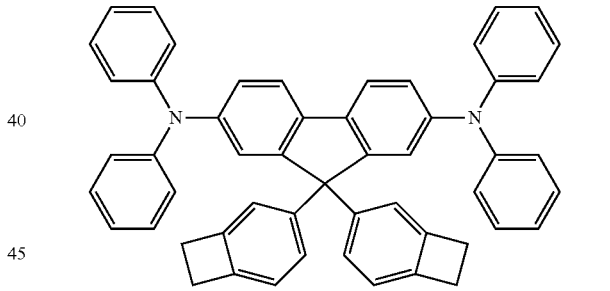

(Z-15)

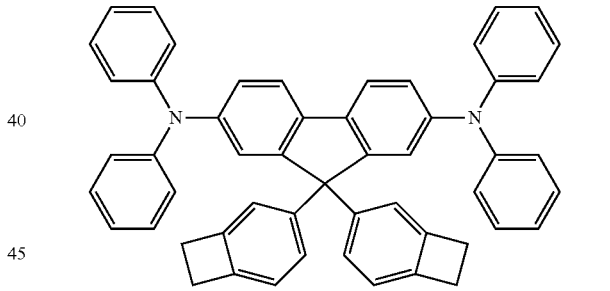

(Z-16)

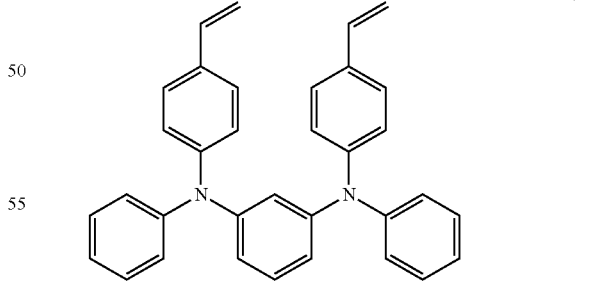

The low molecular weight compound of a hole transporting layer is available from Aldrich, Luminescence Technology Corp., American Dye Source and the like.

Further, the low molecular weight compound of a hole transporting layer can be synthesized according to a method described, for example, in International Publication WO1997/033193, International Publication WO2005/

035221 and International Publication WO02005/049548, as the obtaining method other than the above-described methods.

[Composition of Hole Transporting Layer]

The hole transporting layer may also be a layer comprising a composition comprising a cross-linked body of a crosslinkable material, and at least one material selected from the group consisting of a hole transporting material, a hole injection material, an electron transporting material, an electron injection material, a light emitting material and an antioxidant (hereinafter, referred to also as "composition of hole transporting layer").

The examples and the preferable ranges of the hole transporting material, the electron transporting material, the hole injection material, the electron injection material and the light emitting material contained in the composition of a hole transporting layer are the same as the examples and the preferable ranges of the hole transporting material, the electron transporting material, the hole injection material, the electron injection material and the light emitting material contained in the composition of a light emitting layer. In the composition of a hole transporting layer, the blending amount of the hole transporting material, the electron transporting material, the hole injection material, the electron injection material and the light emitting material is each usually 1 to 400 parts by weight, preferably 5 to 150 parts by weight when the amount of a cross-linked body of a crosslinkable material is 100 parts by weight.

The examples and the preferable ranges of the antioxidant contained in the composition of a hole transporting layer are the same as the examples and the preferable range of the antioxidant contained in the composition of a light emitting layer. In the composition of hole transporting layer, the blending amount of the antioxidant is usually 0.001 to 10 parts by weight when the amount of a cross-linked body of a crosslinkable material is 100 parts by weight.

[Ink of Hole Transporting Layer]

The composition of a hole transporting layer comprising a crosslinkable material and a solvent (hereinafter, referred to also as "ink of hole transporting layer") can be suitably used in application methods such as a spin coat method, a casting method, a micro gravure coat method, a gravure coat method, a bar coat method, a roll coat method, a wire bar coat method, a dip coat method, a spray coat method, a screen printing method, a flexo printing method, an offset printing method, an inkjet printing method, a capillary coat method and a nozzle coat method, like the ink of a light emitting layer.

The preferable range of the viscosity of the ink of a hole transporting layer is the same as the preferable range of the viscosity of the ink of a light emitting layer.

The examples and the preferable ranges of of the solvent contained in the ink of a hole transporting layer is the same as the examples and the preferable ranges of the solvent contained in the ink of a light emitting layer.

In the ink of a hole transporting layer, the blending amount of the solvent is usually 1000 to 100000 parts by weight, preferably 2000 to 20000 parts by weight when the amount of a crosslinkable material is 100 parts by weight.

<Layer Constitution of Light Emitting Device>

The light emitting device may comprise a layer other than an anode, a cathode, a light emitting layer and a hole transporting layer (hereinafter, referred to also as "other layer"). The other layer includes, for example, a hole injection layer, an electron transporting layer and an electron injection layer. The hole injection layer, the electron transporting layer and the electron injection layer comprise a hole injection material, an electron transporting material and an electron injection material, respectively, and can be formed by using the hole injection material, the electron transporting material and the electron injection material, respectively.

The order, the number and the thickness of layers to be laminated are controlled in view of external quantum efficiency and luminance life.

The thickness of the light emitting layer, the hole transporting layer, the hole injection layer, the electron transporting layer and the electron injection layer is each usually 1 nm to 10 µm.

It is preferable that the light emitting device comprises a hole injection layer between an anode and a hole transporting layer from the standpoint of hole injectability, and it is preferable that the light emitting device comprises at least one of an electron injection layer and an electron transporting layer between a cathode and a light emitting layer from the standpoint of electron injectability and electron transportability.

The method of forming a light emitting layer, a hole transporting layer, a hole injection layer, an electron transporting layer and an electron injection layer in a light emitting device includes, for example, a vacuum vapor deposition method from power and a method by film formation from solution or melted state when a low molecular weight compound is used. The method of forming a light emitting layer, a hole transporting layer, a hole injection layer, an electron transporting layer and an electron injection layer includes, for example, a method by film formation from solution or melted state when a polymer compound is used.

The hole injection layer, the electron transporting layer and the electron injection layer can be fabricated by, for example, a spin coat method, a casting method, a micro gravure coat method, a gravure coat method, a bar coat method, a roll coat method, a wire bar coat method, a dip coat method, a spray coat method, a screen printing method, a flexo printing method, an offset printing method, an inkjet printing method, a capillary coat method or a nozzle coat method, using inks comprising a hole injection material, an electron transporting material and an electron injection material, respectively.

The preferable range of the viscosity of the ink is the same as the preferable range of the viscosity of the ink of a light emitting layer.

The examples and the preferable ranges of the solvent contained in the ink are the same as the examples and the preferable ranges of the solvent contained in the ink of a light emitting layer.

In the ink, the blending amount of the solvent is usually 1000 to 100000 parts by weight, preferably 2000 to 20000 parts by weight with respect to 100 parts by weight of the hole injection material, the electron transporting material or the electron injection material.

It is preferable for the material of the hole transporting layer, the material of the electron transporting layer and the material of the light emitting layer to have a crosslinkable group for avoiding dissolution of the material in a solvent when the material is soluble in the solvent used in forming layers adjacent to a hole transporting layer, an electron transporting layer and a light emitting layer, respectively, in fabrication of a light emitting device. After forming each layer using the material having a crosslinkable group, the layer can be insolubilized by crosslinking the crosslinkable group.

The heating temperature for crosslinking each layer is usually 25 to 300° C., and it is preferably 50 to 250° C., more preferably 150 to 200° C., because the light emitting device is excellent in luminance life.

The light used in irradiation for crosslinking each layer is, for example, ultraviolet light, near-ultraviolet light and visible light.

[Substrate/Electrode]

The substrate in the light emitting device may advantageously be a substrate on which an electrode can be formed and which does not chemically change in forming an organic layer, and is a substrate made of a material such as, for example, glass, plastic and silicon. In the case of using an opaque substrate, it is preferable that an electrode most remote from the substrate is transparent or semi-transparent.

The material of the anode includes, for example, electrically conductive metal oxides and semi-transparent metals, preferably, indium oxide, zinc oxide and tin oxide; electrically conductive compounds such as indium•tin•oxide (ITO) and indium•zinc•oxide; a composite of silver, palladium and copper (APC); NESA, gold, platinum, silver and copper.

The material of the cathode includes, for example, metals such as lithium, sodium, potassium, rubidium, cesium, beryllium, magnesium, calcium, strontium, barium, aluminum, zinc and indium; alloys composed of two or more of them; alloys composed of one or more of them and at least one of silver, copper, manganese, titanium, cobalt, nickel, tungsten and tin; and graphite and graphite intercalation compounds. The alloy includes, for example, a magnesium-silver alloy, a magnesium-indium alloy, a magnesium-aluminum alloy, an indium-silver alloy, a lithium-aluminum alloy, a lithium-magnesium alloy, a lithium-indium alloy and a calcium-aluminum alloy.

The anode and the cathode each may be a laminated structure composed of two or more layers.

[Use]

For obtaining planar light emission by using a light emitting device, a planar anode and a planar cathode are disposed so as to overlap with each other. Patterned light emission can be produced by a method of placing a mask with a patterned window on the surface of a planer light emitting device, a method of forming an extremely thick layer intended to be a non-light emitting, thereby having the layer essentially no-light emitting or a method of forming an anode, a cathode or both electrodes in a patterned shape. By forming a pattern with any of these methods and disposing certain electrodes so as to switch ON/OFF independently, a segment type display capable of displaying numbers and letters and the like is provided. For producing a dot matrix display, both an anode and a cathode are formed in a stripe shape and disposed so as to cross with each other. Partial color display and multi-color display are made possible by a method of printing separately certain polymer compounds showing different emission or a method of using a color filter or a fluorescence conversion filter. The dot matrix display can be passively driven, or actively driven combined with TFT and the like. These displays can be used in computers, television sets, portable terminals and the like. The planar light emitting device can be suitably used as a planer light source for backlight of a liquid crystal display or as a planar light source for illumination. If a flexible substrate is used, it can be used also as a curved light source and a curved display.

<Light Emitting Apparatus>

The light emitting apparatus of the present invention is a light emitting apparatus equipped with a light emitting device comprising an anode, a cathode, a light emitting layer disposed between the anode and the cathode and a hole transporting layer disposed between the anode and the light emitting layer and comprising a crosslinked body of a crosslinkable material, and a driving apparatus which drives the light emitting device by pulse voltage in which a first voltage not lower than the light emission start voltage of the light emitting device and a second voltage lower than the light emission start voltage of the light emitting device are alternately switched.

The driving apparatus which drives the light emitting device by pulse voltage in which a first voltage not lower than the light emission start voltage of the light emitting device and a second voltage lower than the light emission start voltage of the light emitting device are alternately switched includes, for example, an organic EL driver MIC4826 manufactured by Micrel Inc. and LGDP4216 manufactured by Crystalfontz.

The light emitting apparatus of the present invention includes, for example, segment type displays, display parts of dot matrix displays, planar light sources for backlight of liquid crystal displays and planar light sources for illumination.

EXAMPLES

The present invention will be illustrated further in detail by examples below, but the present invention is not limited to these examples In examples, the polystyrene-equivalent number-average molecular weight (Mn) and the polystyrene-equivalent weight-average molecular weight (Mw) of a polymer compound were determined by any of the following size exclusion chromatographies (SEC) using tetrahydrofuran as the mobile phase. Each measurement conditions for SEC are as described below.

<Measurement Condition 1>

A polymer compound to be measured was dissolved at a concentration of about 0.05 wt % in tetrahydrofuran, and 10 L of the solution was injected into SEC. A mobile phase was allowed to flow at a flow rate of 2.0 mL/min. As the column, PLgel MIXED-B (manufactured by Polymer Laboratories Ltd.) was used. As the detector, a UV-VIS detector (manufactured by Shimadzu Corp., trade name: SPD-10Avp) was used.

<Measurement Condition 2>

A polymer compound to be measured was dissolved at a concentration of about 0.05 wt % in tetrahydrofuran, and 10 μL of the solution was injected into SEC. A mobile phase was allowed to flow at a flow rate of 1.0 mL/min. As the column, PLgel MIXED-B (manufactured by Polymer Laboratories Ltd.) was used. As the detector, a UV-VIS detector (manufactured by Tosoh Corp., trade name: UV-8320GPC) was used.

<Measurement Condition 3>

A polymer compound to be measured was dissolved at a concentration of about 0.05 wt % in tetrahydrofuran, and 10 μL of the solution was injected into SEC. A mobile phase was allowed to flow at a flow rate of 0.6 mL/min. As the column, each one of TSK guard column Super AW-H, TSKgel Super AWM-H and TSKgel Super AW3000 (all of them are manufactured by Tosoh Corp.) were connected serially and used. As the detector, a UV-VIS detector (manufactured by Tosoh Corp., trade name: UV-8320GPC) was used.

Measurement of NMR was carried out according to the following method.

5 to 10 mg of a measurement sample was dissolved in about 0.5 mL of deuterated chloroform (CDCl), deuterated tetrahydrofuran, deuterated dimethyl sulfoxide, deuterated acetone, deuterated dimethylformamide, deuterated toluene, deuterated methanol, deuterated ethanol, deuterated 2-propanol or deuterated methylene chloride, and measurement was performed using an NMR apparatus (manufactured by Agilent, trade name: INOVA 300 or MERCURY 400VX).

As the index of the purity of a compound, a value of the high performance liquid chromatography (HPLC) area percentage was used. This value is a value in high performance liquid chromatography (HPLC, manufactured by Shimadzu Corp., trade name: LC-20A) at 254 nm, unless otherwise state. In this operation, the compound to be measured was dissolved in tetrahydrofuran or chloroform so as to give a concentration of 0.01 to 0.2 wt %, and depending on the concentration, 1 to 10 µL of the solution was injected into HPLC. As the mobile phase of HPLC, acetonitrile and tetrahydrofuran were used within acetonitrile/tetrahydrofuran=100/0 to 0/100 (volume ratio) and allowed to flow at a flow rate of 1 mL/min. As the column, Kaseisorb LC ODS 2000 (manufactured by Tokyo Chemical Industry Co., Ltd.) or an ODS column having an equivalent performance was used. As the detector, a photo diode array detector (manufactured by Shimadzu Corp., trade name: SPD-M20A) was used.

In examples, pulse voltage driving of a light emitting device was conducted using the following pulse voltage driving condition 1. In pulse voltage driving of a light emitting device, the time until luminance of the light emitting device reached 95% or 60% of the the initial luminance was the cumulative time to which the first voltage in pulse voltage driving was applied.

<Pulse Voltage Driving Condition 1>

The first voltage was set to voltage at which current value so set that the initial luminance of a light emitting device is adjusted to prescribed luminance is imparted at constant current. The second voltage was set to −10 V. The pulse voltage was set to square wave in which a first voltage and a second voltage are alternately switched. The frequency of pulse voltage was set to 1 Hz. The pulse width: T1 of the first voltage and the pulse width: T2 of the second voltage were set so that T1/(T1+T2)=0.9.

Synthesis Example 1: Synthesis of Iridium Complexes M1 to M2 and Monomers CM1 to CM13 and CM15 to CM17

An iridium complex M1 was synthesized according to a method described in International Publication WO2009/131255.

An iridium complex M2 was synthesized according to a method described in JP-A No. 2011-105701.

A monomer CM1 was synthesized according to a method described in JP-A No. 2011-174062.

A monomer CM2 was synthesized according to a method described in International Publication WO2005/049546.

As a monomer CM3, a commercially available product was used.

A monomer CM4 was synthesized according to a method described in JP-A No. 2008-106241.

A monomer CM5 was synthesized according to a method described in JP-A No. 2011-174062.

A monomer CM6 was synthesized according to a method described in JP-A No. 2012-144722.

A monomer CM7 was synthesized according to a method described in JP-A No. 2004-143419.

A monomer CM8 was synthesized according to a method described in JP-A No. 2010-031259.

As a monomer CM9, a commercially available product was used.

A monomer CM10 was synthesized according to a method described in JP-A No. 2010-189630.

A monomer CM11 was synthesized according to a method described in International Publication WO2012/86671.

A monomer CM12 was synthesized according to a method described in JP-A No. 2010-189630.

A monomer CM13 was synthesized according to a method described in International Publication WO2009/131255.

A monomer CM15 was synthesized according to a method described in International Publication WO2000/46321.

A monomer CM16 was synthesized according to a method described in International Publication WO2000/46321.

A monomer CM17 was synthesized according to a method described in JP-A No. 2007-511636.

[chemical formula 88]

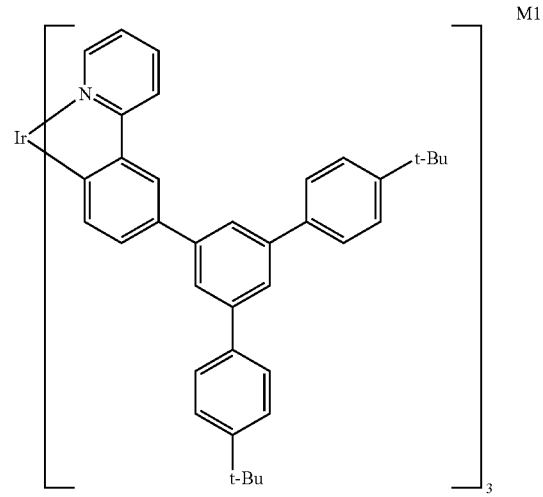

M1

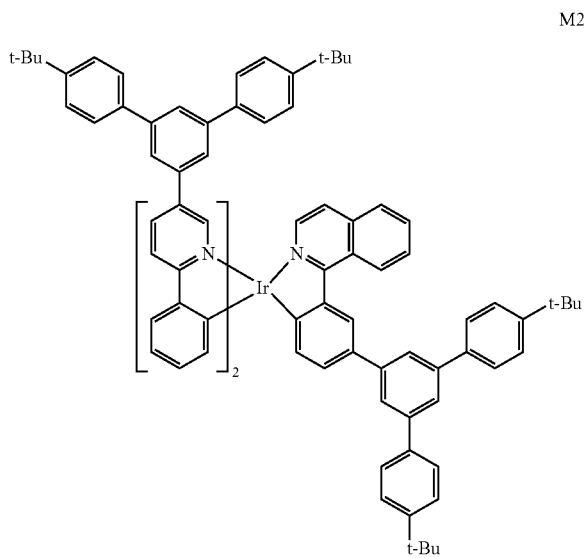

M2

-continued
[chemical formula 89]
CM1
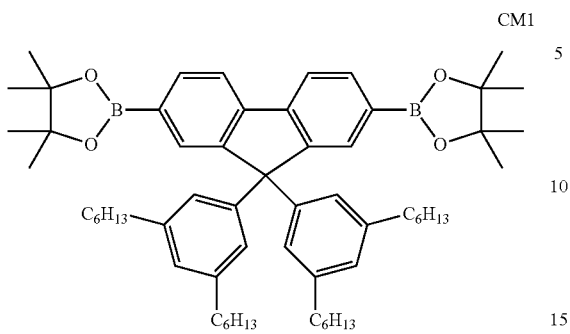
CM2
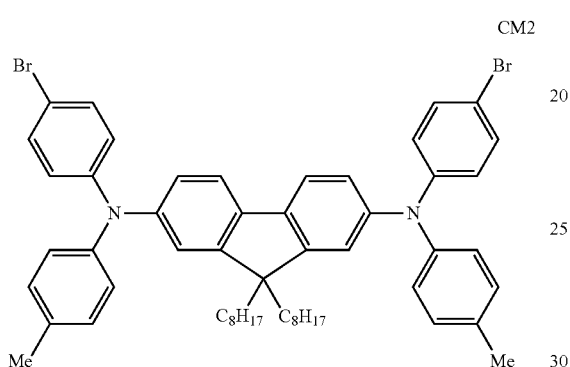
CM3
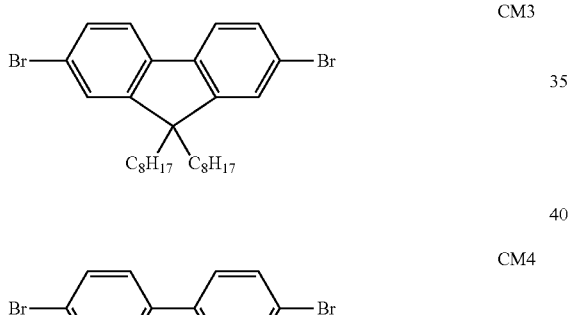
CM4
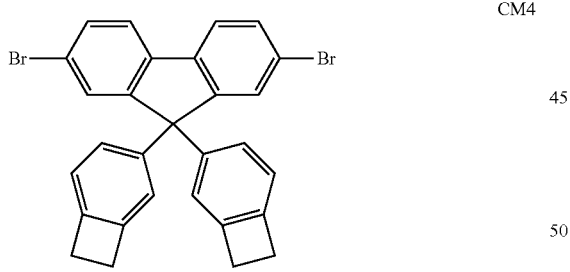
CM5
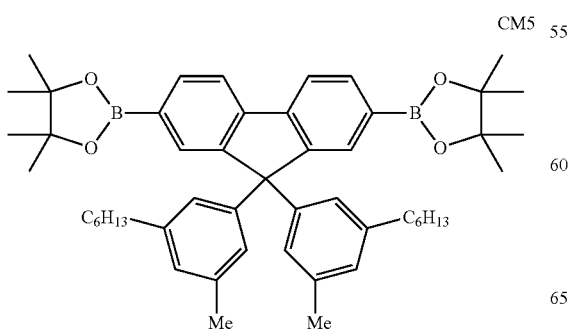
-continued
CM6
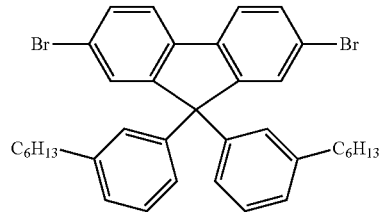
[chemical formula 90]
CM7
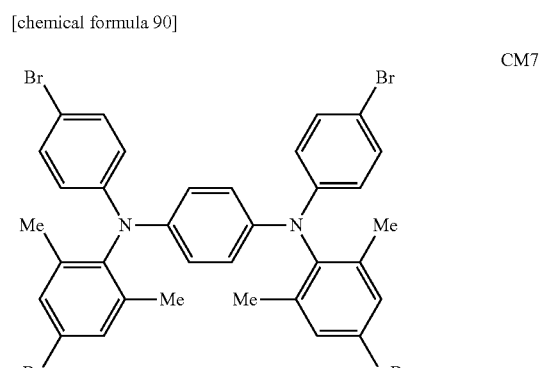
CM8
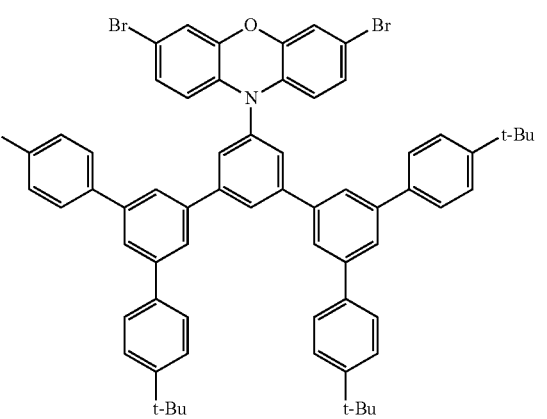
CM9
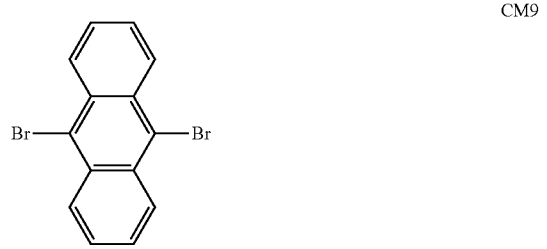
CM10
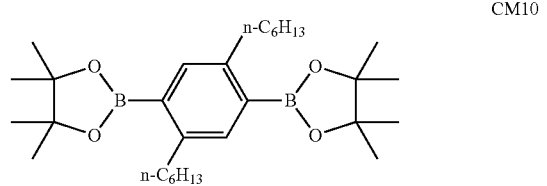

CM11 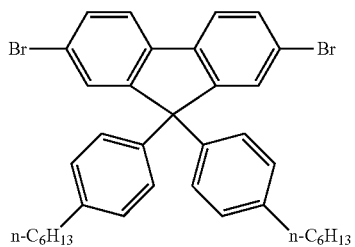
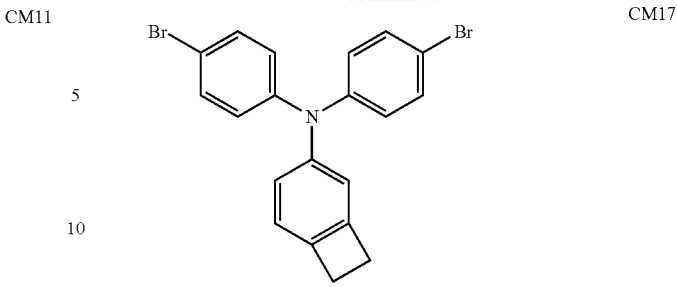 CM17
CM12 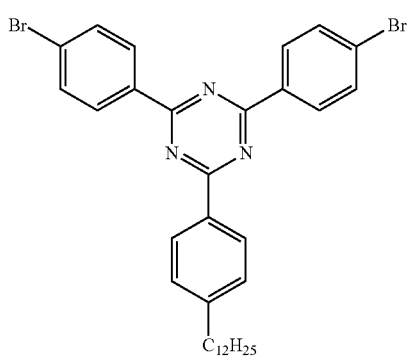
Synthesis Example 2: Synthesis of Monomer CM14
[chemical formula 91]
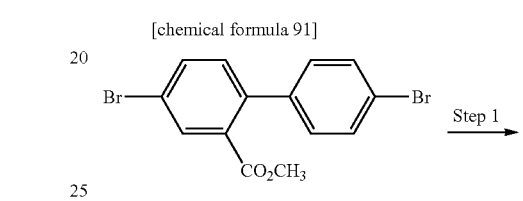
CM13
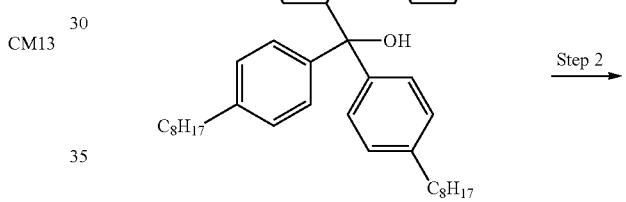
CM15
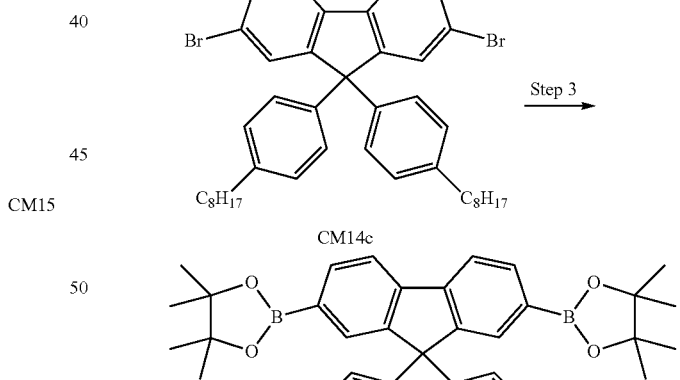
CM16
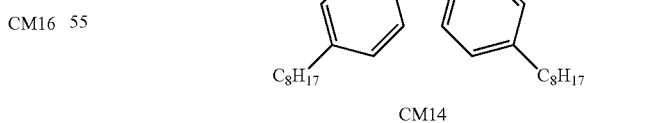
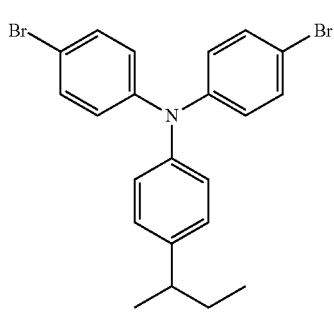
A compound CM14a was synthesized according to a method described in International Publication WO2012/086671.
<Step 1>
A nitrogen gas atmosphere was prepared in a reaction vessel, then, 4-bromo-n-octylbenzene (250 g) and tetrahydrofuran (dehydrated product, 2.5 L) were added, and the mixture was cooled to −70° C. or lower. Thereafter, into this was dropped a 2.5 mol/L n-butyllithium hexane solution (355 mL), and the mixture was stirred at −70° C. or lower for 3 hours. Thereafter, a solution prepared by dissolving the compound CM14a (148 g) in tetrahydrofuran (dehydrated product, 400 mL) was dropped into this, then, the mixture was heated up to room temperature, and stirred at room temperature overnight. The resultant reaction mixture was cooled to 0° C., then, water (150 mL) was added and the mixture was stirred. The resultant reaction mixture was concentrated under reduced pressure, to remove the organic solvent. To the resultant reaction mixture were added hexane (1 L) and water (200 mL), and the aqueous layer was removed by a liquid-separation operation. The resultant organic layer was washed with saturated saline, then, dried over magnesium sulfate added. The resultant mixture was filtered, and the resultant filtrate was concentrated under reduced pressure, to obtain a compound CM14b (330 g) as a yellow oil.

<Step 2>

A nitrogen gas atmosphere was prepared in a reaction vessel, then, the compound CM14b (330 g) and dichloromethane (900 mL) were added, and the mixture was cooled down to 5° C. or lower. Thereafter, a 2.0 mol/L boron trifluoride diethyl ether complex (245 mL) was dropped into this. Thereafter, the mixture was heated up to room temperature, and stirred at room temperature overnight. The resultant reaction mixture was placed in a vessel containing ice water (2 L), and the mixture was stirred for 30 minutes, then, the aqueous layer was removed. The resultant organic layer was washed with a 10 wt % potassium phosphate aqueous solution (1 L) once and with water (1 L) twice, then, dried over magnesium sulfate. The resultant mixture was filtered, and the resultant filtrate was concentrated under reduced pressure, to obtain an oil. The resultant oil was dissolved in toluene (200 mL), then, the solution was allowed to pass through a filter paved with silica gel, to obtain a toluene solution 1. After obtaining the toluene solution 1, toluene (about 3 L) was further allowed to pass through a filter paved with silica gel, to obtain a toluene solution 2. The toluene solution 1 and the toluene solution 2 were combined, then, the mixture was concentrated under reduced pressure, to obtain an oil. To the resultant oil was added methanol (500 mL), and the mixture was stirred. The resultant reaction mixture was filtrated, to obtain a solid. To the resultant solid was added a mixed solvent of butyl acetate and methanol, and recrystallization thereof was repeated, to obtain a monomer CM14c (151 g) as a white solid. The resultant monomer CM14c showed an HPLC area percentage value (detection wavelength: UV 280 nm) of 99.0% or more.

$^1$H-NMR (400 MHz/CDCl$_3$): δ (ppm)=7.56 (d, 2H), 7.49 (d, 2H), 7.46 (dd, 2H), 7.06 to 7.01 (m, 8H), 2.55 (t, 4H), 1.61 to 1.54 (m, 4H), 1.30 to 1.26 (m, 20H), 0.87 (t, 6H).

<Step 3>

A nitrogen gas atmosphere was prepared in a reaction vessel, then, the monomer CM14c (100 g) and tetrahydrofuran (dehydrated product, 1000 mL) were added, and the mixture was cooled to −70° C. or lower. Thereafter, a 2.5 mol/L n-butyllithium hexane solution (126 mL) was dropped into this, and the mixture was stirred at −70° C. or lower for 5 hours. Thereafter, 2-isopropoxy-4,4,5,5-tetramethyl-1,3,2-dioxaborolane (81 mL) was dropped into this. Thereafter, the mixture was heated up to room temperature, and stirred at room temperature overnight. The resultant reaction mixture was cooled down to −30° C., and a 2.0 mol/L hydrochloric acid diethyl ether solution (143 mL) was dropped. Thereafter, the mixture was heated up to room temperature, and concentrated under reduced pressure, to obtain a solid. To the resultant solid was added toluene (1.2 L), and the mixture was stirred at room temperature for 1 hour, then, allowed to pass through a filter paved with silica gel, to obtain a filtrate. The resultant filtrate was concentrated under reduced pressure, to obtain a solid. To the resultant solid was added methanol and the mixture was stirred, then, filtrated, to obtain a solid. The resultant solid was purified by repeating recrystallization from isopropyl alcohol, then, dried at 50° C. under reduced pressure overnight, to obtain a monomer CM14 (72 g) as a white solid. The resultant monomer CM14 showed an HPLC area percentage value (detection wavelength: UV 280 nm) of 99.0% or more.

$^1$H-NMR (400 MHz/CDCl$_3$): δ (ppm)=7.82 (d, 2H), 7.81 (s, 2H), 7.76 (d, 2H), 7.11 (d, 4H), 7.00 (d, 4H), 2.52 (t, 4H), 1.59 to 1.54 (m, 4H), 1.36 to 1.26 (m, 20H), 1.31 (s, 24H), 0.87 (t, 6H).

Synthesis Example 3: Synthesis of Polymer Compound P1

A polymer compound P1 was synthesized according to a method described in JP-A No. 2012-144722 using monomers shown in the following Table 4. The polymer compound P1 had an Mn of $8.4 \times 10^4$ and an Mw of $3.4 \times 10^5$. The polymer compound P1 is a copolymer constituted of constitutional units derived from respective monomers at a molar ratio shown in the following Table 4, according to the theoretical values calculated from the charged raw materials.

TABLE 4

|  |  | monomer | | | |
| --- | --- | --- | --- | --- | --- |
|  |  | CM1 | CM2 | CM3 | CM4 |
| P1 | molar ratio [mol %] | 50 | 30 | 12.5 | 7.5 |

Synthesis Example 4: Synthesis of Polymer Compound P2

A polymer compound P2 was synthesized according to a method described in JP-A No. 2012-144722 using monomers shown in the following Table 5. The polymer compound P2 had an Mn of $8.4 \times 10^4$ and an Mw of $2.3 \times 10^5$. The polymer compound P2 is a copolymer constituted of constitutional units derived from respective monomers at a molar ratio shown in the following Table 5, according to the theoretical values calculated from the charged raw materials.

TABLE 5

|  |  | monomer | | | | |
| --- | --- | --- | --- | --- | --- | --- |
|  |  | CM5 | CM6 | CM3 | CM7 | CM8 |
| P2 | molar ratio [mol %] | 50 | 32 | 10 | 3 | 5 |

Synthesis Example 5: Synthesis of Polymer Compound P3

A polymer compound P3 was synthesized according to a method described in JP-A No. 2012-144722 using monomers shown in the following Table 6. The polymer compound P3 had an Mn of $1.2 \times 10^5$ and an Mw of $3.1 \times 10^5$. The polymer compound P3 is a copolymer constituted of constitutional units derived from respective monomers at a molar ratio shown in the following Table 6, according to the theoretical values calculated from the charged raw materials.

TABLE 6

| | | monomer | |
|---|---|---|---|
| | | CM1 | CM9 |
| P3 | molar ratio [mol %] | 50 | 50 |

Synthesis Example 6: Synthesis of Polymer Compound P4

A polymer compound P4 was synthesized according to a method described in JP-A No. 2012-36388 using monomers shown in the following Table 7. The polymer compound P4 had an Mn of $9.2 \times 10^4$ and an Mw of $2.3 \times 10^5$. The polymer compound P4 is a copolymer constituted of constitutional units derived from respective monomers at a molar ratio shown in the following Table 7, according to the theoretical values calculated from the charged raw materials.

TABLE 7

| | | monomer | | |
|---|---|---|---|---|
| | | CM10 | CM11 | CM12 |
| P4 | molar ratio [mol %] | 50 | 40 | 10 |

Synthesis Example 7: Synthesis of Polymer Compound P5

An inert gas atmosphere was prepared in a reaction vessel, then, the compound CM14 (4.7686 g), the compound CM11 (0.7734 g), the compound CM3 (1.9744 g), the compound CM13 (0.3308 g), the compound CM7 (0.4432 g) and toluene (67 mL) were added, and the mixture was stirred while heating at 105° C. Thereafter, to this was added bistriphenylphosphinepalladium dichloride (4.2 mg), then, a 20 wt % tetraethylammonium hydroxide aqueous solution (20 mL) was dropped, then, the mixture was stirred for 3 hours under reflux.

Thereafter, to this were added phenylboronic acid (0.077 g), bistriphenylphosphinepalladium dichloride (4.2 mg), toluene (60 mL) and a 20 wt % tetraethylammonium hydroxide aqueous solution (20 mL), and the mixture was stirred for 24 hours under reflux.

The organic layer was separated from the aqueous layer, then, to the resultant organic layer were added sodium N,N-diethyldithiocarbamate trihydrate (3.33 g) and ion exchanged water (67 mL), and the mixture was stirred at 85° C. for 2 hours. The organic layer was separated from the aqueous layer, then, the resultant organic layer was washed with ion exchanged water (78 mL) twice, with a 3 wt % acetic acid aqueous solution (78 mL) twice and with ion exchanged water (78 mL) twice in this order.

The organic layer was separated from the aqueous layer, then, the resultant organic layer was dropped into methanol, to cause precipitation of a solid which was then isolated by filtration, and dried, to obtain a solid. The resultant solid was dissolved in toluene, and the solution was allowed to pass through a silica gel column and an alumina column through which toluene had passed previously. The resultant solution was dropped into methanol, to cause precipitation of a solid which was then isolated by filtration, and dried, to obtain a polymer compound P5 (4.95 g). The polymer compound P5 had an Mn of $1.4 \times 10^5$ and an Mw of $4.1 \times 10^5$.

The polymer compound P5 is a copolymer constituted of constitutional units derived from respective monomers at a molar ratio shown in the following Table 8, according to the theoretical values calculated from the charged raw materials.

TABLE 8

| | | monomer | | | | |
|---|---|---|---|---|---|---|
| | | CM14 | CM11 | CM13 | CM3 | CM7 |
| P5 | molar ratio [mol %] | 50 | 10 | 5 | 30 | 5 |

Synthesis Example 8: Synthesis of Polymer Compound P6

A polymer compound P6 was synthesized according to a method described in Japanese Patent No. 5516317 using monomers shown in the following Table 8. The polymer compound P6 had an Mn of $6.0 \times 10^4$ and an Mw of $4.0 \times 10^5$. The polymer compound P6 is a copolymer constituted of constitutional units derived from respective monomers at a molar ratio shown in the following Table 8, according to the theoretical values calculated from the charged raw materials.

TABLE 9

| | | monomer | | |
|---|---|---|---|---|
| | | CM15 | CM16 | CM17 |
| P6 | molar ratio [mol %] | 50 | 42.5 | 7.5 |

Device Fabrication Example 1: Fabrication of Light Emitting Device 1 and Evaluation of Light Emitting Property (Formation of Anode and Hole Injection Layer)

An ITO film was attached with a thickness of 45 nm to a glass substrate by a sputtering method, to form an anode. On the anode, a polythiophene-sulfonic acid type hole injection agent AQ-1200 (manufactured by Plectronics) was spin-coated, to form a film with a thickness of 35 nm, and the film was heated on a hot plate at 170° C. under an air atmosphere for 15 minutes, to form a hole injection layer.

(Formation of Hole Transporting Layer)

The polymer compound P1 was dissolved at a concentration of 0.7 wt % in xylene. The resultant xylene solution was spin-coated to form a film with a thickness of 20 nm on the hole injection layer, and the film was heated on a hot plate at 180° C. under a nitrogen gas atmosphere for 60 minutes, to form a hole transporting layer.

(Formation of Light Emitting Layer)

The polymer compound P2 and the polymer compound P3 were dissolved at a concentration of 1.2 wt % in xylene (polymer compound P2/polymer compound P3=80 wt %/20 wt %). The resultant xylene solution was spin-coated to form a film with a thickness of 60 nm on the hole transporting layer, and the film was heated on a hot plate at 150° C. under a nitrogen gas atmosphere for 10 minutes, to form a light emitting layer.

(Formation of Cathode)

The substrate carrying thereon the light emitting layer formed was placed in a vapor deposition machine, and the internal pressure thereof was reduced to $1\times10^{-4}$ Pa or lower, then, as a cathode, sodium fluoride was vapor-deposited with a thickness of about 7 nm on the light emitting layer, then, aluminum was vapor-deposited with a thickness of about 120 nm on the sodium fluoride layer. After vapor deposition, sealing with a glass substrate was performed, to fabricate a light emitting layer 1.

(Evaluation of Light Emitting Property of Light Emitting Device)

Voltage was applied to the light emitting device 1, to observe EL emission having the maximum peak wavelength of emission spectrum at 460 nm. The light emitting device 1 had a light emission start voltage of 2.8 V and a light emission efficiency at 1000 cd/m² of 10.4 cd/A.

Comparative Example 1: Direct-Current Voltage Driving of Light Emitting Device 1

The current value was set so that the initial luminance of the light emitting device 1 was 1000 cd/m², then, the device was driven at constant current and the time change of luminance was measured. As a result, the time until luminance reached 95% of the initial luminance (hereinafter, referred to also as "LT95") was 3.3 hours.

Example 1: Pulse Voltage Driving of Light Emitting Device 1

The current value was set so that the initial luminance of the light emitting device 1 was 1000 cd/m², then, the device was driven under the above-described pulse voltage driving condition 1 and the time change of luminance was measured. As a result, LT95 was 5.5 hours. LT95 in Example 1 was 1.67-fold with respect to LT95 in Comparative Example 1.

Device Fabrication Example 2: Fabrication of Light Emitting Device 2 and Evaluation of Light Emitting Property (Formation of Anode and Hole Injection Layer)

An ITO film was attached with a thickness of 45 nm to a glass substrate by a sputtering method, to form an anode. On the anode, a polythiophene-sulfonic acid type hole injection agent AQ-1200 (manufactured by Plectronics) was spin-coated, to form a film with a thickness of 65 nm, and the film was heated on a hot plate at 170° C. under an air atmosphere for 15 minutes, to form a hole injection layer.

(Formation of Hole Transporting Layer)

The polymer compound P1 was dissolved at a concentration of 0.7 wt % in xylene. The resultant xylene solution was spin-coated to form a film with a thickness of 20 nm on the hole injection layer, and the film was heated on a hot plate at 180° C. under a nitrogen gas atmosphere for 60 minutes, to form a hole transporting layer.

(Formation of Light Emitting Layer)

The polymer compound P4 and the iridium complex M1 were dissolved at a concentration of 1.8 wt % in xylene (polymer compound P4/iridium complex M1=80 wt %/20 wt %). The resultant xylene solution was spin-coated to form a film with a thickness of 80 nm on the hole transporting layer, and the film was heated on a hot plate at 150° C. under a nitrogen gas atmosphere for 10 minutes, to form a light emitting layer.

(Formation of Cathode)

The substrate carrying thereon the light emitting layer formed was placed in a vapor deposition machine, and the internal pressure thereof was reduced to $1\times10^{-4}$ Pa or lower, then, as a cathode, sodium fluoride was vapor-deposited with a thickness of about 7 nm on the light emitting layer, then, aluminum was vapor-deposited with a thickness of about 120 nm on the sodium fluoride layer. After vapor deposition, sealing with a glass substrate was performed, to fabricate a light emitting layer 2.

(Evaluation of Light Emitting Property of Light Emitting Device)

Voltage was applied to the light emitting device 2, to observe EL emission having the maximum peak wavelength of emission spectrum at 520 nm. The light emitting device 2 had a light emission start voltage of 3.1 V and a light emission efficiency at 1000 cd/m² of 43.5 cd/A.

Comparative Example 2: Direct-Current Voltage Driving of Light Emitting Device 2

The current value was set so that the initial luminance of the light emitting device 2 was 3000 cd/m², then, the device was driven at constant current and the time change of luminance was measured. As a result, LT95 was 14.3 hours.

Example 2: Pulse Voltage Driving of Light Emitting Device 2

The current value was set so that the initial luminance of the light emitting device 2 was 3000 cd/m², then, the device was driven under the above-described pulse voltage driving condition 1 and the time change of luminance was measured. As a result, LT95 was 20.3 hours. LT95 in Example 2 was 1.41-fold with respect to LT95 in Comparative Example 2.

Device Fabrication Example 3: Fabrication of Light Emitting Device 3 and Evaluation of Light Emitting Property A light emitting device 3 was fabricated in the same manner as in Device Fabrication Example 2 except that a xylene solution (1.8 wt %) of the polymer compound P4 and the iridium complex M1 (polymer compound P4/iridium complex M1=70 wt %/30 wt %) was used instead of the xylene solution (1.8 wt %) of the polymer compound P4 and the iridium complex M1 (polymer compound P4/iridium complex M1=80 wt %/20 wt %) in Device Fabrication Example 2.

Voltage was applied to the light emitting device 3, to observe EL emission having the maximum peak wavelength of emission spectrum at 520 nm. The light emitting device 3 had a light emission start voltage of 2.9 V and a light emission efficiency at 1000 cd/m² of 55.3 cd/A.

Comparative Example 3: Direct-Current Voltage Driving of Light Emitting Device 3

The current value was set so that the initial luminance of the light emitting device 3 was 3000 cd/m², then, the device was driven at constant current and the time change of luminance was measured. As a result, LT95 was 5.8 hours.

Example 3: Pulse Voltage Driving of Light Emitting Device 3

The current value was set so that the initial luminance of the light emitting device 3 was 3000 cd/m², then, the device was driven under the above-described pulse voltage driving condition 1 and the time change of luminance was measured. As a result, LT95 was 19.4 hours. LT95 in Example 3 was 3.34-fold with respect to LT95 in Comparative Example 3.

Device Fabrication Example 4: Fabrication of Light Emitting Device 4 and Evaluation of Light Emitting Property A light emitting device 4 was fabricated in the same manner as in Device Fabrication Example 2 except that a xylene solution (1.8 wt %) of the polymer compound P5 and the iridium complex M2 (polymer compound P5/iridium complex M2=92.5 wt %/7.5 wt %) was used instead of the xylene solution (1.8 wt %) of the polymer compound P4 and the iridium complex M1 (polymer compound P4/iridium complex M1=80 wt %/20 wt %) in Device Fabrication Example 2.

Voltage was applied to the light emitting device 4, to observe EL emission having the maximum peak wavelength of emission spectrum at 615 nm. The light emitting device 4 had a light emission start voltage of 2.7 V and a light emission efficiency at 1000 cd/m$^2$ of 18.2 cd/A.

Comparative Example 4: Direct-Current Voltage Driving of Light Emitting Device 4

The current value was set so that the initial luminance of the light emitting device 4 was 3000 cd/m$^2$, then, the device was driven at constant current and the time change of luminance was measured. As a result, LT95 was 22.3 hours.

Example 4: Pulse Voltage Driving of Light Emitting Device 4

The current value was set so that the initial luminance of the light emitting device 4 was 3000 cd/m$^2$, then, the device was driven under the above-described pulse voltage driving condition 1 and the time change of luminance was measured. As a result, LT95 was 31.1 hours. LT95 in Example 4 was 1.39-fold with respect to LT95 in Comparative Example 4.

Device Fabrication Example 5: Fabrication of Light Emitting Device 5 and Evaluation of Light Emitting Property A light emitting device 5 was fabricated in the same manner as in Device Fabrication Example 2 except that a xylene solution (1.8 wt %) of the polymer compound P5 and the iridium complex M2 (polymer compound P5/iridium complex M2=85 wt %/15 wt %) was used instead of the xylene solution (1.8 wt %) of the polymer compound P4 and the iridium complex M1 (polymer compound P4/iridium complex M1=80 wt %/20 wt %) in Device Fabrication Example 2.

Voltage was applied to the light emitting device 5, to observe EL emission having the maximum peak wavelength of emission spectrum at 615 nm. The light emitting device 5 had a light emission start voltage of 2.6 V and a light emission efficiency at 1000 cd/m$^2$ of 16.6 cd/A.

Comparative Example 5: Direct-Current Voltage Driving of Light Emitting Device 5

The current value was set so that the initial luminance of the light emitting device 5 was 3000 cd/m$^2$, then, the device was driven at constant current and the time change of luminance was measured. As a result, LT95 was 20.3 hours.

Example 5: Pulse Voltage Driving of Light Emitting Device 5

The current value was set so that the initial luminance of the light emitting device 5 was 3000 cd/m$^2$, then, the device was driven under the above-described pulse voltage driving condition 1 and the time change of luminance was measured. As a result, LT95 was 41.5 hours. LT95 in Example 5 was 2.04-fold with respect to LT95 in Comparative Example 5.

Device Fabrication Example 6: Fabrication of Light Emitting Device 6 and Evaluation of Light Emitting Property A light emitting device 6 was fabricated in the same manner as in Device Fabrication Example 2 except that a xylene solution (1.8 wt %) of the polymer compound P5 and the iridium complex M2 (polymer compound P5/iridium complex M2=70 wt %/30 wt %) was used instead of the xylene solution (1.8 wt %) of the polymer compound P4 and the iridium complex M1 (polymer compound P4/iridium complex M1=80 wt %/20 wt %) in Device Fabrication Example 2.

Voltage was applied to the light emitting device 6, to observe EL emission having the maximum peak wavelength of emission spectrum at 615 nm. The light emitting device 6 had a light emission start voltage of 2.4 V and a light emission efficiency at 1000 cd/m$^2$ of 15.6 cd/A.

Comparative Example 6: Direct-Current Voltage Driving of Light Emitting Device 6

The current value was set so that the initial luminance of the light emitting device 6 was 3000 cd/m$^2$, then, the device was driven at constant current and the time change of luminance was measured. As a result, LT95 was 10.5 hours.

Example 6: Pulse Voltage Driving of Light Emitting Device 6

The current value was set so that the initial luminance of the light emitting device 6 was 3000 cd/m$^2$, then, the device was driven under the above-described pulse voltage driving condition 1 and the time change of luminance was measured. As a result, LT95 was 14.5 hours. LT95 in Example 6 was 1.38-fold with respect to LT95 in Comparative Example 6.

Device Fabrication Example 7: Fabrication of Light Emitting Device 7 and Evaluation of Light Emitting Property (Formation of Anode and Hole Injection Layer)
An ITO film was attached with a thickness of 45 nm to a glass substrate by a sputtering method, to form an anode. On the anode, a polythiophene-sulfonic acid type hole injection agent AQ-1200 (manufactured by Plectronics) was spin-coated, to form a film with a thickness of 35 nm, and the film was heated on a hot plate at 170° C. under an air atmosphere for 15 minutes, to form a hole injection layer.
(Formation of Light Emitting Layer)
The polymer compound P2 and the polymer compound P3 were dissolved at a concentration of 1.2 wt % in xylene (polymer compound P2/polymer compound P3=90 wt %/10 wt %). The resultant xylene solution was spin-coated for form a film with a thickness of 60 nm on the hole injection layer, and the film was heated on a hot plate at 150° C. under a nitrogen gas atmosphere for 10 minutes, to form light emitting layer.

(Formation of Cathode)

The substrate carrying thereon the light emitting layer formed was placed in a vapor deposition machine, and the internal pressure thereof was reduced to $1\times10^{-4}$ Pa or lower, then, as a cathode, sodium fluoride was vapor-deposited with a thickness of about 7 nm on the light emitting layer, then, aluminum was vapor-deposited with a thickness of about 120 nm on the sodium fluoride layer. After vapor deposition, sealing with a glass substrate was performed, to fabricate a light emitting layer 7.

(Evaluation of Light Emitting Property of Light Emitting Device)

Voltage was applied to the light emitting device 7, to observe EL emission having the maximum peak wavelength of emission spectrum at 460 nm. The light emitting device 7 had a light emission start voltage of 2.8 V and a light emission efficiency at 1000 cd/m² of 1.9 cd/A.

Comparative Example 7-1: Direct-Current Voltage Driving of Light Emitting Device 7

The current value was set so that the initial luminance of the light emitting device 7 was 1000 cd/m², then, the device was driven at constant current and the time change of luminance was measured. As a result, LT95 was 0.1 hour.

Comparative Example 7-2: Pulse Voltage Driving of Light Emitting Device 7

The current value was set so that the initial luminance of the light emitting device 7 was 1000 cd/m², then, the device was driven under the above-described pulse voltage driving condition 1 and the time change of luminance was measured. As a result, LT95 was 0.1 hour. LT95 in Comparative Example 7-2 was 1.00-fold with respect to LT95 in Comparative Example 7-1.

Device Fabrication Example 8: Fabrication of Light Emitting Device 8 and Evaluation of Light Emitting Property (Formation of Anode)

An ITO film was attached with a thickness of 45 nm to a glass substrate by a sputtering method, to form an anode.

(Formation of Hole Transporting Layer)

The substrate carrying thereon the anode formed was placed in a vapor deposition machine, and the internal pressure thereof was reduced to $1\times10^{-5}$ Pa or lower, then, a hole transporting material (manufactured by Luminescence Technology, LT-E115) represented by the following formula (HM-1) was vacuum-vapor-deposited at a vapor-deposition rate of 1.5 Å/sec to form a film with a thickness of 60 nm on the anode, to form a hole transporting layer.

[chemical formula 92]

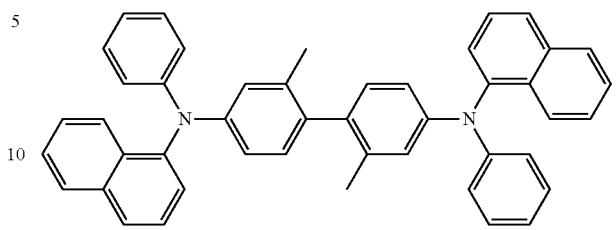

(HM-1)

(Formation of Light Emitting Layer)

The substrate carrying thereon the hole transporting layer formed was placed in a vapor deposition machine, and the internal pressure thereof was reduced to $1\times10^{-5}$ Pa or lower, then, a light emitting material (manufactured by Luminescence Technology, LT-E401) represented by the following formula (EM-1) was vacuum-vapor-deposited at a vapor-deposition rate of 1.5 Å/sec to form a film with a thickness of 40 nm on the hole transporting layer, to form a light emitting layer.

[chemical formula 93]

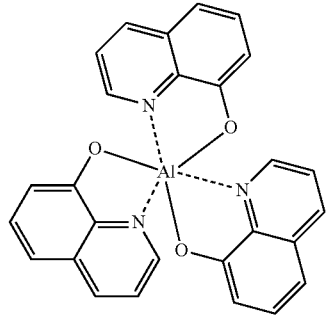

(EM-1)

(Formation of Cathode)

The substrate carrying thereon the light emitting layer formed was placed in a vapor deposition machine, and the internal pressure thereof was reduced to $1\times10^{-4}$ Pa or lower, then, as a cathode, sodium fluoride was vapor-deposited with a thickness of about 0.5 nm on the light emitting layer, then, aluminum was vapor-deposited with a thickness of about 150 nm on the sodium fluoride layer. After vapor deposition, sealing with a glass substrate was performed, to fabricate a light emitting layer 8.

(Evaluation of Light Emitting Property of Light Emitting Device)

Voltage was applied to the light emitting device 8, to observe EL emission having the maximum peak wavelength of emission spectrum at 525 nm. The light emitting device 8 had a light emission start voltage of 2.9 V and a light emission efficiency at 1000 cd/m² of 0.99 cd/A.

Comparative Example 8-1: Pulse Voltage Driving of Light Emitting Device 8

The current value was set so that the initial luminance of the light emitting device 8 was 200 cd/m², then, the device was driven at constant current and the time change of luminance was measured. As a result, the time until luminance reached 60% of the initial luminance (hereinafter, referred to also as "LT60") was 454.9 hours.

Comparative Example 8-2: Pulse Voltage Driving of Light Emitting Device 8

The current value was set so that the initial luminance of the light emitting device 8 was 200 cd/m$^2$, then, the device was driven under the above-described pulse voltage driving condition 1 and the time change of luminance was measured. As a result, LT60 was 493.2 hours. LT60 in Comparative Example 8-2 was 1.08-fold with respect to LT95 in Comparative Example 8-1.

Device Fabrication Example 9: Fabrication of Light Emitting Device 9 and Evaluation of Light Emitting Property (Formation of Anode and Hole Injection Layer)

An ITO film was attached with a thickness of 45 nm to a glass substrate by a sputtering method, to form an anode. On the anode, a polythiophene-sulfonic acid type hole injection agent AQ-1200 (manufactured by Plectronics) was spin-coated, to form a film with a thickness of 65 nm, and the film was heated on a hot plate at 170° C. under an air atmosphere for 15 minutes, to form a hole injection layer.

(Formation of Hole Transporting Layer)

The polymer compound P1 was dissolved at a concentration of 0.7 wt % in xylene. The resultant xylene solution was spin-coated to form a film with a thickness of 20 nm on hole injection layer, and the film was heated on a hot plate at 180° C. under a nitrogen gas atmosphere for 60 minutes, to form a hole transporting layer.

(Formation of Light Emitting Layer)

The substrate carrying thereon the hole transporting layer formed was placed in a vapor deposition machine, and the internal pressure thereof was reduced to 1×10−5 Pa or lower, then, a light emitting material represented by the above-described formula (EM-1) was vacuum-vapor-deposited at a vapor-deposition rate of 1.5 Å/sec to form a film with a thickness of 40 nm on the hole transporting layer, to form a light emitting layer.

(Formation of Cathode)

The substrate carrying thereon the light emitting layer formed was placed in a vapor deposition machine, and the internal pressure thereof was reduced to 1×10$^{-4}$ Pa or lower, then, as a cathode, sodium fluoride was vapor-deposited with a thickness of about 0.5 nm on the light emitting layer, then, aluminum was vapor-deposited with a thickness of about 150 nm on the sodium fluoride layer. After vapor deposition, sealing with a glass substrate was performed, to fabricate a light emitting layer 9.

(Evaluation of Light Emitting Property of Light Emitting Device)

Voltage was applied to the light emitting device 9, to observe EL emission having the maximum peak wavelength of emission spectrum at 525 nm. The light emitting device 9 had a light emission start voltage of 3.7 V and a light emission efficiency at 1000 cd/m$^2$ of 3.5 cd/A.

Comparative Example 9: Direct-Current Voltage Driving of Light Emitting Device 9

The current value was set so that the initial luminance of the light emitting device 9 was 200 cd/m$^2$, then, the device was driven at constant current and the time change of luminance was measured. As a result, the time until luminance reached 60% of the initial luminance (hereinafter, referred to also as "LT60") was 458.2 hours.

Example 9: Pulse Voltage Driving of Light Emitting Device 9

The current value was set so that the initial luminance of the light emitting device 9 was 200 cd/m$^2$, then, the device was driven under the above-described pulse voltage driving condition 1 and the time change of luminance was measured. As a result, LT60 was 668.7 hours. LT95 in Example 9 was 1.46-fold with respect to LT60 in Comparative Example 9.

Device Fabrication Example 10: Fabrication of Light Emitting Device 10 and Evaluation of Light Emitting Property (Formation of Anode and Hole Injection Layer)

An ITO film was attached with a thickness of 45 nm to a glass substrate by a sputtering method, to form an anode. On the anode, a polythiophene-sulfonic acid type hole injection agent AQ-1200 (manufactured by Plectronics) was spin-coated, to form a film with a thickness of 65 nm, and the film was heated on a hot plate at 170° C. under an air atmosphere for 15 minutes, to form a hole injection layer.

(Formation of Hole Transporting Layer)

The substrate carrying thereon the hole transporting layer formed was placed in a vapor deposition machine, and the internal pressure thereof was reduced to 1×10$^{-5}$ Pa or lower, then, a hole transporting material represented by the above-described formula (HM-1) was vacuum-vapor-deposited at a vapor-deposition rate of 1.5 Å/sec to form a film with a thickness of 60 nm on the anode, to form a hole transporting layer.

(Formation of Light Emitting Layer)

The substrate carrying thereon the hole transporting layer formed was placed in a vapor deposition machine, and the internal pressure thereof was reduced to 1×10$^{-5}$ Pa or lower, then, a light emitting material represented by the above-described formula (EM-1) was vacuum-vapor-deposited at a vapor-deposition rate of 1.5 Å/sec to form a film with a thickness of 40 nm on the hole transporting layer, to form a light emitting layer.

(Formation of Cathode)

The substrate carrying thereon the light emitting layer formed was placed in a vapor deposition machine, and the internal pressure thereof was reduced to 1×10$^{-4}$ Pa or lower, then, as a cathode, sodium fluoride was vapor deposited with a thickness of about 0.5 nm on the light emitting layer, then, aluminum was vapor-deposited with a thickness of about 150 nm on the sodium fluoride layer. After vapor deposition, sealing with a glass substrate was performed, to fabricate a light emitting layer 10.

(Evaluation of Light Emitting Property of Light Emitting Device)

Voltage was applied to the light emitting device 10, to observe EL emission having the maximum peak wavelength of emission spectrum at 535 nm. The light emitting device 10 had a light emission start voltage of 4.3 V and a light emission efficiency at 1000 cd/m$^2$ of 3.7 cd/A.

Comparative Example 10-1: Direct-Current Voltage Driving of Light Emitting Device 10

The current value was set so that the initial luminance of the light emitting device 10 was 200 cd/m$^2$, then, the device was driven at constant current and the time change of luminance was measured. As a result, LT60 was 3888.8 hours.

Comparative Example 10-2: Pulse Voltage Driving of Light Emitting Device 10

The current value was set so that the initial luminance of the light emitting device 10 was 200 cd/m$^2$, then, the device was driven under the above-described pulse voltage driving condition 1 and the time change of luminance was measured. As a result, LT60 was 2271.6 hours. LT60 in Comparative Example 10-2 was 0.54-fold with respect to LT60 in Comparative Example 10-1.

Device Fabrication Example 11: Fabrication of Light Emitting Device 11 and Evaluation of Light Emitting Property A light emitting device 11 was fabricated in the same manner as in Device Fabrication Example 3 except that the hole transporting layer in Device Fabrication Example 3 was not formed.

Voltage was applied to the light emitting device 11, to observe EL emission having the maximum peak wavelength of emission spectrum at 520 nm. The light emitting device 11 had a light emission start voltage of 2.7 V and a light emission efficiency at 1000 cd/m$^2$ of 51.7 cd/A.

Comparative Example 11-1: Direct-Current Voltage Driving of Light Emitting Device 11

The current value was set so that the initial luminance of the light emitting device 11 was 3000 cd/m$^2$, then, the device was driven at constant current and the time change of luminance was measured. As a result, LT95 was 0.685 hours.

Comparative Example 11-2: Pulse Voltage Driving of Light Emitting Device 11

The current value was set so that the initial luminance of the light emitting device 11 was 3000 cd/m$^2$, then, the device was driven under the above-described pulse voltage driving condition 1 and the time change of luminance was measured. As a result, LT95 was 0.677 hours. LT95 in Comparative Example 11-2 was 0.99-fold with respect to LT95 in Comparative Example 11-1.

Device Fabrication Example 12: Fabrication of Light Emitting Device 12 and Evaluation of Light Emitting Property A light emitting device 12 was fabricated in the same manner as in Device Fabrication Example 6 except that the hole transporting layer in Device Fabrication Example 6 was not formed.

Voltage was applied to the light emitting device 12, to observe EL emission having the maximum peak wavelength of emission spectrum at 620 nm. The light emitting device 12 had a light emission start voltage of 2.5 V and a light emission efficiency at 1000 cd/m$^2$ of 5.0 cd/A.

Comparative Example 12-1: Direct-Current Voltage Driving of Light Emitting Device 12

The current value was set so that the initial luminance of the light emitting device 12 was 3000 cd/m$^2$, then, the device was driven at constant current and the time change of luminance was measured. As a result, LT95 was 0.0278 hours.

Comparative Example 12-2: Pulse Voltage Driving of Light Emitting Device 12

The current value was set so that the initial luminance of the light emitting device 12 was 3000 cd/m$^2$, then, the device was driven under the above-described pulse voltage driving condition 1 and the time change of luminance was measured. As a result, LT95 was 0.0297 hours. LT95 in Comparative Example 12-2 was 1.06-fold with respect to LT95 in Comparative Example 12-1.

Device Fabrication Example 13: Fabrication of Light Emitting Device 13 and Evaluation of Light Emitting Property A light emitting device 13 was fabricated in the same manner as in Device Fabrication Example 2 except that the polymer compound P6 was used instead of the polymer compound P1 in Device Fabrication Example 2, and a xylene solution (1.8 wt %) of the polymer compound P4 and the iridium complex M1 (polymer compound P4/iridium complex M1=60 wt %/40 wt %) was used instead of the xylene solution (1.8 wt %) of the polymer compound P4 and the iridium complex M1 (polymer compound P4/iridium complex M1=80 wt %/20 wt %).

Voltage was applied to the light emitting device 13, to observe EL emission having the maximum peak wavelength of emission spectrum at 520 nm. The light emitting device 13 had a light emission start voltage of 2.8 V and a light emission efficiency at 1000 cd/m$^2$ of 54.0 cd/A.

Comparative Example 13: Direct-Current Voltage Driving of Light Emitting Device 13

The current value was set so that the initial luminance of the light emitting device 13 was 3000 cd/m$^2$, then, the device was driven at constant current and the time change of luminance was measured. As a result, LT95 was 9.8 hours.

Example 13: Pulse Voltage Driving of Light Emitting Device 13

The current value was set so that the initial luminance of the light emitting device 13 was 3000 cd/m$^2$, then, the device was driven under the above-described pulse voltage driving condition 1 and the time change of luminance was measured. As a result, LT95 was 24.8 hours. LT95 in Example 13 was 2.53-fold with respect to LT95 in Comparative Example 13.

Device Fabrication Example 14: Fabrication of Light Emitting Device 14 and Evaluation of Light Emitting Property A light emitting device 14 was fabricated in the same manner as in Device Fabrication Example 13 except that a chlorobenzene solution (0.9 wt %) of a hole transporting material (manufactured by Luminescence Technology, LT-N157) represented by the following formula (HM-2) was used instead of the xylene solution (0.7 wt %) of the polymer compound P6 in Device Fabrication Example 13.

[chemical formula 94]

(HM-2)

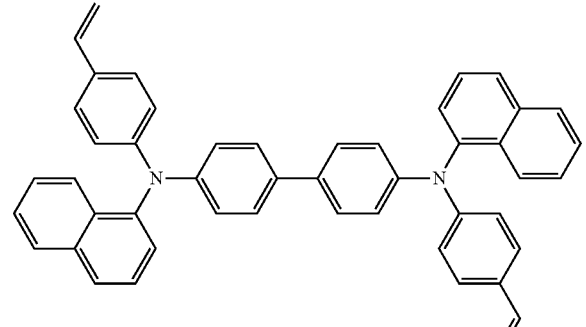

(Evaluation of Light Emitting Property of Light Emitting Device)

Voltage was applied to the light emitting device 14, to observe EL emission having the maximum peak wavelength of emission spectrum at 520 nm. The light emitting device 14 had a light emission start voltage of 3.1 V and a light emission efficiency at 1000 cd/m² of 45.9 cd/A.

Comparative Example 14: Direct-Current Voltage Driving of Light Emitting Device 14

The current value was set so that the initial luminance of the light emitting device 14 was 3000 cd/m², then, the device was driven at constant current and the time change of luminance was measured. As a result, LT95 was 0.40 hours.

Example 14: Pulse Voltage Driving of Light Emitting Device 14

The current value was set so that the initial luminance of the light emitting device 14 was 3000 cd/m², then, the device was driven under the above-described pulse voltage driving condition 1 and the time change of luminance was measured. As a result, LT95 was 0.70 hours. LT95 in Example 14 was 1.90-fold with respect to LT95 in Comparative Example 14.

INDUSTRIAL APPLICABILITY

According to the present invention, a driving method of a light emitting device which is excellent in luminance life can be provided. Further, according to the present invention, a light emitting apparatus equipped with a light emitting device and a driving apparatus for the driving method can be provided.

The invention claimed is:
1. A driving method of a light emitting device, the light emitting device comprising an anode, a cathode, a light emitting layer which comprises a metal complex represented by any one of formulas Ir-1 to Ir-5 disposed between the anode and the cathode, and a hole transporting layer disposed between the anode and the light emitting layer and comprising a cross-linked body of a crosslinkable material, the method comprising:
driving the light emitting device by pulse voltage in which a first voltage not lower than the light emission start voltage of the light emitting device and a second voltage lower than the light emission start voltage of the light emitting device are alternately switched,

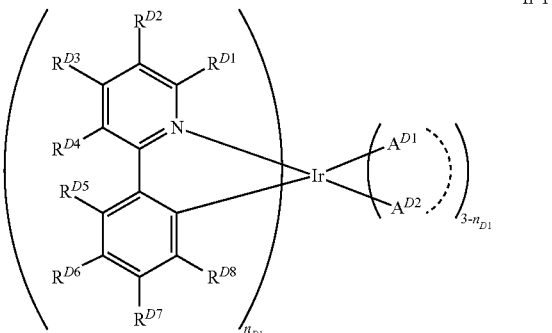

Ir-1

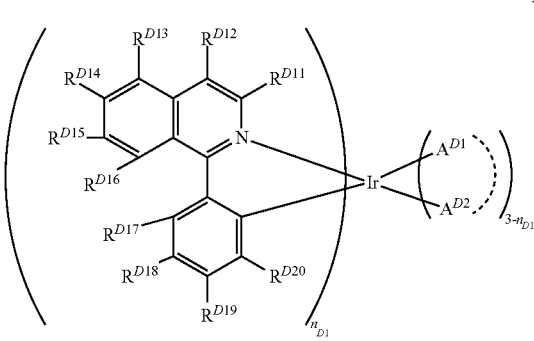

Ir-2

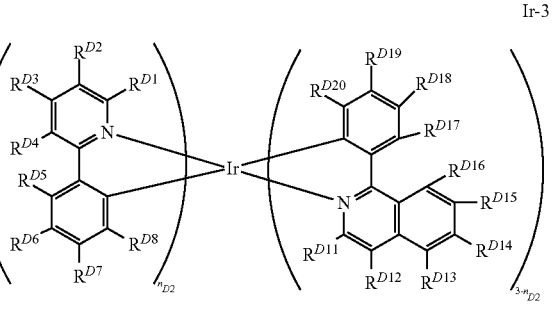

Ir-3

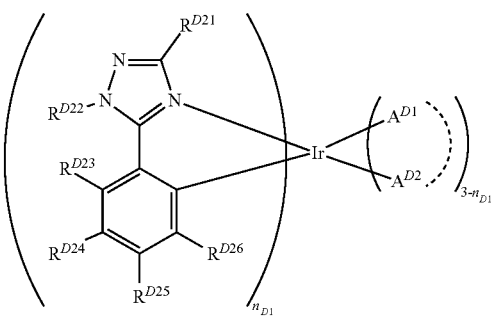

Ir-4

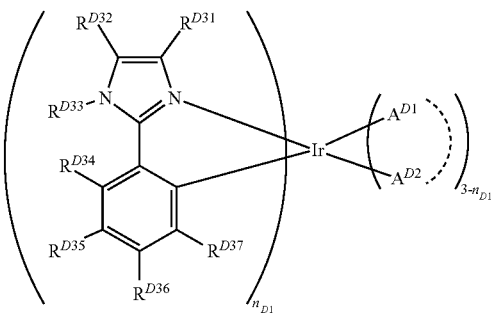

Ir-5 wherein $R^{D1}$ to $R^{D8}$, $R^{D11}$ to $R^{D20}$, $R^{D21}$ to $R^{D26}$ and $R^{D31}$ to $R^{D37}$ each independently represent a hydrogen atom, an alkyl group, a cycloalkyl group, an alkoxy group, a cycloalkoxy group, an aryl group, an aryloxy group, a monovalent heterocyclic group or a halogen atom, and these groups each optionally have a substituent, when a plurality of $R^{D1}$ to $R^{D8}$, $R^{D11}$ to $R^{D20}$, $R^{D21}$ to $R^{D26}$ and $R^{D31}$ to $R^{D37}$ are present, they may be the same or different at each occurrence, with the provision that in the metal complex represented by the formula Ir-1, at least one of $R^{D1}$ to $R^{D8}$ is a group represented by the formula (D-A), in the metal complex represented by the formula Ir-2, at least one of $R^{D11}$ to $R^{D20}$ is a group represented by the formula (D-A), in the metal complex represented by the formula Ir-3, at least one of $R^{D1}$ to $R^{D8}$ and $R^{D11}$ to $R^{D20}$ is a group represented by the formula (D-A), in the metal complex represented by the formula Ir-4, at least one of $R^{D21}$ to $R^{D26}$ is a group represented by the formula (D-A), and in the metal complex represented by the formula Ir-5, at least one of $R^{D31}$ to $R^{D37}$ is a group represented by the formula (D-A):

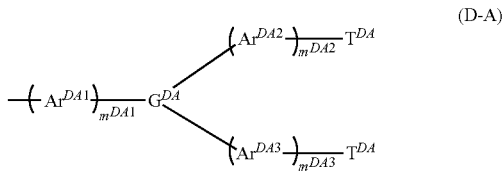

(D-A)

wherein $m^{DA1}$, $m^{DA2}$ and $m^{DA3}$ each independently represent an integer of 0 or more;
$G^{DA}$ represents a nitrogen atom, an aromatic hydrocarbon group or a heterocyclic group, and these groups each optionally have a substituent;
$Ar^{DA1}$, $Ar^{DA2}$ and $Ar^{DA3}$ each independently represent an arylene group or a divalent heterocyclic group, and these groups each optionally have a substituent, when a plurality of $Ar^{DA1}$, $Ar^{DA2}$ and $Ar^{DA3}$ are present, they may be the same or different at each occurrence;
$T^{DA}$ represents an aryl group or a monovalent heterocyclic group, and these groups each optionally have a substituent, and the plurality of $T^{DA}$ may be the same or different;
$-A^{D1}-A^{D2}-$ represents an anionic bidentate ligand, and $A^{D1}$ and $A^{D2}$ each independently represent a carbon atom, an oxygen atom or a nitrogen atom linking to an iridium atom, and these atoms each may be an atom consisting a ring, when a plurality of $-A^{D1}-A^{D2}-$ are present, they may be the same or different;
$n_{D1}$ represents 1, 2 or 3, and $n_{D2}$ represents 1 or 2.

2. The driving method of a light emitting device according to claim 1, wherein the crosslinkable material is a polymer compound comprising a constitutional unit represented by the formula (X) and a constitutional unit having a crosslinkable group:

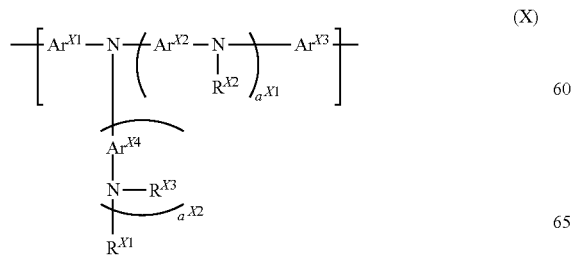

(X)

wherein
$a^{X1}$ and $a^{X2}$ each independently represent an integer of 0 or more,
$Ar^{X1}$ and $Ar^{X3}$ each independently represent an arylene group or a divalent heterocyclic group and these groups each optionally have a substituent,
$Ar^{X2}$ and $Ar^{X4}$ each independently represent an arylene group, a divalent heterocyclic group or a divalent group in which at least one arylene group and at least one divalent heterocyclic group are bonded directly to each other, and these groups each optionally have a substituent, and when a plurality of $Ar^{X2}$ and $Ar^{X4}$ are present, they may be the same or different at each occurrence, and
$R^{X1}$, $R^{X2}$ and $R^{X3}$ each independently represent a hydrogen atom, an alkyl group, a cycloalkyl group, an aryl group or a monovalent heterocyclic group and these groups each optionally have a substituent, and when a plurality of $R^{X2}$ and $R^{X3}$ are present, they may be the same or different at each occurrence.

3. The driving method of a light emitting device according to claim 2, wherein the constitutional unit having a crosslinkable group is a constitutional unit having at least one crosslinkable group selected from Group A of crosslinkable group:

(XL-1)

(XL-2)

(XL-3)

(XL-4)

(XL-5)

(XL-6)

(XL-7)

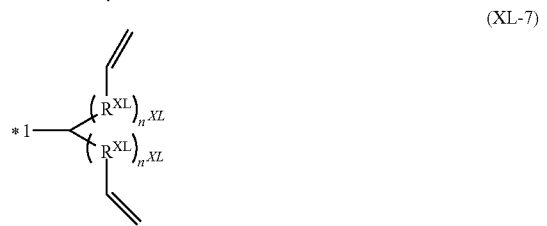

(XL-8) 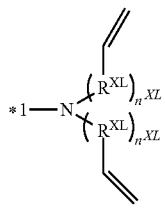

(XL-9) 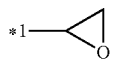

(XL-10) 

(XL-11) 

(XL-12) 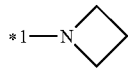

(XL-13) 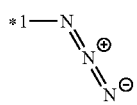

(XL-14) 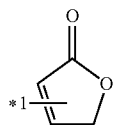

(XL-15) 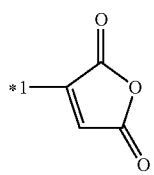

(XL-16) 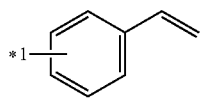

(XL-17) 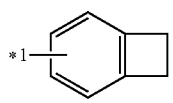

wherein $R^{XL}$ represents a methylene group, an oxygen atom or a sulfur atom, $n^{XL}$ represents an integer of 0 to 5, and when a plurality of $R^{XL}$ are present, they may be the same or different, and when a plurality of $n^{XL}$ are present, they may be the same or different, and *1 represents a binding position, and these crosslinkable groups each optionally have a substituent.

4. The driving method of a light emitting device according to claim 3, wherein the constitutional unit having a crosslinkable group is a constitutional unit represented by the formula (2) or a constitutional unit represented by (3):

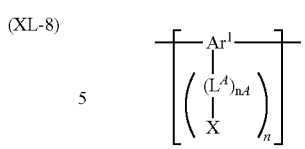
(2)

wherein
nA represents an integer of 0 to 5, n represents 1 or 2,
$Ar^1$ represents an aromatic hydrocarbon group or a heterocyclic group and these groups each optionally have a substituent,
$L^A$ represents an alkylene group, a cycloalkylene group, an arylene group, a divalent heterocyclic group, a group represented by —NR'—, an oxygen atom or a sulfur atom and these groups each optionally have a substituent, and R' represents a hydrogen atom, an alkyl group, a cycloalkyl group, an aryl group or a monovalent heterocyclic group and these groups each optionally have a substituent, and when a plurality of $L^A$ are present, they may be the same or different, and
X represents a crosslinkable group selected from Group A of crosslinkable group, and when a plurality of X are present, they may be the same or different:

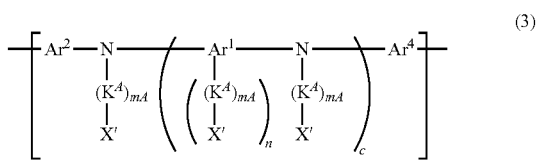
(3)

wherein
mA represents an integer of 0 to 5, m represents an integer of 1 to 4, c represents an integer of 0 or 1, and when a plurality of mA are present, they may be the same or different,
$A^{r3}$ represents an aromatic hydrocarbon group, a heterocyclic group or a group in which at least one aromatic hydrocarbon ring and at least one heterocyclic ring are bonded directly to each other, and these groups each optionally have a substituent,
$Ar^2$ and $Ar^4$ each independently represent an arylene group or a divalent heterocyclic group and these groups each optionally have a substituent,
each of $Ar^2$, $Ar^3$ and $Ar^4$ may be bonded directly or via an oxygen atom or a sulfur atom to a group which is different from that group and which is attached to the nitrogen atom to which that group is attached, thereby forming a ring,
$K^A$ represents an alkylene group, a cycloalkylene group, an arylene group, a divalent heterocyclic group, a group represented by —NR'—, an oxygen atom or a sulfur atom and these groups each optionally have a substituent, and R' represents a hydrogen atom, an alkyl group, a cycloalkyl group, an aryl group or a monovalent heterocyclic group and these groups each optionally have a substituent, and when a plurality of $K^A$ are present, they may be the same or different, and
X' represents a crosslinkable group selected from Group A of crosslinkable group, a hydrogen atom, an alkyl group, a cycloalkyl group, an aryl group or a monovalent heterocyclic group and these groups each optionally have a substituent, and at least one X' is a crosslinkable group selected from Group A of crosslinkable group.

5. The driving method of a light emitting device according to claim 2, wherein the polymer compound comprising the constitutional unit represented by the formula (X) and the constitutional unit having a crosslinkable group further comprises a constitutional unit represented by the formula (Y):

wherein $Ar^{Y1}$ represents an arylene group, a divalent heterocyclic group or a divalent group in which at least one arylene group and at least one divalent heterocyclic group are bonded directly to each other, and these groups each optionally have a substituent.

6. The driving method of a light emitting device according to claim 1, wherein the crosslinkable material is a polymer compound comprising a constitutional unit represented by the formula (3):

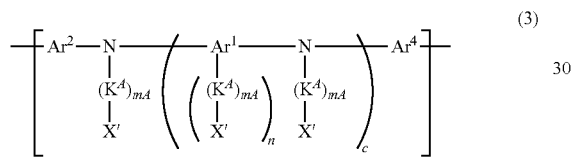

wherein
mA represents an integer of 0 to 5, m represents an integer of 1 to 4, c represents an integer of 0 or 1, and when a plurality of mA are present, they may be the same or different, $Ar^3$ represents an aromatic hydrocarbon group, a heterocyclic group or a group in which at least one aromatic hydrocarbon ring and at least one heterocyclic ring are bonded directly to each other, and these groups each optionally have a substituent, $Ar^2$ and $Ar^4$ each independently represent an arylene group or a divalent heterocyclic group and these groups each optionally have a substituent, each of $Ar^2$, $Ar^3$ and $Ar^4$ may be bonded directly or via an oxygen atom or a sulfur atom to a group which is different from that group and which is attached to the nitrogen atom to which that group is attached, thereby forming a ring, $K^A$ represents an alkylene group, a cycloalkylene group, an arylene group, a divalent heterocyclic group, a group represented by —NR'—, an oxygen atom or a sulfur atom and these groups each optionally have a substituent, and R' represents a hydrogen atom, an alkyl group, a cycloalkyl group, an aryl group or a monovalent heterocyclic group and these groups each optionally have a substituent, and when a plurality of $K^A$ are present, they may be the same or different, and X' represents a crosslinkable group selected from Group A of crosslinkable group, a hydrogen atom, an alkyl group, a cycloalkyl group, an aryl group or a monovalent heterocyclic group and these groups each optionally have a substituent, and at least one X' is a crosslinkable group selected from Group A of crosslinkable group:

(Group A of crosslinkable group)

-continued

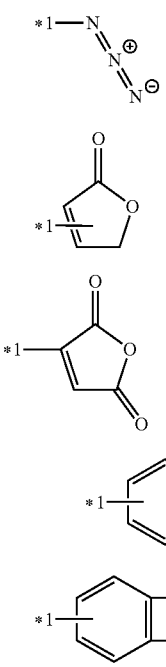

(XL-13)

(XL-14)

(XL-15)

(XL-16)

(XL-17)

wherein $R^{XL}$ represents a methylene group, an oxygen atom or a sulfur atom, $n^{XL}$ represents an integer of 0 to 5, and when a plurality of $R^{XL}$ are present, they may be the same or different, and when a plurality of $n^{XL}$ are present, they may be the same or different, and *1 represents a binding position, and these crosslinkable groups each optionally have a substituent.

7. The driving method of a light emitting device according to claim 6, wherein the polymer compound comprising the constitutional unit represented by the formula (3) further comprises a constitutional unit represented by the formula (Y):

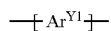

(Y)

wherein $Ar^{Y1}$ represents an arylene group, a divalent heterocyclic group or a divalent group in which at least one arylene group and at least one divalent heterocyclic group are bonded directly to each other, and these groups each optionally have a substituent.

8. The production method of a light emitting device according to claim 1, wherein the crosslinkable material is a low molecular weight compound represented by the formula (Z):

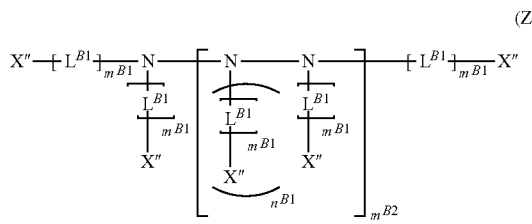

(Z)

wherein $m^{B1}$ and $m^{B2}$ each independently represent an integer of 0 or more, and the plurality of $m^{B1}$ may be the same or different, $n^{B1}$ represents an integer of 0 or more, and when a plurality of $n^{B1}$ are present, they may be the same or different, $Ar^5$ represents an aromatic hydrocarbon group, a heterocyclic group or a group in which at least one aromatic hydrocarbon ring and at least one heterocyclic ring are bonded directly to each other, and these groups each optionally have a substituent, and when a plurality of $Ar^5$ are present, they may be the same or different, $L^{B1}$ represents an alkylene group, a cycloalkylene group, an arylene group, a divalent heterocyclic group, a group represented by —NR'—, an oxygen atom or a sulfur atom and these groups each optionally have a substituent, and R' represents a hydrogen atom, an alkyl group, a cycloalkyl group, an aryl group or a monovalent heterocyclic group and these groups each optionally have a substituent, and when a plurality of $L^{B1}$ are present, they may be the same or different, and X" represents a crosslinkable group selected from Group A of crosslinkable group, a hydrogen atom, an alkyl group, a cycloalkyl group, an aryl group or a monovalent heterocyclic group and these groups each optionally have a substituent, and the plurality of X" may be the same or different, and at least one of the plurality of X" is a crosslinkable group selected from Group A of crosslinkable group:

(Group A of crosslinkable group)

(XL-1)

(XL-2)

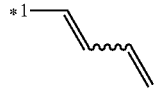

(XL-3)

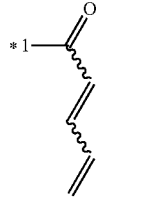

(XL-4)

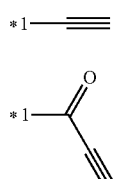

(XL-5)

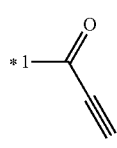

(XL-6)

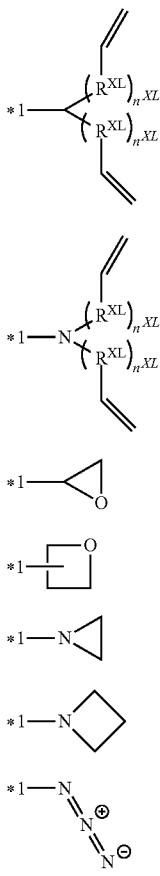

(XL-7)
(XL-8)
(XL-9)
(XL-10)
(XL-11)
(XL-12)
(XL-13)
(XL-14)
(XL-15)

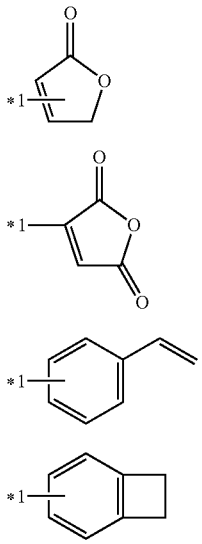

(XL-16)
(XL-17)

wherein $R^{XL}$ represents a methylene group, an oxygen atom or a sulfur atom, represents an integer of 0 to 5, and when a plurality of $R^{XL}$ are present, they may be the same or different, and when a plurality of $n^{XL}$ are present, they may be the same or different, and *1 represents a binding position, and these crosslinkable groups each optionally have a substituent.

9. The driving method of a light emitting device according to claim 1, wherein the first voltage is forward bias voltage, the second voltage is reverse bias voltage, and polarity of the first voltage and polarity of the second voltage are different from each other.

10. The driving method of a light emitting device according to claim 9, wherein the second voltage is −15 V or more and less than 0 V.

11. The driving method of a light emitting device according to claim 1, wherein the pulse voltage has a frequency of 0.1 Hz to 100 Hz.

12. The driving method of a light emitting device according to claim 1, wherein the pulse width: T1 of the first voltage and the pulse width: T2 of the second voltage satisfy the formula (1-1):

$$0.05 \leq T1/(T1+T2) \leq 0.95 \qquad (1\text{-}1).$$

13. The driving method of a light emitting device according to claim 1, wherein the light emitting layer comprises the metal complex represented by the formula (Ir-1) and $n_{D1}$ is 3.

14. The driving method of a light emitting device according to claim 1, wherein luminance life is improved by alternately switching the first and second voltages.

15. A light emitting apparatus equipped with
a light emitting device comprising an anode, a cathode, a light emitting layer which comprises a metal complex represented by any one of formulas Ir-1 to Ir-5 disposed between the anode and the cathode and a hole transporting layer disposed between the anode and the light emitting layer and comprising a cross-linked body of a crosslinkable material, and
a driving apparatus which drives the light emitting device by pulse voltage in which a first voltage not lower than the light emission start voltage of the light emitting device and a second voltage lower than the light emission start voltage of the light emitting device are alternately switched,

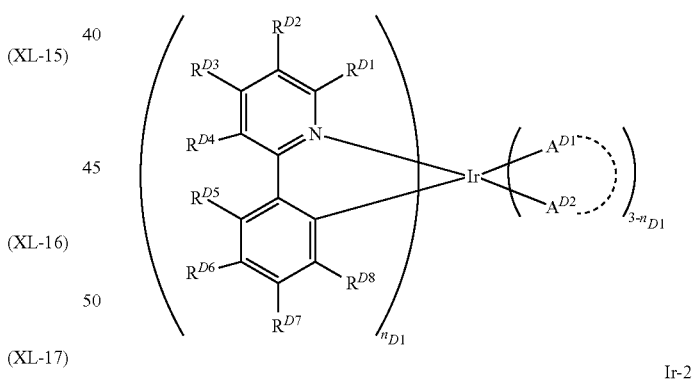

Ir-1

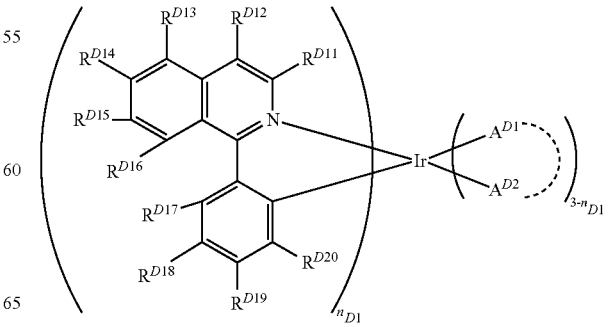

Ir-2

-continued

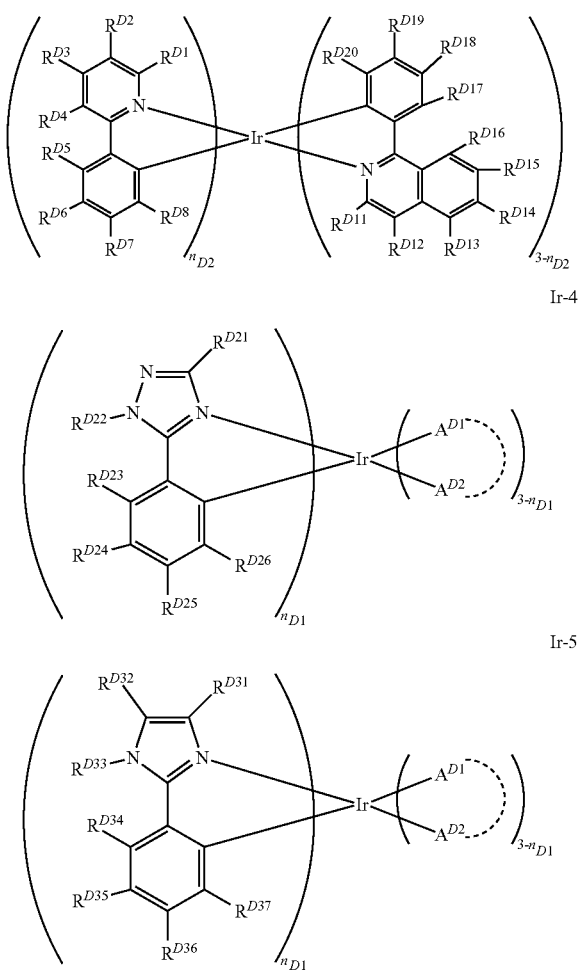

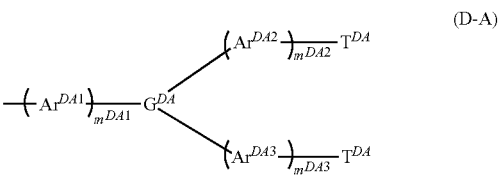

wherein $R^{D1}$ to $R^{D8}$, $R^{D11}$ to $R^{D20}$, $R^{D21}$ to $R^{D26}$ and $R^{D31}$ to $R^{D37}$ each independently represent a hydrogen atom, an alkyl group, a cycloalkyl group, an alkoxy group, a cycloalkoxy group, an aryl group, an aryloxy group, a monovalent heterocyclic group or a halogen atom, and these groups each optionally have a substituent, when a plurality of $R^{D1}$ to $R^{D8}$, $R^{D11}$ to $R^{D20}$, $R^{D21}$ to $R^{D26}$ and $R^{D31}$ to $R^{D37}$ are present, they may be the same or different at each occurrence, with the provision that in the metal complex represented by the formula Ir-1, at least one of $R^{D1}$ to $R^{D8}$ is a group represented by the formula (D-A), in the metal complex represented by the formula Ir-2, at least one of $R^{D11}$ to $R^{D20}$ is a group represented by the formula (D-A), in the metal complex represented by the formula Ir-3, at least one of $R^{D1}$ to $R^{D8}$ and $R^{D11}$ to $R^{D20}$ is a group represented by the formula (D-A), in the metal complex represented by the formula Ir-4, at least one of $R^{D21}$ to $R^{D26}$ is a group represented by the formula (D-A), and in the metal complex represented by the formula Ir-5, at least one of $R^{D31}$ to $R^{D37}$ is a group represented by the formula (D-A):

$$\left(\text{Ar}^{DA1}\right)_{m^{DA1}} G^{DA} \begin{matrix} \left(\text{Ar}^{DA2}\right)_{m^{DA2}} T^{DA} \\ \\ \left(\text{Ar}^{DA3}\right)_{m^{DA3}} T^{DA} \end{matrix} \quad \text{(D-A)}$$

wherein $m^{DA1}$, $m^{DA2}$ and $m^{DA3}$ each independently represent an integer of 0 or more;

$G^{DA}$ represents a nitrogen atom, an aromatic hydrocarbon group or a heterocyclic group, and these groups each optionally have a substituent, $Ar^{DA1}$, $Ar^{DA2}$ and $Ar^{DA3}$ each independently represent an arylene group or a divalent heterocyclic group, and these groups each optionally have a substituent, when a plurality of $Ar^{DA1}$, $Ar^{DA2}$ and $Ar^{DA3}$ are present, they may be the same or different at each occurrence;

$T^{DA}$ represents an aryl group or a monovalent heterocyclic group, and these groups each optionally have a substituent, and the plurality of $T^{DA}$ may be the same or different;

$-A^{D1}-A^{D2}-$ represents an anionic bidentate ligand, and $A^{D1}$ and $A^{D2}$ each independently represent a carbon atom, an oxygen atom or a nitrogen atom linking to an iridium atom, and these atoms each may be an atom consisting a ring, when a plurality of $-A^{D1}-A^{D2}-$ are present, they may be the same or different;

$n^{D1}$ represents 1, 2 or 3, and $n^{D2}$ represents 1 or 2.

\* \* \* \* \*